United States Patent
Ishibashi et al.

(10) Patent No.: US 11,094,537 B2
(45) Date of Patent: Aug. 17, 2021

(54) GROUP III NITRIDE COMPOSITE SUBSTRATE AND METHOD FOR MANUFACTURING THE SAME, AND METHOD FOR MANUFACTURING GROUP III NITRIDE SEMICONDUCTOR DEVICE

(71) Applicant: SUMITOMO ELECTRIC INDUSTRIES, LTD., Osaka (JP)

(72) Inventors: Keiji Ishibashi, Itami (JP); Akihiro Hachigo, Itami (JP); Yuki Hiromura, Itami (JP); Naoki Matsumoto, Itami (JP); Seiji Nakahata, Itami (JP); Fumitake Nakanishi, Itami (JP); Takuya Yanagisawa, Itami (JP); Koji Uematsu, Itami (JP); Yuki Seki, Itami (JP); Yoshiyuki Yamamoto, Itami (JP); Yusuke Yoshizumi, Itami (JP); Hidenori Mikami, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 4 days.

(21) Appl. No.: 16/787,700

(22) Filed: Feb. 11, 2020

(65) Prior Publication Data
US 2020/0176305 A1 Jun. 4, 2020

Related U.S. Application Data

(63) Continuation of application No. 15/879,018, filed on Jan. 24, 2018, now Pat. No. 10,600,676, which is a
(Continued)

(30) Foreign Application Priority Data

Oct. 12, 2012 (JP) .................................. 2012-226777
Nov. 30, 2012 (JP) .................................. 2012-263090
(Continued)

(51) Int. Cl.
*H01L 21/02* (2006.01)
*H01L 21/306* (2006.01)
(Continued)

(52) U.S. Cl.
CPC .......... *H01L 21/02513* (2013.01); *B32B 7/04* (2013.01); *H01L 21/0237* (2013.01);
(Continued)

(58) Field of Classification Search
None
See application file for complete search history.

(56) References Cited

U.S. PATENT DOCUMENTS 5,122,845 A * 6/1992 Manabe ................. C30B 25/02
                                                   252/62.3 GA
5,290,393 A * 3/1994 Nakamura ......... H01L 21/02579
                                                   438/509
(Continued)

FOREIGN PATENT DOCUMENTS

CN      1960014 A    5/2007
CN    102157638 A    8/2011
(Continued)

OTHER PUBLICATIONS

Ross et al, Single Crystal Wurtzite GaN on (111) GaAs with AlN Buffer Layers Grown by Reactive Magnetron Sputter Deposition, 1991, Journal of Materials Research, vol. 8, Issue 10 (Year: 1991).*
(Continued)

*Primary Examiner* — Jeffrey A Vonch
(74) *Attorney, Agent, or Firm* — Faegre Drinker Biddle & Reath LLP

(57) ABSTRACT

Provided are a group III nitride composite substrate having a low sheet resistance and produced with a high yield, and a method for manufacturing the same, as well as a method for manufacturing a group III nitride semiconductor device
(Continued)

US 11,094,537 B2

Page 2 using the group III nitride composite substrate. A group III nitride composite substrate includes a group III nitride film and a support substrate formed from a material different in chemical composition from the group III nitride film. The group III nitride film is joined to the support substrate in one of a direct manner and an indirect manner. The group III nitride film has a thickness of 10 μm or more. A sheet resistance of a group III-nitride-film-side main surface is 200 Ω/sq or less.

15 Claims, 11 Drawing Sheets

Related U.S. Application Data continuation of application No. 14/419,315, filed as application No. PCT/JP2013/073805 on Sep. 4, 2013, now Pat. No. 9,917,004.

(60) Provisional application No. 61/712,967, filed on Oct. 12, 2012, provisional application No. 61/762,407, filed on Feb. 8, 2013.

(30) Foreign Application Priority Data

| Feb. 18, 2013 | (JP) | ................................ 2013-029114 |
| Feb. 18, 2013 | (JP) | ................................ 2013-029115 |
| Feb. 18, 2013 | (JP) | ................................ 2013-029125 |
| Aug. 30, 2013 | (JP) | ................................ 2013-179839 |

(51) Int. Cl.
| H01L 21/683 | (2006.01) |
| H01L 21/762 | (2006.01) |
| B32B 7/04 | (2019.01) |
| H01L 29/20 | (2006.01) |
| B32B 7/06 | (2019.01) |
| B32B 7/02 | (2019.01) |
| H01L 33/02 | (2010.01) |
| H01L 33/00 | (2010.01) |
| H01L 33/12 | (2010.01) |

(52) U.S. Cl.
CPC ...... *H01L 21/0242* (2013.01); *H01L 21/0243* (2013.01); *H01L 21/0259* (2013.01); *H01L 21/02389* (2013.01); *H01L 21/02422* (2013.01); *H01L 21/02436* (2013.01); *H01L 21/76251* (2013.01); *B32B 7/02* (2013.01); *B32B 7/06* (2013.01); *B32B 2307/20* (2013.01); *H01L 21/02024* (2013.01); *H01L 21/0254* (2013.01); *H01L 21/02367* (2013.01); *H01L 21/02458* (2013.01); *H01L 21/02658* (2013.01); *H01L 21/30625* (2013.01); *H01L 21/6835* (2013.01); *H01L 21/76254* (2013.01); *H01L 29/2003* (2013.01); *H01L 33/007* (2013.01); *H01L 33/0093* (2020.05); *H01L 33/025* (2013.01); *H01L 33/12* (2013.01); *H01L 2221/68345* (2013.01); *H01L 2221/68381* (2013.01); *H01L 2924/0002* (2013.01); *H01L 2924/3511* (2013.01); *Y10T 428/2495* (2015.01); *Y10T 428/24298* (2015.01); *Y10T 428/24322* (2015.01); *Y10T 428/24331* (2015.01); *Y10T 428/24975* (2015.01); *Y10T 428/26* (2015.01); *Y10T 428/265* (2015.01); *Y10T 428/31* (2015.01)

(56) References Cited

U.S. PATENT DOCUMENTS

| 5,406,123 | A  | * | 4/1995  | Narayan ............ H01L 21/28575 257/190 |
| 5,741,724 | A  |   | 4/1998  | Ramdani et al. |
| 6,091,083 | A  | * | 7/2000  | Hata .................... H01L 33/007 257/190 |
| 6,194,742 | B1 | * | 2/2001  | Kern ...................... H01L 33/12 257/102 |
| 6,252,255 | B1 | * | 6/2001  | Ueta .................... H01L 21/0242 257/94 |
| 6,391,748 | B1 | * | 5/2002  | Temkin .................. C30B 23/02 257/E21.127 |
| 6,413,627 | B1 |   | 7/2002  | Motoki et al. |
| 6,488,767 | B1 |   | 12/2002 | Xu et al. |
| 6,521,514 | B1 | * | 2/2003  | Gehrke .............. H01L 21/0242 257/E21.113 |
| 6,617,060 | B2 |   | 9/2003  | Weeks, Jr. et al. |
| 6,673,149 | B1 | * | 1/2004  | Solomon ................. C30B 23/02 117/101 |
| 6,713,789 | B1 | * | 3/2004  | Shibata ............ H01L 21/02573 257/103 |
| 6,765,240 | B2 |   | 7/2004  | Tischler et al. |
| 6,989,202 | B2 |   | 1/2006  | Asai et al. |
| 7,803,717 | B2 |   | 9/2010  | Rawdanowicz et al. |
| 9,136,337 | B2 | * | 9/2015  | Ishibashi .......... H01L 21/76254 |
| 9,224,921 | B2 | * | 12/2015 | Bethoux .................. H01L 33/32 |
| 9,312,165 | B2 |   | 4/2016  | Hachigo et al. |
| 9,923,063 | B2 |   | 3/2018  | Ishibashi et al. |
| 2001/0003019 | A1 | * | 6/2001 | Morita ................ H01L 21/0237 428/195.1 |
| 2002/0005566 | A1 | * | 1/2002 | Weber ..................... C30B 23/02 257/618 |
| 2002/0093055 | A1 |   | 7/2002 | Shibata et al. |
| 2002/0096106 | A1 |   | 7/2002 | Kub et al. |
| 2002/0170488 | A1 | * | 11/2002 | Yuri .................... H01L 21/0242 117/86 |
| 2002/0197831 | A1 |   | 12/2002 | Todd et al. |
| 2003/0045103 | A1 |   | 3/2003 | Suzuki et al. |
| 2003/0089906 | A1 | * | 5/2003 | Ueda .................. H01S 5/34333 257/55 |
| 2003/0136333 | A1 | * | 7/2003 | Semond ................ C30B 29/403 117/95 |
| 2003/0205711 | A1 | * | 11/2003 | Tanizawa ................. H01L 33/32 257/79 |
| 2003/0209185 | A1 |   | 11/2003 | Ueno et al. |
| 2004/0056211 | A1 |   | 3/2004 | Popiolkowski et al. |
| 2004/0072410 | A1 |   | 4/2004 | Motoki et al. |
| 2004/0178448 | A1 | * | 9/2004 | Rayssac ............ H01L 21/76251 257/347 |
| 2004/0221799 | A1 | * | 11/2004 | Nakayama ........ H01L 21/02008 117/94 |
| 2004/0232440 | A1 |   | 11/2004 | Ohtsuka et al. |
| 2005/0023544 | A1 |   | 2/2005 | Shibata |
| 2005/0030995 | A1 |   | 2/2005 | Kawakami et al. |
| 2005/0059229 | A1 |   | 3/2005 | Minemoto et al. |
| 2005/0093003 | A1 |   | 5/2005 | Shibata |
| 2005/0103257 | A1 |   | 5/2005 | Xu et al. |
| 2005/0104162 | A1 |   | 5/2005 | Xu et al. |
| 2005/0124161 | A1 |   | 6/2005 | Rawdanowicz et al. |
| 2005/0173715 | A1 |   | 8/2005 | Kyono et al. |
| 2006/0043396 | A1 |   | 3/2006 | Tsuda et al. |
| 2006/0046331 | A1 |   | 3/2006 | Kiyama et al. |
| 2006/0060888 | A1 |   | 3/2006 | Kim et al. |
| 2006/0145186 | A1 | * | 7/2006 | Wallis .................... C30B 29/403 257/190 |
| 2006/0169996 | A1 |   | 8/2006 | D'Evelyn et al. |
| 2006/0175681 | A1 | * | 8/2006 | Li ...................... H01L 21/0254 257/613 |
| 2006/0189017 | A1 |   | 8/2006 | Nogami |
| 2006/0189020 | A1 | * | 8/2006 | Kim ..................... H01L 21/0262 438/47 |
| 2006/0223330 | A1 | * | 10/2006 | Fudeta ................. H01L 21/2007 438/752 |
| 2006/0225645 | A1 |   | 10/2006 | Powell et al. |

(56) References Cited

U.S. PATENT DOCUMENTS

| | | |
|---|---|---|
| 2006/0228819 A1 | 10/2006 | Oshima |
| 2006/0240644 A1* | 10/2006 | Le Vaillant ........ H01L 21/76254 438/455 |
| 2006/0249748 A1 | 11/2006 | Piner et al. |
| 2006/0257626 A1 | 11/2006 | Schlesser et al. |
| 2006/0267043 A1 | 11/2006 | Emerson et al. |
| 2006/0278891 A1 | 12/2006 | Saxler et al. |
| 2006/0286777 A1* | 12/2006 | Lee ................... H01L 21/02472 438/478 |
| 2007/0045662 A1* | 3/2007 | Sumiya .............. H01L 21/0237 257/189 |
| 2007/0051961 A1* | 3/2007 | Kamikawa ............ B82Y 20/00 257/94 |
| 2007/0051969 A1 | 3/2007 | Oshima et al. |
| 2007/0072324 A1* | 3/2007 | Krames .................. C30B 29/40 438/46 |
| 2007/0096147 A1 | 5/2007 | Oshima |
| 2007/0138505 A1 | 6/2007 | Preble et al. |
| 2007/0141823 A1 | 6/2007 | Preble et al. |
| 2007/0158785 A1 | 7/2007 | D'Evelyn et al. |
| 2007/0164306 A1 | 7/2007 | Nakahata et al. |
| 2007/0210329 A1 | 9/2007 | Goto |
| 2007/0215901 A1 | 9/2007 | Shibata |
| 2007/0281484 A1 | 12/2007 | Ishibashi et al. |
| 2008/0023800 A1 | 1/2008 | Holzig et al. |
| 2008/0029783 A1 | 2/2008 | Ueno |
| 2008/0118733 A1 | 5/2008 | Oshima |
| 2008/0169483 A1 | 7/2008 | Kasai et al. |
| 2008/0230780 A1* | 9/2008 | Urashima ............ H01L 33/007 257/51 |
| 2008/0261341 A1* | 10/2008 | Zimmerman ....... H01L 33/0095 438/33 |
| 2008/0296584 A1 | 12/2008 | Hachigo |
| 2008/0311725 A1* | 12/2008 | Di Cioccio ............. H01L 21/78 438/455 |
| 2008/0315209 A1 | 12/2008 | Miura et al. |
| 2009/0001519 A1 | 1/2009 | Haskell et al. |
| 2009/0026488 A1 | 1/2009 | Kiyomi et al. |
| 2009/0048659 A1 | 2/2009 | Weber et al. |
| 2009/0057700 A1* | 3/2009 | Jin ......................... H01L 33/20 257/98 |
| 2009/0127662 A1 | 5/2009 | Okahisa et al. |
| 2009/0155987 A1* | 6/2009 | Lee ..................... H01L 21/0242 438/478 |
| 2009/0278233 A1* | 11/2009 | Pinnington ....... H01L 21/02389 257/615 |
| 2009/0289270 A1* | 11/2009 | Hanawa ................ C30B 25/183 257/98 |
| 2009/0302336 A1* | 12/2009 | Yuan ................... H01L 33/0093 257/98 |
| 2009/0315150 A1 | 12/2009 | Hirota et al. |
| 2010/0001376 A1 | 1/2010 | Takamizawa et al. |
| 2010/0025228 A1* | 2/2010 | Tauzin .............. H01L 21/76254 204/192.11 |
| 2010/0051961 A1 | 3/2010 | Kuraoka et al. |
| 2010/0164070 A1 | 7/2010 | Okahisa et al. |
| 2010/0210089 A1 | 8/2010 | Kasai et al. |
| 2010/0227532 A1 | 9/2010 | Ishibashi et al. |
| 2010/0244196 A1 | 9/2010 | Yoshida |
| 2010/0251865 A1 | 10/2010 | Ueno |
| 2010/0258911 A1 | 10/2010 | Nakayama |
| 2010/0295055 A1 | 11/2010 | Yamamoto |
| 2010/0320506 A1 | 12/2010 | Varangis et al. |
| 2010/0323497 A1 | 12/2010 | Fournel |
| 2010/0327228 A1* | 12/2010 | Bando ............... H01L 31/03048 252/301.4 R |
| 2011/0018003 A1 | 1/2011 | Okahisa et al. |
| 2011/0057213 A1* | 3/2011 | Romano ................. H01L 33/16 257/94 |
| 2011/0101502 A1 | 5/2011 | Wang |
| 2011/0108886 A1 | 5/2011 | Marchand et al. |
| 2011/0121311 A1 | 5/2011 | Sato et al. |
| 2011/0127581 A1 | 6/2011 | Bethoux et al. |
| 2011/0133242 A1 | 6/2011 | Choi et al. |
| 2011/0136281 A1 | 6/2011 | Sheen |
| 2011/0163349 A1 | 7/2011 | Sakai et al. |
| 2011/0177638 A1 | 7/2011 | Romano et al. |
| 2011/0177642 A1 | 7/2011 | Kusunoki |
| 2011/0253974 A1 | 10/2011 | Horie et al. |
| 2011/0260177 A1 | 10/2011 | Sakurai |
| 2011/0263058 A1* | 10/2011 | Yamae .................. H01S 5/0201 438/33 |
| 2011/0272734 A1 | 11/2011 | Hachigo et al. |
| 2011/0298009 A1 | 12/2011 | Ikuta et al. |
| 2012/0000415 A1* | 1/2012 | D'Evelyn ............. C30B 29/403 117/94 |
| 2012/0018855 A1 | 1/2012 | Colnat |
| 2012/0056244 A1* | 3/2012 | Bahl .................. H01L 21/02381 257/190 |
| 2012/0070929 A1 | 3/2012 | Hashimoto et al. |
| 2012/0074385 A1* | 3/2012 | Tak ................... H01L 21/02664 257/15 |
| 2012/0083063 A1* | 4/2012 | Shinoda .............. H01L 21/0242 438/47 |
| 2012/0118222 A1* | 5/2012 | Fujiwara ............... C30B 29/406 117/58 |
| 2012/0122301 A1 | 5/2012 | Fujiwara et al. |
| 2012/0138956 A1* | 6/2012 | Shimizu ............... H01L 29/7787 257/77 |
| 2012/0138985 A1* | 6/2012 | Ono .................... H01L 21/0254 257/98 |
| 2012/0156858 A1* | 6/2012 | Sekiya ................. B23K 26/364 438/458 |
| 2012/0174855 A1 | 7/2012 | Wei et al. |
| 2012/0241753 A1* | 9/2012 | Akiyama ........... H01L 21/0262 257/76 |
| 2012/0256297 A1 | 10/2012 | Morioka et al. |
| 2012/0280367 A1* | 11/2012 | Logiou ............. H01L 21/76254 257/622 |
| 2012/0282443 A1 | 11/2012 | Fujito et al. |
| 2012/0305066 A1 | 12/2012 | Fisher et al. |
| 2012/0326165 A1* | 12/2012 | Nakata ................. H01L 29/7787 257/77 |
| 2013/0020580 A1 | 1/2013 | Evans et al. |
| 2013/0032928 A1 | 2/2013 | Satoh et al. |
| 2013/0040442 A1* | 2/2013 | Satoh ..................... H01L 33/007 438/478 |
| 2013/0062734 A1 | 3/2013 | Aida et al. |
| 2013/0075770 A1 | 3/2013 | Chakraborty et al. |
| 2013/0082274 A1 | 4/2013 | Yang et al. |
| 2013/0082280 A1 | 4/2013 | Lin et al. |
| 2013/0137220 A1 | 5/2013 | Matsubara et al. |
| 2013/0149492 A1 | 6/2013 | Yoon et al. |
| 2013/0149847 A1 | 6/2013 | Satoh et al. |
| 2013/0161636 A1 | 6/2013 | Werkhoven et al. |
| 2013/0181240 A1* | 7/2013 | Chen ..................... H01L 33/005 257/94 |
| 2013/0260093 A1 | 10/2013 | Wei et al. |
| 2013/0260541 A1* | 10/2013 | Okuno ................. H01L 21/0242 438/503 |
| 2013/0285067 A1 | 10/2013 | Bethoux et al. |
| 2013/0316507 A1 | 11/2013 | Saitoh et al. |
| 2013/0337639 A1 | 12/2013 | Ivantsov et al. |
| 2014/0001484 A1 | 1/2014 | Lim et al. |
| 2014/0097442 A1* | 4/2014 | Fang ...................... H01L 33/12 257/76 |
| 2014/0103353 A1 | 4/2014 | Ishibashi et al. |
| 2014/0134773 A1* | 5/2014 | Jain ........................ H01L 33/12 438/44 |
| 2014/0185639 A1* | 7/2014 | Faurie ................... H01S 5/3013 372/44.01 |
| 2014/0225229 A1 | 8/2014 | Hachigo et al. |
| 2014/0239310 A1* | 8/2014 | Rho ................... H01L 21/02444 257/76 |
| 2014/0264776 A1* | 9/2014 | Thapa .................. H01L 29/045 257/627 |
| 2014/0342127 A1 | 11/2014 | Dimitrakopoulos et al. |
| 2015/0194442 A1* | 7/2015 | Ishibashi .............. H01L 21/0237 428/137 |

(56) References Cited

U.S. PATENT DOCUMENTS

| | | | | |
|---|---|---|---|---|
| 2015/0279902 | A1* | 10/2015 | Von Malm | H01L 27/156 257/88 |
| 2015/0349063 | A1* | 12/2015 | Kiyama | H01L 27/12 257/615 |
| 2015/0380496 | A1 | 12/2015 | Ishibashi et al. | |
| 2016/0042946 | A1* | 2/2016 | Keller | H01L 21/0254 438/478 |
| 2016/0190001 | A1 | 6/2016 | Hachigo et al. | |

FOREIGN PATENT DOCUMENTS

| | | | |
|---|---|---|---|
| CN | 102304760 A | | 1/2012 |
| CN | 102560676 A | | 7/2012 |
| JP | H09-219540 A | | 8/1997 |
| JP | 10125608 A | * | 5/1998 |
| JP | 2002-319545 A | | 10/2002 |
| JP | 2003-165798 A | | 6/2003 |
| JP | 2003197961 A | * | 7/2003 |
| JP | 2004247412 A | * | 9/2004 |
| JP | 2004-349387 A | | 12/2004 |
| JP | 2005-159047 A | | 6/2005 |
| JP | 2006-210660 A | | 8/2006 |
| JP | 2007273590 A | * | 10/2007 |
| JP | 2008-010766 A | | 1/2008 |
| JP | 2008-166646 A | | 7/2008 |
| JP | 2008-303138 A | | 12/2008 |
| JP | 2009-126722 A | | 6/2009 |
| JP | 2009-182341 A | | 8/2009 |
| JP | 2010-182936 A | | 8/2010 |
| JP | 2010-232625 A | | 10/2010 |
| JP | 2010-269970 A | | 12/2010 |
| JP | 2011-061084 A | | 3/2011 |
| JP | 2011-135054 A | | 7/2011 |
| JP | 2012-114263 A | | 6/2012 |
| JP | 2012-230969 A | | 11/2012 |
| JP | 2012-243792 A | | 12/2012 |
| KR | 20040050280 A | * | 6/2004 |
| KR | 2004-0078211 A | | 9/2004 |
| KR | 2008-0065792 A | | 7/2008 |
| KR | 2009-0065860 A | | 6/2009 |
| TW | 201230194 A | | 7/2012 |
| WO | WO-2005-076345 A1 | | 8/2005 |
| WO | WO-2011/093481 A1 | | 8/2011 |
| WO | WO-2012/066033 A1 | | 5/2012 |
| WO | WO-2013/021902 A1 | | 2/2013 |
| WO | WO-2014/125688 A1 | | 8/2014 |
| WO | WO-2015/053127 A1 | | 4/2015 |

OTHER PUBLICATIONS

Zang et al., Evolution of AlN buffer layers on Silicon and the effect on the property of the epitaxial GaN film, Nov. 2003, Physica Status Solidi (c) (Year: 2003).*
Zhao et al., Surface morphology of AlN buffer layer and its effect on GaN growth by metalorganic chemical vapor deposition, Aug. 2004, Applied Physics Letters, vol. 85, Issue 9 (Year: 2004).*
Kumakura et al., Growth of High-Quality GaN Using Novel Buffer Layer, Sep. 2005, <http://www.brl.ntt.co.jp/e/activities/file/report04/report05.html> (Year: 2005).*
Raghavan et al., Growth stresses and cracking in GaN films on (111) Si grown by metal-organic chemical-vapor deposition. I. AlN buffer layers, Oct. 2005, Journal of Applied Physics vol. 98 (Year: 2005).*
Tanaka et al., 4-inch GaN HEMT Epiwafers with less Wafer Bow, 2005, The International Conference on Compound Semiconductor Manufacturing Technology (Year: 2005).*
Baeumler et al., Assessment of layer composition and thickness in AlGaN/GaN HEMT structures by spectroscopic ellipsometry, Feb. 2005, Physica Status Solidi (a), vol. 202, No. 4, pp. 665-670 (Year: 2005).*
Shin et al., The Structural Properties of GaN Grown on Si Substrates by Using Various Annealing Conditions for the AlN Buffer Layers, Jun. 2006, Journal of the Korean Physical Society, vol. 48, No. 6, pp. 1255-1258 (Year: 2006).*
Kim et al., Growth of Crack-Free GaN Films on Si(111) Substrates with AlN Buffer Layers, Oct. 2006, Journal of the Korean Physical Society, vol. 49, No. 4, pp. 1497-1500 (Year: 2006).*
Yang et al., Influence of AlN buffer layer thickness and deposition methods on GaN epitaxial growth, Jul. 2009, Thin Solid Films, vol. 517, Issue 17, pp. 5057-5060 (Year: 2009).*
Germain et al., Advanced Development of III-Nitride Material for High Power Components, Dec. 2009 (Year: 2009).*
Kistenmacher et al., Buffer Layer Thickness and the Properties of InN Thin Films on AlN-Seeded (00.1) Sapphire and (111) Silicon , Feb. 2011, Cambridge University Press (Year: 2011).*
Shen et al., Epitaxial growth of GaN films on Si(110) substrates by rf-MBE, Nov. 2011, Physica Status Solidi (c), vol. 9, Nos. 3-4, pp. 503-506 (Year: 2011).*
Hemmingsson et al., Optimization of low temperature GaN buffer layers for halide vapor phase epitaxy growth of bulk GaN, Dec. 2012 (Year: 2012).*
Restriction Requirement dated Jan. 6, 2015 in U.S. Appl. No. 14/030,009.
Notice of Allowance dated May 8, 2015 in U.S. Appl. No. 14/030,009.
Non-Final Office Action dated Aug. 8, 2016 in U.S. Appl. No. 14/767,706.
Final Office Action dated Dec. 6, 2016 in U.S. Appl. No. 14/767,706.
Restriction Requirement dated Nov. 19, 2014 in U.S. Appl. No. 14/097,460.
Non-Final Office Action dated Sep. 3, 2015 in U.S. Appl. No. 14/097,460.
Non-Final Office Action dated Apr. 8, 2016 in U.S. Appl. No. 15/061,337.
Office Action dated Apr. 6, 2015 in related U.S. Appl. No. 14/097,460.
Notice of Allowance issued in related U.S. Appl. No. 14/907,460 dated Dec. 8, 2015.
Extended European Search Report dated May 3, 2016 in European Patent Application No. 13845267.7.
Office Action dated Jun. 22, 2016 in Chinese Patent Application No. 201380046378.9 (6 pages) with an English Translation (4 pages).
Notice of Grounds of Rejection dated Dec. 6, 2016 in Japanese Patent Application No. 2013-029125 (3 pages) with an English Translation (3 pages).
Notice of Grounds of Rejection dated Feb. 14, 2017 in Japanese Patent Application No. 2013-179839 (2 pages) with an English translation (3 pages).
Notice of Grounds of Rejection dated Feb. 14, 2017 in Japanese Patent Application No. 2013-029115 (2 pages) with an English translation (2 pages).
Office Action dated Jan. 27, 2017 in U.S. Appl. No. 15/061,337.
Advisory Action dated May 16, 2017 in U.S. Appl. No. 15/061,337.
Notice of Allowance dated May 1, 2017 in U.S. Appl. No. 14/767,706.
Office Action dated Jun. 5, 2017 in U.S. Appl. No. 15/061,337.
Office Action dated Aug. 29, 2017 in U.S. Appl. No. 15/061,337.
Office Action dated Jul. 13, 2017 in Taiwanese Patent Application No. 102133515 (6 pages) with an English translation (5 pages).
Notice of Allowance dated Jul. 18, 2017 in U.S. Appl. No. 14/767,706.
Advisory Action dated Sep. 12, 2017 in U.S. Appl. No. 15/061,337.
Notice of Allowance dated Nov. 9, 2017 in U.S. Appl. No. 14/767,706.
Machine Translation of KR 20090065860 A, dated Jun. 2009.
Non-Final Office Action dated Dec. 14, 2016 in U.S. Appl. No. 14/419,315.
Final Office Action dated Apr. 14, 2017 in U.S. Appl. No. 14/419,315.
Notice of Allowance dated Aug. 1, 2017 in U.S. Appl. No. 14/419,315.
Notice of Allowance dated Oct. 25, 2017 in U.S. Appl. No. 14/419,315.
Notice of Allowance dated Sep. 12, 2018 in U.S. Appl. No. 15/061,337.
Mion et al., "Thermal conductivity, dislocation density and GaN device design," Superlattices and Microstructures, vol. 40, pp. 338-342, Sep. 2006.
Alaei et al., "Thermal Stress and Strain in a GaN Epitaxial Layer Grown on a Sapphire Substrate by the MOCVD Method," Chinese Journal of Physics, Jun. 2010.
Restriction/Election Requirement dated May 21, 2019 in U.S. Appl. No. 15/879,018.
Office Action dated Jul. 1, 2019 in U.S. Appl. No. 15/879,018.

(56) References Cited

OTHER PUBLICATIONS

Notice of Allowance dated Nov. 12, 2019 in U.S. Appl. No. 15/879,018.

* cited by examiner

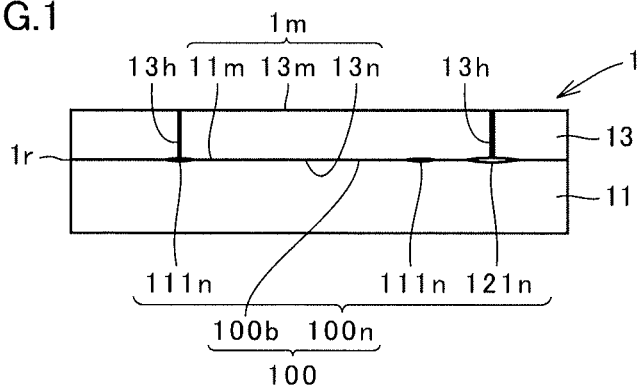
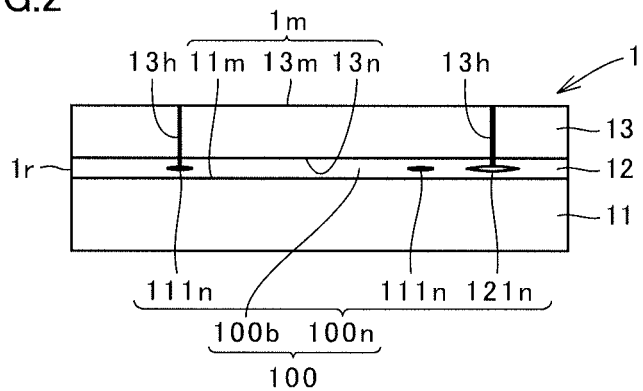
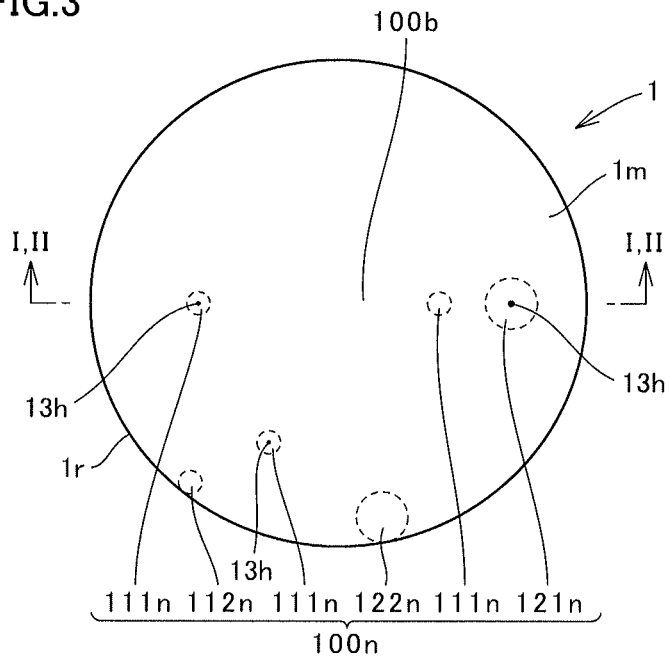

GROUP III NITRIDE COMPOSITE SUBSTRATE AND METHOD FOR MANUFACTURING THE SAME, AND METHOD FOR MANUFACTURING GROUP III NITRIDE SEMICONDUCTOR DEVICE

CROSS-REFERENCE TO RELATED APPLICATIONS

This application is a Continuation of U.S. patent application Ser. No. 15/879,018, filed Jan. 24, 2018, which is a Continuation of U.S. patent application Ser. No. 14/419,315, filed Feb. 3, 2015, now U.S. Pat. No. 9,917,004, which is a National Stage Application of PCT/JP2013/073805, filed Sep. 4, 2013, and claims the benefit of U.S. Provisional Application No. 61/712,967, filed Oct. 12, 2012 and U.S. Provisional Application No. 61/762,407, filed Feb. 8, 2013, and claims the benefit of each of Japanese Patent Application No. 2012-226777, filed Oct. 12, 2012, Japanese Patent Application No. 2012-263090, filed Nov. 30, 2012, Japanese Patent Application No. 2013-029114, filed Feb. 18, 2013, Japanese Patent Application No. 2013-029115, filed Feb. 18, 2013, Japanese Patent Application No. 2013-029125, filed Feb. 18, 2013, and Japanese Patent Application No. 2013-179839, filed Aug. 30, 2013, each of which are incorporated herein by reference in their entirety.

TECHNICAL FIELD

The present invention relates to a group III nitride composite substrate and a method for manufacturing the same, as well as a method for manufacturing a group III nitride semiconductor device using the group III nitride composite substrate.

BACKGROUND ART

Group III nitride semiconductors such as GaN, AlN, $Al_xGa_{1-x}N$ (0<x<1), and the like have superior semiconductor properties and are therefore suitable for a substrate of a semiconductor device. Such group III nitride semiconductors are expensive. Therefore, in order to reduce the cost of manufacturing a semiconductor device, there has been proposed a substrate of a semiconductor device, specifically a semiconductor substrate in which a film of a group III nitride semiconductor such as GaN, AlN, or the like is formed on a support substrate such as silicon substrate.

For example, Japanese Patent Laying-Open No. 2006-210660 (PTD 1) discloses a method for manufacturing a semiconductor substrate including the steps of: implanting ions into a front surface and its vicinity of a first nitride semiconductor substrate made from GaN, AlN, or the like; superposing a second substrate on the front surface of the first nitride semiconductor substrate; heat-treating the two substrates superposed on each other; and stripping most of the first nitride semiconductor substrate from the second substrate along a layer in which the ions are implanted.

CITATION LIST

Patent Document
PTD 1: Japanese Patent Laying-Open No. 2006-210660

SUMMARY OF INVENTION

Technical Problem

In a semiconductor substrate produced by the method for manufacturing a semiconductor substrate disclosed in Japanese Patent Laying-Open No. 2006-210660 (PTD 1), the thickness of the nitride semiconductor formed on the support substrate is a thin thickness on the order of 2 μm, and thus the semiconductor substrate suffers from a problem of a high sheet resistance of the substrate, and a problem of a low yield because the substrate is partially of an increased resistance due to damage caused by the ion implantation.

The present invention aims to solve the above problems and provide a group III nitride composite substrate having a low sheet resistance and produced with a high yield, and a method for manufacturing the same, as well as a method for manufacturing a group III nitride semiconductor device using the group III nitride composite substrate.

Solution to Problem

According to an aspect of the present invention, a group III nitride composite substrate includes a group III nitride film and a support substrate formed from a material different in chemical composition from the group III nitride film. Here, the group III nitride film is joined to the support substrate in one of a direct manner and an indirect manner. The group III nitride film has a thickness of 10 μm or more. A sheet resistance of a group III-nitride-film-side main surface of the group III nitride composite substrate is 200 Ω/sq (ohms per square) or less. In this group III nitride composite substrate, the thickness of the group III nitride film is 10 μm or more, and therefore, the sheet resistance of the group III-nitride-film-side main surface of the group III nitride composite substrate can be reduced to 200 Ω/sq or less, and group III nitride semiconductor devices can thus be manufactured with a high yield.

In the group III nitride composite substrate according to the above aspect of the present invention, an area of a joined region joining the group III nitride film and the support substrate is 70% or more relative to an area of the main surface, a non-joined region failing to join the group III nitride film and the support substrate includes at least one non-joined partial region, and the non-joined partial region may be a small non-joined partial region having a maximum size in radial direction of less than 20 mm. In this group III nitride composite substrate, the area of the joined region is a large area of 70% or more relative to the area of the main surface and the maximum size in radial direction of the non-joined partial region forming the non-joined region is a small size of less than 20 mm. Therefore, group III nitride semiconductor devices can be manufactured with a high yield.

In the group III nitride composite substrate according to the above aspect of the present invention, a non-joined region failing to join the group III nitride film and the support substrate includes at least one non-joined partial region, and the non-joined partial region may be an inner non-joined partial region failing to abut on a perimeter of the main surface. In this group III nitride composite substrate, the non-joined partial region forming the non-joined region does not abut on the perimeter of the main surface. Therefore, group III nitride semiconductor devices can be manufactured with a high yield.

In the group III nitride composite substrate according to the above aspect of the present invention, the group III nitride film has a main-surface through hole, and an area of the main-surface through hole may be 10% or less relative to an area of the main surface. In this group III nitride composite substrate, the area of the main-surface through hole is 10% or less relative to the area of the main surface.

Therefore, group III nitride semiconductor devices can be manufactured with a high yield.

In the group III nitride composite substrate according to the above aspect of the present invention, a joint interface between the group III nitride film and the support substrate includes an impurity containing metal, and the concentration of the impurity may be $1\times10^{10}$ cm$^{-2}$ or more. In this group III nitride composite substrate, the concentration of the impurity containing metal in the joint interface is $1\times10^{10}$ cm$^{-2}$ or more. Therefore, group III nitride semiconductor devices with a high joint strength can be manufactured with a high yield.

In the group III nitride composite substrate according to the above aspect of the present invention, the group ITT nitride film may have a thermal expansion coefficient of more than 0.7 times and less than 1.4 times as large as a thermal expansion coefficient of the support substrate. In this group III nitride composite substrate, the thermal expansion coefficient of the group III nitride film is more than 0.7 times and less than 1.4 times as large as the thermal expansion coefficient of the support substrate. Therefore, in the step of applying heat during manufacture of a group III nitride semiconductor device, occurrence of warp and/or cracks is prevented, and accordingly group III nitride semiconductor devices can be manufactured with a high yield.

In the group III nitride composite substrate according to the above aspect of the present invention, the support substrate may have a fracture toughness of 1 MNm$^{-2}$M or more, and the support substrate may have a thickness of 50 µm or more. In this group III nitride composite substrate, the mechanical strength is high. Therefore, group III nitride semiconductor devices can be manufactured with a high yield.

In the group III nitride composite substrate according to the above aspect of the present invention, the indirect manner may be a manner of interposing a joint film between the group III nitride film and the support substrate. In this group III nitride composite substrate, the group III nitride film and the support substrate are joined to each other with the joint film interposed therebetween. Therefore, group III nitride semiconductor devices having a high joint strength can be manufactured with a high yield.

A method for manufacturing a group III nitride composite substrate according to another aspect of the present invention is a method for manufacturing a group III nitride composite substrate of the above aspect, and includes the steps of: bonding the group III nitride film and the support substrate to each other in one of a direct manner and an indirect manner; and reducing the thickness of at least one of the group III nitride film and the support substrate bonded to each other. This method for manufacturing a group III nitride composite substrate includes these steps so that group III nitride composite substrates with a low sheet resistance can be manufactured with a high yield.

A method for manufacturing a group III nitride semiconductor device according to still another aspect of the present invention is a method for manufacturing a group III nitride semiconductor device using a group III nitride composite substrate of the above aspect, and includes the steps of: preparing the group III nitride composite substrate; and growing at least one group III nitride layer on the group III-nitride-film-side main surface of the group III nitride composite substrate. This method for manufacturing a group III nitride semiconductor device includes these steps so that group III nitride semiconductor devices can be manufactured with a high yield.

Advantageous Effects of Invention

In accordance with the present invention, a group III nitride composite substrate having a low sheet resistance and produced with a high yield, and a method for manufacturing the same, as well as a method for manufacturing a group III nitride semiconductor device using the group III nitride composite substrate can be provided.

BRIEF DESCRIPTION OF DRAWINGS

FIG. 1 is a schematic cross-sectional view showing an example of the group III nitride composite substrate according to the present invention.

FIG. 2 is a schematic cross-sectional view showing another example of the group III nitride composite substrate according to the present invention.

FIG. 3 is a schematic plan view showing a joined region and non-joined regions in the group III nitride composite substrate according to the present invention.

DESCRIPTION OF EMBODIMENTS

Figure 4:
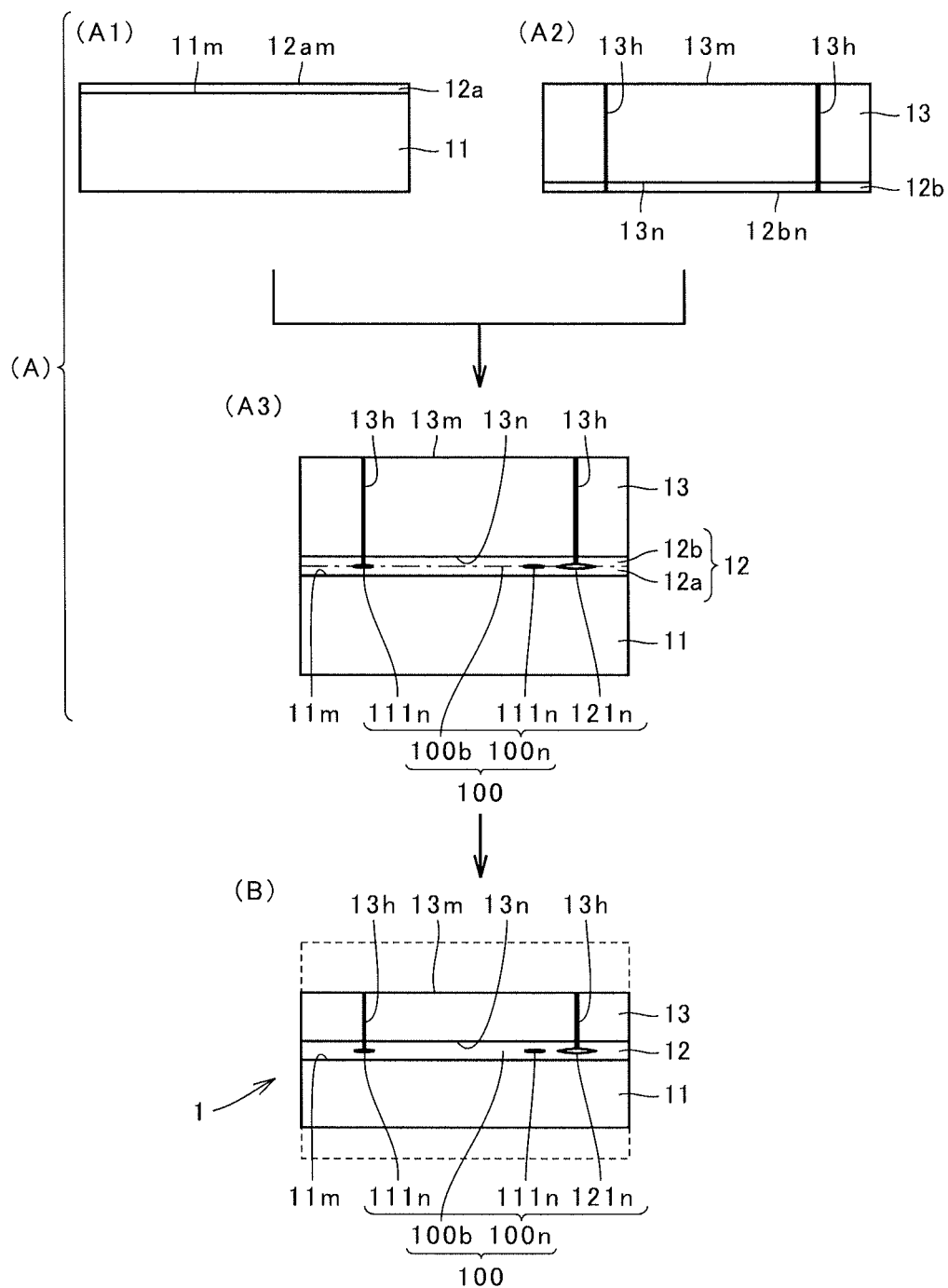
FIG. 4 is a schematic cross-sectional view showing an example of the method for manufacturing a group III nitride composite substrate according to the present invention.

First Embodiment: Group III Nitride Composite Substrate

Referring to FIGS. 1 and 2, a group III nitride composite substrate 1 which is an embodiment of the present invention includes a group III nitride film 13 and a support substrate 11 formed from a material which is different in chemical composition from group III nitride film 13. Here, group III nitride film 13 is joined to support substrate 11 in one of a direct manner and an indirect manner. Group III nitride film 13 has a thickness of 10 μm or more. A sheet resistance of a group III-nitride-film 13-side main surface 13m, which is a main surface on the group III-nitride-film side, is 200 Ω/sq or less.

In group III nitride composite substrate 1 of the present embodiment, group III nitride film 13 has a thickness of 10 μm or more, and therefore, the sheet resistance of group III-nitride-film 13-side main surface 13m can be reduced to 200 Ω/sq or less. Thus, group III nitride semiconductor devices can be manufactured with a high yield. Details will be described in the following.

Group III nitride composite substrate 1 of the present embodiment includes group III nitride film 13, and support substrate 11 formed from a material different in chemical composition from group III nitride film 13.

<Group III Nitride Film>

Group III nitride film 13 is a substrate formed from a semiconductor which is a compound of at least one group III element and nitrogen, and the substrate may for example be GaN substrate, AlN substrate, $Al_xGa_{1-x}N$ substrate (0<x<1), or the like. The method for manufacturing this group III nitride film 13 is not particularly limited. This method may be a gas phase method such as HVPE (Hydride Vapor Phase Epitaxy), sublimation method, or the like, may be a liquid phase method such as high nitrogen pressure solution method, flux method, or the like. In order to grow a group III nitride layer of high crystal quality on group III nitride film 13, group III nitride film 13 is preferably crystal, and more preferably single crystal.

In order to reduce the sheet resistance of group III nitride film 13, group III nitride film 13 may be doped with a conductivity improver impurity. This conductivity improver impurity is not particularly limited. O (oxygen) atom, Si (silicon) atom, and the like are suitable since they are highly effective in improving the conductivity.

<Support Substrate>

Support substrate 11 is a substrate supporting group III nitride film 13, and is not particularly limited as long as it is a substrate formed from a material which is different in chemical composition from group III nitride film 13. The support substrate may be an oxide substrate, and examples of the oxide substrate are: sapphire substrate and other $Al_2O_3$ substrates; mullite substrate and other $Al_2O_3$—$SiO_2$-based substrates; spinel substrate and other $Al_2O_3$—MgO-based substrates; $Al_2O_3$—$SiO_2$—YSZ (Yttria Stabilized Zirconia)-based substrate, and the like. The support substrate may also be a metal substrate such as Mo substrate, W substrate, Cu—W substrate, or the like. It may also be Si substrate, SiC substrate, graphite substrate, or the like. In addition, in the case where group III nitride film 13 is a GaN film, the support substrate may be a substrate formed from AlN for example which is a group III nitride different in chemical composition from GaN. Support substrate 11 may be either crystal or amorphous. In the case where support substrate 11 is crystal, it may be either single crystal or polycrystal.

<Manner of Joining Group III Nitride Film and Support Substrate>

In group III nitride composite substrate 1 of the present embodiment, group III nitride film 13 is joined to support substrate 11 in one of a direct manner and an indirect manner.

Referring to FIG. 1, the joint in a direct manner means that group III nitride film 13 and support substrate 11 are directly joined to each other without a separate element interposed therebetween. In the case of this direct joint manner, a joint interface 100 is an interface formed by a main surface 13n of group III nitride film 13 and a main surface 11m of support substrate 11 that are joined to each other.

Referring to FIG. 2, the joint in an indirect manner means that group III nitride film 13 and support substrate 11 are indirectly joined to each other with a separate element such as a joint film 12 for example interposed therebetween. In the case of this indirect joint manner, the joint interface varies depending on how the substrate and the film are bonded to each other as described below.

A first bonding method is as follows. As shown in FIGS. 2 and 4, a joint film 12a is formed on main surface 11m of support substrate 11 and a joint film 12b is formed on main surface 13n of group III nitride film 13. After this, a main surface 12am of joint film 12a and a main surface 12bn of joint film 12b are bonded to each other to thereby form joint film 12 into which joint film 12a and joint film 12b are integrated. In this case, joint interface 100 is a surface formed by main surface 12am of joint film 12a and main surface 12bn of joint film 12b that are joined to each other in joint film 12.

A second bonding method is as follows. Joint film 12 is formed on main surface 11m of support substrate 11 and thereafter the main surface of joint film 12 and main surface 13n of group III nitride film 13 are bonded to each other. In this case, joint interface 100 is a surface formed by the main surface of joint film 12 and main surface 13n of group III nitride film 13 that are joined to each other.

A third bonding method is as follows. Joint film 12 is formed on main surface 13n of group III nitride film 13, and thereafter the main surface of joint film 12 and main surface 11m of support substrate 11 are bonded to each other. In this case, joint interface 100 is a surface formed by the main surface of joint film 12 and main surface 11m of support substrate 11 that are joined to each other.

<Joint Film>

Joint film 12 which may be included between group III nitride film 13 and support substrate 11 in group III nitride composite substrate 1 of the present embodiment is not particularly limited as long as the joint film serves to increase the strength with which group III nitride film 13 and support substrate 11 are joined. The joint film may be $SiO_2$ film, $Si_3N_4$ film, AlN film, $Al_2O_3$ film, $TiO_2$ film, TiN film, $Ga_2O_3$ film, W film, Mo film, Au—Sn film, or the like.

The thickness of joint film 12 is not particularly limited. For the sake of increasing the strength with which group III nitride film 13 and support substrate 11 are joined to each other, the thickness is preferably 0.05 μm or more, and more preferably 0.1 μm or more. For the sake of improving the in-plane uniformity and the flatness of joint film 12, the thickness is preferably 5 μm or less, and more preferably 2 μm or less.

<Thickness of Group III Nitride Film>

Regarding group III nitride composite substrate 1 in the present embodiment, for the sake of reducing the sheet resistance of group III-nitride-film 13-side main surface 13m of group III nitride composite substrate 1, the thickness of group III nitride film 13 needs to be 10 μm or more, and is preferably 50 μm or more, and more preferably 100 μm or more. For the sake of reducing the cost of group III nitride composite substrate 1, the thickness of group III nitride film 13 is preferably 500 μm or less, and more preferably 250 μm or less.

<Sheet Resistance of Group III-Nitride-Film-Side Main Surface>

Regarding group III nitride composite substrate 1 in the present embodiment, for the sake of improving device properties of a group III nitride semiconductor device (such as luminous efficiency of a light-emitting device, for example) that are achieved by reducing the sheet resistance of group III nitride composite substrate 1, the sheet resistance of group III-nitride-film 13-side main surface 13m of group III nitride composite substrate 1 needs to be 200 Ω/sq (ohms per square) or less, and is preferably 50 Ω/sq or less, and more preferably 10 D/sq or less.

<Joined Region Joining Group III Nitride Film and Support Substrate and Non-Joined Region Failing to Join Group III Nitride Film and Support Substrate>

Referring to FIGS. 1 to 3, in group III nitride composite substrate 1 of the present embodiment, group III nitride film 13 is bonded to support substrate 11 along the above-described joint interface 100. Like a group III nitride composite substrate produced by the ion implantation method, group III nitride composite substrate 1 in the present embodiment also has surface roughness of respective main surfaces of support substrate 11, group III nitride film 13, and joint films 12, 12a, 12b, a main-surface through hole 13h of group III nitride film 13, non-uniformity of bonding, and the like. As a result, in group III nitride composite substrate 1 of the present embodiment, joint interface 100 includes a joined region 100b where group III nitride film 13 and support substrate 11 are joined to each other in either the direct manner or the indirect manner, and a non-joined region 100n where group III nitride film 13 and support substrate 11 are not joined to each other in either the direct manner or the indirect manner.

The presence, respective positions, respective sizes, and respective areas of joined region 100b and non-joined region 100n in joint interface 100 of group III nitride composite substrate 1 in the present embodiment can be measured by means of an ultrasonic microscope, a defect evaluation apparatus, or the like.

Non-joined region 100n in joint interface 100 of group III nitride composite substrate 1 in the present embodiment includes at least one non-joined partial region 111n, 112n, 121n, 122n. Although the shape of non-joined partial regions 111n, 112n, 121n, 122n is indefinite, the shape is substantially circular or elliptical. Therefore, the size of the non-joined region is evaluated on the basis of the maximum size in radial direction (maximum diameter). Non-joined partial regions 111n, 112n, 121n, 122n can be classified by size into small non-joined partial regions 111n, 112n having a maximum size in radial direction of less than 20 mm, and large non-joined partial regions 121n, 122n having a maximum radial size of 20 mm or more. Non-joined partial regions 111n, 112n, 121n, 122n can also be classified, by the position where the region is located, into inner non-joined partial regions 111n, 121n which do not abut on a perimeter 1r of a main surface 1m, and outer non-joined partial regions 112n, 122n which abut on perimeter 1r of main surface 1m.

Regarding group III nitride composite substrate 1 in the present embodiment, in order to manufacture group III nitride semiconductor devices with a high yield, the area of joined region 100b joining group III nitride film 13 and support substrate 11 relative to the area of main surface 1m is preferably 70% or more, and more preferably 85% or more. If the area of joined region 100b joining group III nitride film 13 and support substrate 11 relative to the area of main surface 1m is less than 70%, group III nitride film 13 and support substrate 11 are more likely to be separated from each other during a process of manufacturing a group III nitride semiconductor device, which makes it difficult to increase the yield of group III nitride semiconductor devices.

Regarding group III nitride composite substrate 1 in the present embodiment, in order to manufacture group III nitride semiconductor devices with a high yield, the non-joined partial region is preferably small non-joined partial region 111n, 112n having a maximum size in radial direction of less than 20 mm. Namely, in FIG. 3, any non-joined partial region is preferably small non-joined partial region 111n, 112n.

Moreover, regarding group III nitride composite substrate 1 in the present embodiment, in order to manufacture group ITT nitride semiconductor devices with a high yield, the non-joined partial region is preferably inner non-joined partial region 111n, 121n which does not abut on perimeter 1r of main surface 1m. Namely, in FIG. 3, any non-joined partial region is preferably inner non-joined partial region 111n, 121n. In the case of group III nitride composite substrate 1 including outer non-joined partial region 112n, 122n, contaminants may enter joint interface 100 during a process of fabricating group III nitride composite substrate 1 and a process of manufacturing a group III nitride semiconductor device using group III nitride composite substrate 1, and the contaminants are difficult to remove by cleaning. In this case, the yield of group III nitride semiconductor devices is difficult to increase. In addition, group III nitride composite substrate 1 including outer non-joined partial region 112n, 122n is broken through treatment during the step of reducing the thickness of at least one of the bonded group III nitride film 13 and support substrate 11. In this case as well, the yield of group III nitride semiconductor devices is difficult to increase.

Regarding group III nitride composite substrate 1 in the present embodiment, in order to manufacture group III nitride semiconductor devices with a high yield, the non-joined partial region is more preferably small and inner non-joined partial region 111n. Namely, in FIG. 3, any non-joined partial region is preferably small and inner non-joined partial region 111n.

<Main-Surface Through Hole of Group III Nitride Film>

Referring to FIGS. 1 to 3, regarding group III nitride composite substrate 1 in the present embodiment, in order to manufacture group III nitride semiconductor devices with a high yield, the area of main-surface through hole 13h of group III nitride film 13 relative to the area of main surface 1m, 13m is preferably 10% or less, and more preferably 5% or less. Here, main-surface through hole 13h is a hole extending through group III nitride film 13 between its main surface which is directly or indirectly joined to support substrate 11 and the other surface (specifically another main surface and side surface).

The presence of main-surface through hole 13h of group III nitride film 13 in group III nitride composite substrate 1 causes non-joined region 100n to be formed on main-surface through hole 13h and its nearby region. When a group III nitride semiconductor device is cleaned in the process of manufacturing the group III nitride semiconductor device, a cleaning agent may enter the joint interface through main-surface through hole 13h to thereby cause reduction of the joint strength of group III nitride composite substrate 1. If the area of main-surface through hole 13h relative to the area of main surface 1m is 10% or more, the area of non-joined region 100n is accordingly larger, resulting in the difficulty in increasing the yield of group III nitride semiconductor devices.

<Impurity Containing Metal in Joint Interface>

Referring to FIGS. 1 to 3, regarding group III nitride composite substrate 1 in the present embodiment, in order to manufacture group III nitride semiconductor devices with a high yield by increasing the joint strength, the concentration of an impurity containing metal that is included in joint interface 100 between group III nitride film 13 and support substrate 11 is preferably $1\times10^{10}$ cm$^{-2}$ or more, and more preferably $1.5\times10^{10}$ cm$^{-2}$ or more. The impurity containing metal is not particularly limited. In order to increase the joint strength, the impurity is preferably an oxide of a base metal such as Fe (iron), Ni (nickel), or the like which has a higher ionization tendency and more easily oxidizes than H (hydrogen), in the case where group III nitride composite substrate 1 includes, as joint film 12, an oxide film such as SiO$_2$ film.

<Thermal Expansion Coefficient of Group III Nitride Film and Thermal Expansion Coefficient of Support Substrate>

Referring to FIGS. 1 to 3, regarding group III nitride composite substrate 1 in the present embodiment, in order to suppress occurrence of warp and/or cracks during manufacture of a group III nitride semiconductor device and thereby manufacture group III nitride semiconductor devices with a high yield, group III nitride film 13 has a thermal expansion coefficient of preferably more than 0.7 times and less than 1.4 times, and more preferably 0.75 times or more and 1.25 times or less as large as a thermal expansion coefficient of support substrate 11.

<Fracture Toughness and Thickness of Support Substrate>

Referring to FIGS. 1 to 3, regarding group III nitride composite substrate 1 in the present embodiment, in order to suppress occurrence of warp and/or cracks during manufacture of a group III nitride semiconductor device, the support substrate has a fracture toughness of preferably 1 MNm$^{-2/3}$ or more, and more preferably 1.5 MNm$^{-2/3}$ or more. In addition, the support substrate has a thickness of preferably 50 μm or more, and more preferably 100 μm or more.

Second Embodiment: Method for Manufacturing Group III Nitride Composite Substrate Referring to FIGS. 1, 2, and 4, a method for manufacturing group III nitride composite substrate 1 which is another embodiment of the present invention is a method for manufacturing group III nitride composite substrate 1 in the first embodiment, and includes the steps of: bonding group III nitride film 13 and support substrate 11 to each other in one of a direct manner and an indirect manner (FIG. 4 (A)); and reducing the thickness of at least one of group III nitride film 13 and support substrate 11 (FIG. 4 (B)). The method for manufacturing group III nitride composite substrate 1 in the present embodiment can include the steps above to thereby manufacture group III nitride composite substrates of a low sheet resistance with a high yield.

<Step of Bonding Group III Nitride Film and Support Substrate>

Referring to FIGS. 1, 2, and 4, the method for manufacturing group III nitride composite substrate 1 in the present embodiment includes the step of firstly bonding group III nitride film 13 and support substrate 11 to each other in one of a direct manner and an indirect manner. Here, bonding group III nitride film 13 and support substrate 11 to each other in a direct manner means that group III nitride film 13 and support substrate 11 are directly bonded to each other without a separate element interposed therebetween. Bonding group III nitride film 13 and support substrate 11 to each other in an indirect manner means that group III nitride film 13 and support substrate 11 are indirectly bonded to each other with a separate element such as joint film 12 interposed therebetween.

The method for bonding group III nitride film 13 and support substrate 11 to each other is not particularly limited regardless of whether they are bonded in the direct manner or the indirect manner. Suitable methods include: a direct bonding method according to which respective surfaces to be bonded to each other are cleaned, bonded together as they are, and thereafter heated to approximately 600° C. to 1200° C. so that they are joined together; a surface activated bonding method according to which the surfaces to be bonded to each other are cleaned, subjected to an activation treatment by means of plasma or ions, and thereafter joined together in a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that they are joined together; a high vacuum bonding method according to which the surfaces to be bonded to each other are cleaned with a chemical solution and pure water, and thereafter joined together in a high vacuum atmosphere on the order of $10^{-6}$ Pa to $10^{-3}$ Pa, and the like. Any of the above-referenced bonding methods can increase the temperature to approximately 600° C. to 1200° C. after they are joined together to thereby further increase the joint strength. In particular, the surface activated bonding method, the high pressure bonding method, and the high vacuum bonding method exhibit a higher effect of increasing the joint strength through the heating to approximately 600° C. to 1200° C. after they are joined together.

While group III nitride film 13 and support substrate 11 may be bonded to each other in either the direct manner or the indirect manner as described above, in order to increase the joint strength, group III nitride film 13 and support substrate 11 are preferably bonded to each other in an indirect manner with joint film 12 interposed therebetween as shown in FIG. 4 (A). Details will be described below.

Referring to FIG. 4 (A), the step of bonding group III nitride film 13 and support substrate 11 to each other in an indirect manner with joint film 12 interposed therebetween includes: the sub step of forming joint film 12a on main surface 11m of support substrate 11 (FIG. 4 (A1)); the sub step of forming joint film 12b on main surface 13n of group III nitride film 13 (FIG. 4 (A2)); and the sub step of bonding joint film 12a formed on main surface 11m of support substrate 11 and joint film 12b formed on main surface 13n of group III nitride film 13 to each other (FIG. 4 (A3)). These sub steps are performed to join and thereby integrate joint film 12a and joint film 12b bonded to each other into joint film 12, and support substrate 11 and group III nitride film 13 are joined to each other with joint film 12 interposed therebetween.

As to the method for manufacturing group III nitride composite substrate 1 in the present embodiment as well, due to the presence of surface roughness of respective main surfaces of support substrate 11, group III nitride film 13, and joint films 12, 12a, 12b, main-surface through hole 13h of group III nitride film 13, non-uniformity of bonding, and the like, there are formed, in joint interface 100, joined region 100b where group III nitride film 13 and support substrate 11 are joined to each other in either the direct manner or the indirect manner, and non-joined region 100n where group III nitride film 13 and support substrate 11 are not joined to each other in either the direct manner or the indirect manner. The description of joined region 100b and non-joined region 100n is given above.

The method for forming joint films 12a, 12b is not particularly limited. In order to reduce the cost of forming the joint film, it is preferable to perform sputtering, vapor deposition, CVD (Chemical Vapor Deposition), or the like. The method for bonding support substrate 11 and group III nitride film 13 to each other by bonding joint film 12a and joint film 12b to each other is not particularly limited, and preferred methods are direct bonding method, surface activated bonding method, high-pressure bonding method, high vacuum bonding method, and the like as described above.

<Step of Reducing Thickness of at Least One of Group III Nitride Film and Support Substrate>

Referring to FIG. 4 (B), the method for manufacturing group III nitride composite substrate 1 in the present embodiment includes the step of subsequently reducing the thickness of at least one of group III nitride film 13 and support substrate 11 bonded to each other. Here, the method for reducing the thickness of at least one of group III nitride film 13 and support substrate 11 is not particularly limited, and may for example be the method according to which the substrate whose thickness is to be reduced is cut in parallel with the main surface, the method according to which the main surface of the substrate whose thickness is to be reduced is ground and/or polished, the method according to which the main surface of the substrate whose thickness is to be reduced is etched, the method by means of a laser, or the like. The method by means of a laser is a method according to which a laser beam is applied so that the focus of the laser beam is located at a predetermined depth from the main surface of the substrate. In the case of the method by means of a laser, the chemical composition of the region of the position at a predetermined depth from the main surface of the substrate where the laser beam is focused is changed, and accordingly the substrate can be divided at this region. Since the method by means of a laser changes the chemical composition of a region of a position at a predetermined depth from the main surface of the substrate and does not change the chemical composition of the region other than the above-referenced region, femtosecond laser, picosecond laser, or the like is preferably used.

Third Embodiment: Method for Manufacturing Group III Nitride Semiconductor Device Referring to FIG. 5, a method for manufacturing a group III nitride semiconductor device 4 which is still another embodiment of the present invention includes the steps of: preparing group III nitride composite substrate 1; and growing at least one group III nitride layer 20 on group III-nitride-film 13-side main surface 13m of group III nitride composite substrate 1. The method for manufacturing group III nitride semiconductor device 4 in the present embodiment can include the above steps to thereby manufacture group III nitride semiconductor devices with a high yield.

<Step of Preparing Group III Nitride Composite Substrate>

The method for manufacturing group III nitride semiconductor device 4 in the present embodiment includes the step of firstly preparing group III nitride composite substrate 1. This step of preparing group III nitride composite substrate 1 is similar to the steps in the method for manufacturing group III nitride composite substrate 1 in the second embodiment.

<Step of Growing Group III Nitride Layer>

The method for manufacturing group III nitride semiconductor device 4 in the present embodiment includes the step of subsequently growing at least one group III nitride layer 20 on group III-nitride-film 13-side main surface 13m of group III nitride composite substrate 1.

The method for growing group III nitride layer 20 is not particularly limited. In order to grow group III nitride layer 20 of high crystal quality, preferred methods include vapor phase methods such as MOCVD (Metal Organic Chemical Vapor Deposition), MBE (Molecular Beam Epitaxy), HVPE (Hydride Vapor Phase Epitaxy), sublimation method, and the like, and liquid phase methods such as high nitrogen pressure solution method, flux method, and the like.

The structure of group III nitride layer 20 to be grown varies depending on the type and the function of the group III nitride semiconductor device. In the case where group III nitride semiconductor device 4 is a light-emitting device, group III nitride layer 20 may be formed on group III-nitride-film 13-side main surface 13m of group III nitride composite substrate 1 by growing a first-conductivity-type GaN layer 201, a first-conductivity-type $Al_xGa_{1-x}N$ layer 202 (here, s meets $0<s<1$), a light-emitting layer 203, a second-conductivity-type $Al_tGa_{1-t}N$ layer 204 (here, t meets $0<t<1$), and a second-conductivity-type GaN layer 205, in this order.

The method for manufacturing group III nitride semiconductor device 4 in the present embodiment may include the step of subsequently forming electrodes (a first electrode and a second electrode). In group III nitride layer 20, second-conductivity-type GaN layer 205, second-conductivity-type $Al_tGa_{1-t}N$ layer 204, light-emitting layer 203, and first-conductivity-type $Al_sGa_{1-s}N$ layer 202 may each be partially removed by mesa etching to expose a part of first-conductivity-type GaN layer 201. On the exposed main surface of first-conductivity-type GaN layer 201, first electrode 30 may be formed. On the exposed main surface of the second-conductivity-type GaN layer 205, second electrode 50 may be formed. The method for forming first electrode 30 and second electrode 50 is not particularly limited, and may be CVD (Chemical Vapor Deposition), sputtering, vapor deposition, or the like.

Some reference inventions for the sake of reference for the prevent invention, namely Reference Invention I, Reference Invention II, and Reference Invention III will be described in the following.

<<Reference Invention I>>

Reference Invention I relates to a low-cost and large-diameter group III nitride composite substrate including a group III nitride film having a large thickness, a small thickness variation, and a high crystal quality, a method for manufacturing the group III nitride composite substrate, a laminated group III nitride composite substrate, and a group III nitride semiconductor device and a method for manufacturing the same.

[Background Art Regarding Reference Invention I]

Group III nitrides such as GaN have superior semiconductor properties and are therefore used as materials suitable for semiconductor devices.

For example, Japanese Patent Laying-Open No. 2009-126722 discloses a free-standing group III nitride substrate to be used as a substrate for a semiconductor device. The free-standing group III nitride substrate has a diameter of 25 mm or more and 160 mm or less and a thickness of 100 µm or more and 1000 µm or less. It discloses, as a specific example thereof, a free-standing GaN substrate having a diameter of 100 mm and a thickness of 400 µm.

Japanese Patent Laying-Open No. 2008-010766 discloses a GaN-thin-film-bonded substrate to be used as a substrate for manufacturing a semiconductor device. The GaN-thin-film-bonded substrate includes a heterogeneous substrate whose chemical composition is different from that of GaN, and a GaN thin film having a thickness of 0.1 µl or more and 100 µm or less and bonded to the heterogeneous substrate. It discloses, as a specific example thereof, a GaN-thin-film-bonded substrate having a diameter of 50.8 mm and including a sapphire substrate and a GaN thin film having a thickness of 0.1 µm or 100 µm and bonded to the sapphire substrate.

Japanese Patent Laying-Open No. 2010-182936 discloses a composite substrate to be used as a substrate for a semiconductor device. The composite substrate includes a support substrate, a nitride semiconductor layer, and a joint layer disposed between the support substrate and the nitride semiconductor layer. It discloses, as a specific example thereof, a composite substrate having a diameter of 50.8 mm and including a sapphire substrate, a GaN layer, and a joint layer formed by press fitting between the substrate and the GaN layer, in which the GaN layer has a thickness of 5 µm to 220 µm.

Problems to be Solved by Reference Invention I

The free-standing group III nitride substrate disclosed in Japanese Patent Laying-Open No. 2009-126722 involves problems that the substrate is manufactured at high cost and therefore very expensive, and that the substrate is likely to crack, resulting in difficulty in increasing the diameter of the substrate and decreasing the thickness thereof.

Regarding the GaN-thin-film-bonded substrate having the GaN thin film of 0.1 µm in thickness as disclosed in Japanese Patent Laying-Open No. 2008-010766, ion implantation is performed to form the GaN thin film, which, however, involves a problem that the ion implantation degrades the crystal quality of the GaN thin film. In order to enhance the characteristics of the semiconductor device to be formed, the thickness of the GaN thin film is preferably 10 µm or more. An increase in thickness of the GaN thin film, however, involves a problem that the variation in depth to which ions are implanted from the main surface increases, which accordingly increases the variation in thickness of the GaN thin film in the resultant GaN-thin-film-bonded substrate.

Regarding the GaN-thin-film-bonded substrate having the GaN thin film of 100 µm in thickness as disclosed in Japanese Patent Laying-Open No. 2008-010766 as well as the composite substrate having the GaN layer of 5 µm to 220 µm in thickness as disclosed in Japanese Patent Laying-Open No. 2010-182936, both these substrates have a diameter on the order of 50.8 mm. Increase of the diameter, however, involves a problem that the variation, within the main surface, of the thickness of the GaN thin film or the GaN layer increases.

In the case where a heterogeneous substrate such as sapphire substrate whose chemical composition and thermal expansion coefficient are different from those of a group III nitride substrate is prepared and a thick group III nitride film is grown on the heterogeneous substrate, there arises problems that large warp occurs and cracks are made.

Reference Invention I has been made to solve the problems above and an object of the invention is to provide a low-cost and large-diameter group III nitride composite substrate including a group III nitride film having a large thickness, a small thickness variation, and a high crystal quality, a method for manufacturing the group III nitride composite substrate, a laminated group III nitride composite substrate, and a group III nitride semiconductor device and a method for manufacturing the same.

Solution to the Problems

According to an aspect, Reference Invention I provides a group III nitride composite substrate with a diameter of 75 mm or more including a support substrate and a group III nitride film having a thickness of 10 µm or more and 250 µm or less that are bonded to each other, a ratio $s_t/m_t$ of a standard deviation $s_t$ of the thickness of the group III nitride film, to a mean value nm of the thickness thereof being 0.001 or more and 0.2 or less, and a ratio $s_o/m_o$ of a standard deviation $s_o$ of an absolute value of an off angle between a main surface of the group III nitride film and a plane of a predetermined plane orientation, to a mean value $m_o$ of the absolute value of the off angle thereof being 0.005 or more and 0.6 or less.

Regarding the group III nitride composite substrate according the above aspect of Reference Invention I, the group III nitride composite substrate may have a warp of 50 µm or less on the group III-nitride-film-side main surface, and the group III nitride composite substrate may have a total thickness variation (TTV hereinafter) of 30 µm or less. Further, a ratio $\alpha_{III-N}/\alpha_S$ of a thermal expansion coefficient $\alpha_{III-N}$ of the group III nitride film to a thermal expansion coefficient $\alpha_S$ of the support substrate may be 0.75 or more and 1.25 or less, and a ratio $t_{III-N}/t_S$ of a thickness $t_{III-N}$ of the group III nitride film to a thickness $t_S$ of the support substrate may be 0.02 or more and 1 or less. Further, impurity metal atoms of the main surface of the group III nitride film may be $3 \times 10^{12}$ atoms/cm$^2$ or less. Further, the main surface of the group III nitride film may have a root mean square roughness (RMS hereinafter) of 3 nm or less. Further, a main surface of the support substrate may have an RMS of 12 nm or less. Further, the group III nitride composite substrate may have a diameter of 100 mm or more, or may have a diameter of 125 mm or more and 300 mm or less. Further, the main surface of the group III nitride film may have a mean value $m_{III-N}$ of the RMS of 0.1 nm or more and 2 nm or less, and a standard deviation $s_{III-N}$ of the RMS of 0.4 nm or less, and a main surface of the support substrate may have a mean value $m_S$ of the RMS of 0.3 nm or more and 10 nm or less, and a standard deviation $s_S$ of the RMS of 3 nm or less.

According to another aspect, Reference Invention I provides a laminated group III nitride composite substrate including the group III nitride composite substrate according to the above aspect, and at least one group III nitride layer disposed on the group III nitride film of the group III nitride composite substrate.

According to still another aspect, Reference Invention I provides a group III nitride semiconductor device including the group III nitride film in the group III nitride composite substrate according to the above aspect, and at least one group III nitride layer disposed on the group III nitride film.

According to a further aspect, Reference Invention I provides a method for manufacturing a group III nitride composite substrate according to the above aspect, including the steps of: forming a joined substrate with a diameter of 75 mm or more by bonding a support substrate and a group III nitride film donor substrate to each other; and forming the group III nitride composite substrate by cutting the group III nitride film donor substrate in the joined substrate along a plane located inwardly at a predetermined distance from a bonded main surface of the group III nitride film donor substrate.

According to a still further aspect, Reference Invention I provides a method for manufacturing a group III nitride composite substrate according to the above aspect, including the steps of: forming a joined substrate with a diameter of 75 mm or more by bonding a support substrate and a group III nitride film donor substrate to each other; and forming the group III nitride composite substrate by performing at least one of grinding, polishing, and etching on a main surface of the group III nitride film donor substrate in the joined substrate, the main surface being opposite to a bonded main surface of the group III nitride film donor substrate.

According to a still further aspect, Reference Invention I provides a method for manufacturing a group III nitride semiconductor device, including the steps of: preparing a group III nitride composite substrate according to the above aspect; and growing at least one group III nitride layer on the group III nitride film of the group III nitride composite substrate.

The method for manufacturing a group III nitride semiconductor device according to this aspect of Reference Invention I may further include the steps of: bonding a device support substrate onto the group III nitride layer; and removing the support substrate from the group III nitride composite substrate.

Effects of Reference Invention I

Reference Invention I can provide a low-cost and large-diameter group III nitride composite substrate including a group III nitride film having a large thickness, a small thickness variation, and a high crystal quality, a method for manufacturing the group III nitride composite substrate, a laminated group III nitride composite substrate, and a group III nitride semiconductor device and a method for manufacturing the same.

Reference Embodiment I-1: Group III Nitride Composite Substrate

Figure 6:
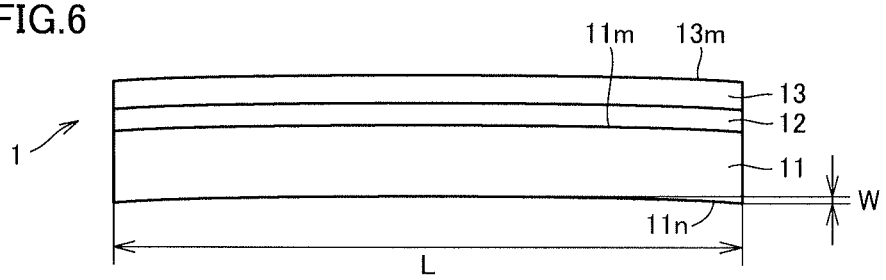
FIG. 6 is a schematic cross-sectional view showing an example of the group III nitride composite substrate according to a reference invention.

Referring to FIG. 6, a group III nitride composite substrate 1 which is a reference embodiment of Reference Invention I is a group III nitride composite substrate 1 with a diameter of 75 mm or more including a support substrate 11 and a group III nitride film 13 having a thickness of 10 μm or more and 250 μm or less that are bonded to each other. The ratio $s_t/m_t$ of a standard deviation $s_t$ of the thickness of group III nitride film 13, to a mean value $m_t$ of the thickness thereof is 0.001 or more and 0.2 or less, and the ratio $s_o/m_o$ of a standard deviation $s_o$ of an absolute value of an off angle between a main surface 13m of group III nitride film 13 and a plane of a predetermined plane orientation, to a mean value $m_o$ of the absolute value of the off angle thereof is 0.005 or more and 0.6 or less.

Group III nitride composite substrate 1 of the present reference embodiment has a diameter of 75 mm or more, group III nitride film 13 bonded onto support substrate 11 has a thickness of 10 μm or more and 250 μm or less, the ratio $s_t/m_t$ of standard deviation $s_t$ of the thickness of group III nitride film 13, to mean value $m_t$ of the thickness thereof is 0.001 or more and 0.2 or less, and the ratio $s_o/m_o$ of standard deviation $s_o$ of an absolute value of an off angle between main surface 13m of group III nitride film 13 and a plane of a predetermined plane orientation, to mean value $m_o$ of the absolute value of the off angle thereof is 0.005 or more and 0.6 or less. Accordingly, on group III nitride film 13, at least one group III nitride layer having a large diameter and a high crystal quality can be grown, and therefore, group III nitride semiconductor devices having excellent characteristics can be produced with a high yield.

Regarding group III nitride composite substrate 1 of the present reference embodiment, the manner in which support substrate 11 and group III nitride film 13 are bonded to each other is not particularly limited. In order to increase the joint strength of the bonding, however, it is preferable to provide a joint film 12 between the support substrate 11 and the group III nitride film 13.

<Diameter of Group III Nitride Composite Substrate>

In order to produce a greater number of semiconductor device chips from one composite substrate, the diameter of group III nitride composite substrate 1 is 75 mm or more, and is preferably 100 mm or more, more preferably 125 mm or more, and still more preferably 150 mm or more. Meanwhile, in order to reduce the warp of the composite substrate and increase the yield of semiconductor devices, the diameter of group III nitride composite substrate 1 is preferably 300 mm or less, and more preferably 200 mm or less.

<Warp on the Group III Nitride Film Side of Group III Nitride Composite Substrate>

In order to increase the yield of semiconductor devices to be formed, group III nitride composite substrate 1 has a warp, on the group III nitride film 13 side, of preferably 50 μm or less, more preferably 30 μm or less, and still more preferably 20 μm or less. Here, the warp on the group III nitride film 13 side of group III nitride composite substrate 1 is calculated in the following way. With respect to a least square plane where the sum of respective squares of the distances from the least square plane to any points within main surface 13m of group III nitride film 13 is a minimum value, the distance between the least square plane and a point on the main surface that is located furthest away in one direction from the least square plane and the distance between the least square plane and a point on the main surface that is located furthest away in the other direction from the least square plane are added together. The value of this sum represents the warp. The warp is measured by means of an interferometric flatness tester, a laser displacement meter, or the like.

<TTV of Group III Nitride Composite Substrate>

In order to increase the yield of semiconductor devices to be formed, the TTV (Total Thickness Variation which is one of indices used for evaluating the flatness and also called GBIR (Global Backside Ideal Range)) of group III nitride composite substrate 1 is preferably 30 μm or less, more preferably 20 μm or less, and still more preferably 10 μm or less. Here, the TTV of group III nitride composite substrate 1 is the difference between the maximum value and the minimum value, within the whole main surface 13m of group III nitride film 13, of the distance measured in the thickness direction from a reference plane, which is a main surface of support substrate 11 and is the rear surface of group III nitride composite substrate 1, to main surface 13$m$ of group III nitride film 13, which is the front surface of group III nitride composite substrate 1. Specifically, the TTV is the difference between the highest level and the lowest level of the main surface of group III nitride film 13, which is the front surface of group III nitride composite substrate 1, relative to the reference plane, which is the main surface of support substrate 11, namely the rear surface of group III nitride composite substrate 1, and corrected to be flat. The level difference is measured by means of an interferometric flatness tester, a laser displacement meter, or the like.

<Relation between Support Substrate and Group III Nitride Film in Group III Nitride Composite Substrate>

In order to reduce warp and cracks of group III nitride composite substrate 1 and of a group III nitride layer to be grown on group III nitride film 13, the ratio $\alpha_{III-N}/\alpha_S$ of thermal expansion coefficient $\alpha_{III-N}$ of the group III nitride film to thermal expansion coefficient $\alpha_s$ of the support substrate is preferably 0.75 or more and 1.25 or less, more preferably 0.8 or more and 1.2 or less, still more preferably 0.9 or more and 1.1 or less, and particularly preferably 0.95 or more and 1.05 or less.

In order to reduce warp and cracks of group III nitride composite substrate 1 and of a group III nitride layer to be grown on group III nitride film 13, the ratio $t_{III-N}/t_S$ of thickness $t_{III-N}$ of the group III nitride film to thickness $t_S$ of the support substrate is preferably 0.02 or more and 1 or less, more preferably 0.06 or more and 0.7 or less, still more preferably 0.15 or more and 0.5 or less, and particularly preferably 0.2 or more and 0.4 or less.

<Support Substrate>

Support substrate 11 is not particularly limited as long as support substrate 11 can support group III nitride film 13. In order to reduce the amount of use of the expensive group III nitride to thereby lower the cost, however, the support substrate is preferably a hetero-composition substrate whose chemical composition is different from that of the group III nitride. Further, since it is preferable as described above that the ratio $\alpha_{III-N}/\alpha_S$ of thermal expansion coefficient $\alpha_{III-N}$ of group III nitride film 13 to thermal expansion coefficient $\alpha_s$ of support substrate 11 is 0.75 or more and 1.25 or less, support substrate 11 is preferably a substrate formed of mullite ($3Al_2O_3 \cdot 2SiO_2$-$2Al_2O_3 \cdot SiO_2$), a substrate formed of mullite-YSZ (Yttria Stabilized Zirconia), a substrate formed of spinel ($MgAl_2O_4$), a substrate formed of a sintered body of an $Al_2O_3$—$SiO_2$-based composite oxide, and substrates formed respectively of sintered bodies of them to which oxide, carbonate or the like is added, a molybdenum (Mo) substrate, a tungsten (W) substrate, or the like. Here, preferred elements to be contained in the oxide and the carbonate are Ca, Mg, Sr, Ba, Al, Sc, Y, Ce, Pr, Si, Ti, Zr, V, Nb, Ta, Cr, Mn, Fe, Co, Ni, Cu, Zn, and the like.

The root mean square roughness (hereinafter also referred to as RMS) of main surface 11$n$ of support substrate 11 in group III nitride composite substrate 1 is preferably 12 nm or less, more preferably 6 nm or less, and still more preferably 2 nm or less, in order to enhance the crystal quality of a group III nitride layer to be grown on group III nitride film 13 of group III nitride composite substrate 1. Here, the RMS of main surface 11$n$ of support substrate 11 can be adjusted by polishing both the main surfaces of support substrate 11 before group III nitride film 13 is bonded to support substrate 11, or polishing, after group III nitride film 13 is bonded to support substrate 11, the other main surface to which group III nitride film 13 is not bonded. Here, the RMS of main surface 11$n$ of support substrate 11 is determined in the following way. From points on main surface 11$n$ of support substrate 11, a reference plane is calculated, and the positive square root of the mean of respective squares of the distances from the aforementioned points to the reference plane is determined. The value of the determined positive square root is the RMS, which is measured by means of an AFM (Atomic Force Microscope), an interferometric roughness meter, a stylus-based roughness meter, or the like.

The main surface 11$n$ of support substrate 11 preferably has a mean value ms of the RMS of 0.3 nm or more and 10 nm or less, and a standard deviation $s_S$ of the RMS of 3 nm or less. In the case where main surface 11$n$ of support substrate 11 has a mean value ms of the RMS of 10 nm or less and a standard deviation $s_S$ of the RMS of 3 nm or less, a group III nitride layer of high crystal quality can be grown on the whole main surface 13$m$ of group III nitride film 13 and accordingly semiconductor devices can be produced with a high yield. In order for main surface 11$n$ of support substrate 11 to have a mean value ms of the RMS of less than 0.3 nm, sophisticated surface polishing is necessary, which increases the cost to a considerable degree. In view of the above, mean value ms of the RMS of main surface 11$n$ of support substrate 11 is more preferably 0.3 nm or more and 5 nm or less, and still more preferably 0.3 nm or more and 2 nm or less. In addition, standard deviation $s_S$ of the RMS of main surface 11$n$ of support substrate 11 is more preferably 2 nm or less, and still more preferably 1 nm or less.

Figure 7:
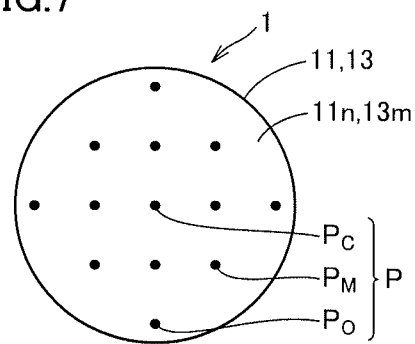
FIG. 7 is a schematic plan view showing measurement points at which measurements of physical properties are taken in the group III nitride composite substrate.

Here, mean value ms and standard deviation $s_S$ of the RMS of main surface 11$n$ of support substrate 11 are respectively the arithmetic mean and the standard deviation that are calculated from the RMS measured at the 13 measurement points on main surface 11$n$ of support substrate 11 shown in FIG. 7. The 13 measurement points P on main surface 11$n$ of support substrate 11 shown in FIG. 7 are constituted, regardless of the magnitude of the diameter of support substrate 11: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$. The standard deviation here refers to the positive square root of unbiased variance.

<Joint Film>

Joint film 12 is not particularly limited as long as joint film 12 can join support substrate 11 and group III nitride film 13 to each other. Joint film 12 is preferably $SiO_2$ film, $Si_3N_4$ film, $TiO_2$ film, $Ga_2O_3$ film, or the like because these films have a high joining ability for joining support substrate 11 and group III nitride film 13 to each other.

<Group III Nitride Film>

Group III nitride film 13 is a film formed of a group III nitride, specifically an $In_xAl_yGa_{1-x-y}N$ film ($0 \le x$, $0 \le y$, $x+y \le 1$) such as GaN film, AlN film, or the like.

In order to form a group III nitride semiconductor device having excellent characteristics, the thickness of group III nitride film 13 is 10 μm or more, which is preferably 30 μm or more, more preferably 50 μm or more, and still more preferably 100 μm or more. Meanwhile, in order to reduce the amount of use of the expensive group III nitride, the thickness of group III nitride film 13 is 250 μm or less, which is preferably 200 μm or less, and more preferably 170 μm or less, and particularly preferably 150 μm or less.

The ratio $s_t/m_t$ of standard deviation $s_t$ of the thickness of group III nitride film 13, to mean value $m_t$ of the thickness thereof is 0.001 or more and 0.2 or less, which is preferably 0.001 or more and 0.15 or less, more preferably 0.002 or more and 0.1 or less, and still more preferably 0.01 or more and 0.05 or less. In order to make the ratio $s_t/m_t$ smaller than 0.001, it is necessary to perform cutting and polishing and thereby precisely control the thickness, which increases the cost. On the contrary, if the ratio $s_t/m_t$ is higher than 0.2, the uniformity of the film thickness is deteriorated, which degrades the characteristics of semiconductor devices to be produced.

The ratio $s_o/m_o$ of standard deviation $s_o$ of an absolute value of an off angle between main surface 13m of group III nitride film 13 and a plane of a predetermined plane orientation, to mean value $m_a$ of the absolute value of the off angle thereof is 0.005 or more and 0.6 or less, which is preferably 0.005 or more and 0.5 or less, more preferably 0.008 or more and 0.4 or less, and still more preferably 0.05 or more and 0.2 or less. In order to make the ratio $s_o/m_o$ smaller than 0.005, it is necessary to perform cutting and polishing and thereby precisely control the off angle, which increases the cost. On the contrary, if the ratio $s_o/m_o$ is higher than 0.6, a portion where the morphology of a group III nitride layer formed on group III nitride film 13 is deteriorated is generated within the main surface. In addition, the variation, within the main surface, of the amount of impurities taken into the main surface is large, which reduces the yield of semiconductor devices to be produced.

The crystal structure of group III nitride film 13 is preferably the wurtzite structure, since it enables semiconductor devices having excellent characteristics to be produced. The above-referenced predetermined plane orientation to which main surface 13m of group III nitride film 13 is closest is not limited as long as it is suitable for a desired semiconductor device, and may be any of {0001}, {10-10}, {11-20}, {21-30}, {20-21}, {10-11}, {11-22}, and {22-43}, as well as plane orientations that are 15° or less off from these plane orientations, respectively. It may also be any of the plane orientations opposite to the above-listed plane orientations, as well as plane orientations that are 15° or less off from these plane orientations, respectively. Namely, main surface 13m of group III nitride film 13 may be any of polar plane, nonpolar plane, and semipolar plane. Main surface 13m of group III nitride film 13 is preferably any of the {0001} plane and the opposite plane thereof, since such planes make it easy to increase the diameter, or any of {10-10} plane, {20-21} plane, and the opposite planes thereof, since such planes suppress blue shift of a light-emitting device to be produced.

Here, regarding group III nitride film 13, mean value nm of the thickness, standard deviation $s_t$ of the thickness, mean value $m_o$ of the off angle, and standard deviation $s_o$ of the off angle, are values of the arithmetic mean and the standard deviation calculated from respective measurements of the thickness and respective measurements of the off angle that are taken at the 13 measurement points on main surface 13m of group III nitride film 13 shown in FIG. 7. The 13 measurement points P on main surface 13m of group III nitride film 13 shown in FIG. 7 are constituted, regardless of the magnitude of the diameter of the group III nitride film: one central point $P_C$; four outer points $P_O$ located respectively in the four directions with respect to central point $P_C$ that are orthogonal to each other, the outer points each being located at 5 mm inward from the outer edge; and eight middle points $P_M$ including four middle points each between the one central point $P_C$ and one of the four outer points $P_O$ and four middle points each between two of the four outer points $P_O$. The standard deviation here refers to the positive square root of unbiased variance.

In order to enhance the crystal quality of a group III nitride layer to be grown on group III nitride film 13 and enhance the characteristics of semiconductor devices to be formed, impurity metal atoms of main surface 13m of group III nitride film 13 are preferably $3 \times 10^{12}$ atoms/cm$^2$ or less, more preferably $4 \times 10^{11}$ atoms/cm$^2$ or less, and still more preferably $1 \times 10^{11}$ atoms/cm$^2$ or less. As for other impurities of the surface of group III nitride film 13, Cl atoms are preferably $2 \times 10^{14}$ atoms/cm$^2$ or less, and Si atoms are preferably $9 \times 10^{13}$ atoms/cm$^2$ or less, in order to enhance the crystal quality of a group III nitride layer to be grown on group III nitride film 13 and enhance the characteristics of semiconductor devices to be formed.

In order to enhance the crystal quality of a group III nitride layer to be grown on group III nitride film 13, the RMS of main surface 13m of group III nitride film 13 is preferably 3 nm or less, more preferably 2 nm or less, and still more preferably 1 nm or less.

Preferably, main surface 13m of group III nitride film 13 has a mean value $m_{III-N}$ of the RMS of 0.1 nm or more and 2 nm or less, and a standard deviation $s_{III-N}$ of the RMS of 0.4 nm or less. In the case where main surface 13m of group III nitride film 13 has a mean value $m_{III-N}$ of the RMS of 2 nm or less and a standard deviation $s_{III-N}$ of the RMS of 0.4 nm or less, a group III nitride layer of high crystal quality can be grown on the whole main surface 13m of group III nitride film 13, and accordingly, semiconductor devices can be produced with a high yield. In order for main surface 13m of group III nitride film 13 to have a mean value $m_{III-N}$ of the RMS of less than 0.1 nm, sophisticated surface polishing is necessary, which increases the cost to a considerable degree. In view of the above, mean value $m_{III-N}$ of the RMS of main surface 13m of group III nitride film 13 is more preferably 0.1 nm or more and 1.5 nm or less, and still more preferably 0.2 nm or more and 1 nm or less. In addition, main surface 13m of group III nitride film 13 has a standard deviation $s_{III-N}$ of the RMS of more preferably 0.3 nm or less, and still more preferably 0.2 nm or less.

Here, the mean value $m_{III-N}$ and the standard deviation $s_{III-N}$ of the RMS of main surface 13m of group In nitride film 13 are respectively the arithmetic mean and the standard deviation that are calculated from the RMS measured at the 13 measurement points on the main surface of group III nitride film 13 shown in FIG. 7, as described above. Moreover, regarding group III nitride film 13, its dislocation density is preferably $1 \times 10^8$ cm$^{-2}$ or less, and its carrier concentration is preferably $1 \times 10^{17}$ cm$^{-3}$ or more.

Reference Embodiment I-2: Laminated Group III Nitride Composite Substrate

Figure 8:
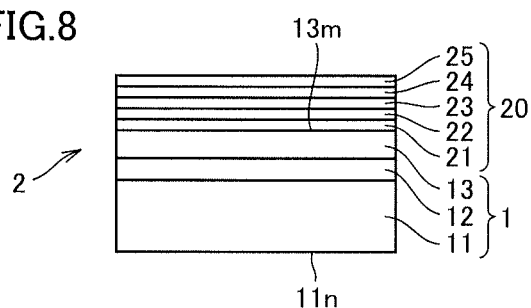
FIG. 8 is a schematic cross-sectional view showing an example of a laminated group III nitride composite substrate according to the reference invention.

Referring to FIG. 8, a laminated group III nitride composite substrate 2 which is another reference embodiment of Reference Invention I includes group III nitride composite substrate 1 of Reference Embodiment I-1, and at least one group III nitride layer 20 disposed on group III nitride film 13 of group III nitride composite substrate 1.

In laminated group III nitride composite substrate 2 of the present reference embodiment, group III nitride layer 20 disposed by being grown on group III nitride film 13, which has a high crystal quality as well as a small thickness variation and a small off-angle variation, also has a high crystal quality. Therefore, semiconductor devices having excellent characteristics can be produced with a high yield.

Figure 9:
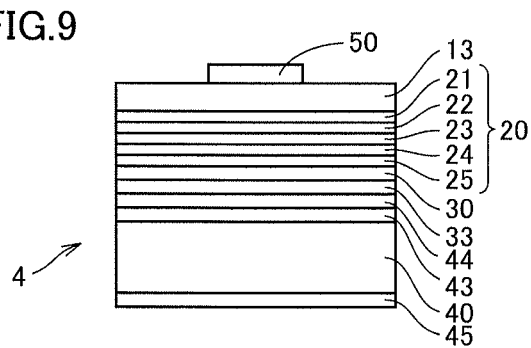
FIG. 9 is a schematic cross-sectional view showing an example of the group III nitride semiconductor device according to the reference invention.
Figure 10:
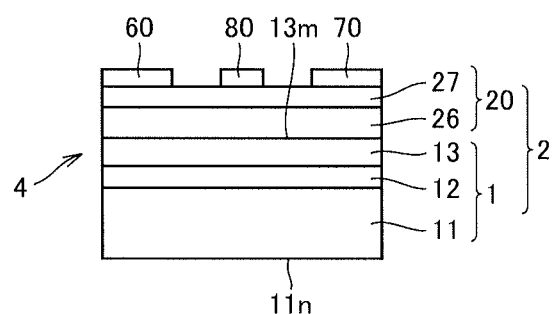
FIG. 10 is a schematic cross-sectional view showing another example of the group III nitride semiconductor device according to the reference invention.
Figure 11:
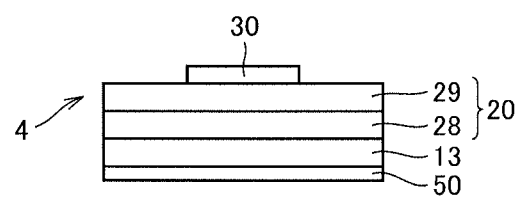
FIG. 11 is a schematic cross-sectional view showing still another example of the group III nitride semiconductor device according to the reference invention.

In laminated group III nitride composite substrate 2 of the present reference embodiment, group III nitride layer 20 disposed on group III nitride film 13 varies depending on the type of the semiconductor device to be produced. Referring to FIG. 9, in the case where the semiconductor device to be produced is a light-emitting device, group III nitride layer 20 may be configured to include, for example, an n-GaN layer 21, an n-$In_{0.05}Ga_{0.93}N$ layer 22, an active layer 23 having a multiple quantum well structure, a p-$Al_{0.09}Ga_{0.91}N$ layer 24, and a p-GaN layer 25. Referring to FIG. 10, in the case where the semiconductor device to be produced is an HEMT (High Electron Mobility Transistor) which is an example of electronic devices, the group III nitride layer may be configured to include, for example, a GaN layer 26 and an $Al_{0.2}Ga_{0.8}N$ layer 27. Referring to FIG. 11, in the case where the semiconductor device to be produced is an SBD (Schottky Barrier Diode) which is another example of electronic devices, the group III nitride layer may be configured to include, for example, an $n^i$-GaN layer 28 (having a carrier concentration for example of $2\times10^{18}$ cm$^{-3}$) and an $n^-$-GaN layer 29 (having a carrier concentration for example of $5\times10^{15}$ cm$^{-3}$).

Reference Embodiment I-3: Group III Nitride Semiconductor Device

Referring to FIGS. 9 and 10, a group III nitride semiconductor device 4 which is still another reference embodiment of Reference Invention I includes group III nitride film 13 in the group III nitride composite substrate of Reference Embodiment I-1, and at least one group III nitride layer 20 disposed on group III nitride film 13.

Group III nitride semiconductor device 4 of the present reference embodiment includes group III nitride film 13 which has a high crystal quality as well as a small thickness variation and a small off-angle variation, and group III nitride layer 20 of high crystal quality disposed by being grown on group III nitride film 13, and therefore has excellent characteristics.

In group III nitride semiconductor device 4, group III nitride layer 20 varies depending on the type of group III nitride semiconductor device 4. Referring to FIG. 9, in the case where group III nitride semiconductor device 4 is a light-emitting device, group III nitride layer 20 may be configured to include, for example, an n-GaN layer 21, an n-$In_{0.05}Ga_{0.95}N$ layer 22, an active layer 23 having a multiple quantum well structure, a p-$Al_{0.09}Ga_{0.91}N$ layer 24, and a p-GaN layer 25. Referring to FIG. 10, in the case where group III nitride semiconductor device 4 is an HEMT which is an example of electronic devices, group III nitride layer 20 may be configured to include, for example, a GaN layer 26 and an $Al_{0.2}Ga_{0.8}N$ layer 27. Referring to FIG. 11, in the case where the semiconductor device is an SBD which is another example of electronic devices, the group III nitride layer may be configured to include, for example, an $n^+$-GaN layer 28 (having a carrier concentration for example of $2\times10^{18}$ cm$^{-3}$) and an $n^-$-GaN layer 29 (having a carrier concentration for example of $5\times10^{18}$ cm$^{-3}$).

Preferably, group III nitride semiconductor device 4 further includes at least one of support substrate 11 and a device support substrate 40 for supporting group III nitride layer 20. Here, the shape of device support substrate 40 is not limited to the shape of a flat plate, and may be any as long as it supports group III nitride film 13 and group III nitride layer 20 so that group III nitride semiconductor device 4 can be formed.

Reference Embodiment I-4: Method for Manufacturing Group III Nitride Composite Substrate Referring to FIGS. 12 and 13, a method for manufacturing a group III nitride composite substrate which is a further reference embodiment of Reference Invention I is a method for manufacturing group III nitride composite substrate 1 of Reference Embodiment I-1, including the steps of: forming a joined substrate 1L, 1LS having a diameter of 75 mm or more by bonding support substrate 11 and a group III nitride film donor substrate 13D to each other (FIG. 12 (A) to (C) and FIG. 13 (A) to (C)); and forming group III nitride composite substrate 1 by cutting group III nitride film donor substrate 13D in joined substrate 1L, 1LS along a plane located inwardly at a predetermined distance from the bonded main surface of group III nitride film donor substrate 13D (FIG. 12 (D), FIG. 13 (D)).

The method for manufacturing a group III nitride composite substrate of the present reference embodiment can efficiently manufacture low-cost and large-diameter group III nitride composite substrate 1 including a group III nitride film having a large thickness and a high crystal quality.

Here, in the step of forming group III nitride composite substrate 1, the predetermined distance of the plane located inwardly from the bonded main surface of group III nitride film donor substrate 13D, for cutting group III nitride film donor substrate 13D along the plane at this distance, is determined depending on the thickness of group III nitride film 13 of group III nitride composite substrate 1 to be manufactured.

In addition, in the step of forming group III nitride composite substrate 1, group III nitride film donor substrate 13D is cut to form group III nitride film 13, and thereafter at least one of grinding, polishing, and etching can be performed on the main surface 13m of group III nitride film 13 opposite to bonded main surface 13n thereof, to thereby reduce the thickness of group III nitride film 13. In particular, in order to reduce the thickness variation and the off-angle variation of group III nitride film 13 which is formed by cutting group III nitride film donor substrate 13D, it is preferable to polish the main surface, which has been obtained by the cutting, of group III nitride film 13 in group III nitride composite substrate 1. In order to reduce the thickness variation and the off-angle variation of group III nitride film 13, the method for polishing is preferably precision polishing based on CMP (Chemical Mechanical Polishing), chemical polishing, or the like.

In view of the above, the predetermined distance of the plane located inwardly from bonded main surface 13n of group III nitride film donor substrate 13D, for cutting group III nitride film donor substrate 13D along the plane at this distance, is preferably the sum determined by adding a polishing allowance, which is a portion to be removed away by polishing, to the thickness of group III nitride film 13 of group III nitride composite substrate 1 to be manufactured.

Regarding the method for manufacturing group III nitride composite substrate 1 of the present reference embodiment, group III nitride film donor substrate 13D is cut along a plane located inwardly at a predetermined distance from bonded main surface 13n of group III nitride film donor substrate 13D in joined substrate 1L, 1LS, and preferably at least one of grinding, polishing, and etching is performed on the main surface 13m which is opposite to bonded main surface 13n of group III nitride film donor substrate 13D, to thereby adjust the film thickness by reducing it. Accordingly, group III nitride composite substrate 1 including group III nitride film 13 having a desired thickness of 10 μm or more and 250 μm or less can be obtained.

As for the method for manufacturing group III nitride composite substrate 1 of the present reference embodiment, the group III nitride film donor substrate is cut in the step of forming the group III nitride composite substrate. Thus, in order to improve the workability and the efficiency of manufacture, the thickness of group III nitride film donor substrate 13D to be used is preferably larger than 500 μm, more preferably 1 mm or more, and still more preferably 2 mm or more.

<Step of Forming Joined Substrate>

Figure 12:
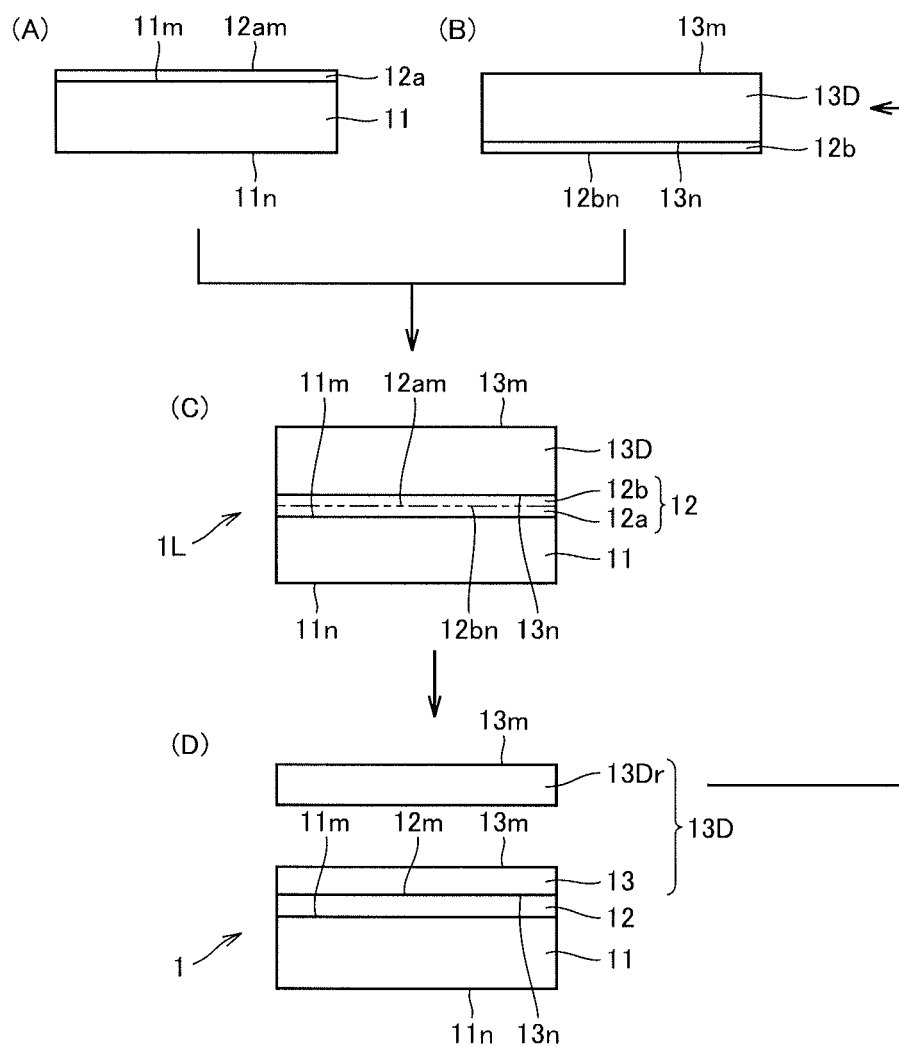
FIG. 12 is a schematic cross-sectional view showing an example of a method for manufacturing a group III nitride composite substrate according to the reference invention.
Figure 13:
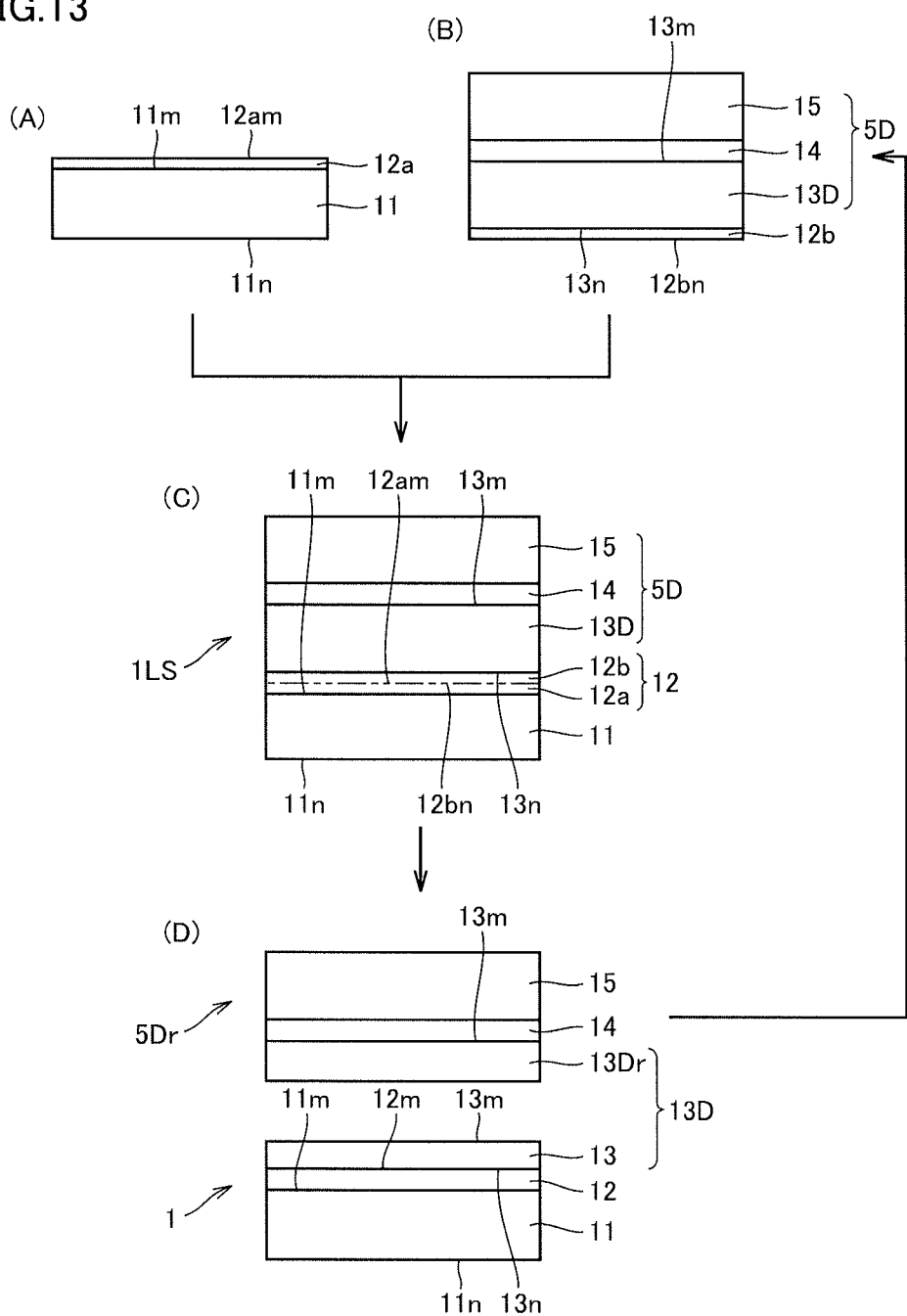
FIG. 13 is a schematic cross-sectional view showing another example of the method for manufacturing a group III nitride composite substrate according to the reference invention.

Referring to FIG. 12 (A) to (C) and FIG. 13 (A) to (C), the step of forming joined substrate 1L, 1LS includes the sub step of forming a joint film 12a on a main surface 11m of support substrate 11 (FIG. 12 (A), FIG. 13 (A)), the sub step of forming a joint film 12b on a main surface 13n of group III nitride film donor substrate 13D (FIG. 12 (B), FIG. 13 (B)), and the sub step of bonding joint film 12a formed on support substrate 1 and joint film 12b formed on group III nitride film donor substrate 13D to each other (FIG. 12 (C), FIG. 13 (C)).

Referring to FIG. 12 (A) and FIG. 13 (A), in the sub step of forming joint film 12a on main surface 11m of support substrate 11, joint film 12a is to be integrated with joint film 12b, which will be described later herein, to form joint film 12, and is made of the same material as joint film 12. The method for forming joint film 12a is not particularly limited as long as the method is suitable for forming joint film 12a. In order to efficiently form joint film 12a of good quality, however, the method is preferably sputtering, CVD (Chemical Vapor Deposition), PLD (Pulsed Laser Deposition), MBE (Molecular Beam Epitaxy), electron-beam deposition, or the like. CVD is particularly preferred since it enhances the quality of the joint film and enhances the film deposition rate. Among different CVD methods, P-CVD (Plasma-Chemical Vapor Deposition), PE-CVD (Plasma Enhanced-Chemical Vapor Deposition), and the like are more preferred since they enable the film to be deposited at a low temperature and at a high deposition rate, and LP-CVD (Low Pressure-Chemical Vapor Deposition) and the like are still more preferred since they enhance the film quality and facilitate mass production.

Further, in order to improve the joint strength, annealing may be performed after joint films 12a, 12b are formed and before they are joined together. This annealing can degas joint films 12a, 12b to thereby densify joint films 12a, 12b.

Furthermore, in order to increase the joint strength between support substrate 11 and group III nitride film donor substrate 13D, a main surface 12am of joint film 12a is preferably mirror-polished (into a mirror-finished surface having an RMS of 0.3 nm or less). The method for polishing main surface 12am of joint film 12a is not particularly limited. For example, CMP (Chemical Mechanical Polishing) or the like is used. In order to improve the cleanliness of the joint film for the purpose of increasing the joint strength, non-abrasive polishing may be performed, after CMP, with a solution containing no abrasive. In order to enhance the effect of removing the abrasive, non-abrasive polishing may be performed by means of an alkali such as KOH, TMAH (tetramethylammonium hydroxide), or an acid such as HCl, $HNO_3$, $H_2SO_4$. In addition, in order to improve the cleanliness of the joint film for the purpose of increasing the joint strength, scrub cleaning using sponge, brush, or the like may be performed. In addition, two-fluid cleaning, megasonic cleaning, ultrasonic cleaning, or the like may suitably be performed.

Referring to FIG. 12 (B) and FIG. 13 (B), in the sub step of forming joint film 12b on main surface 13n of group III nitride film donor substrate 13D, group III nitride film donor substrate 13D is a donor substrate which is to provide group III nitride film 13 after a part thereof is separated in the subsequent sub step. The method for preparing this group III nitride film donor substrate 13D is not particularly limited. In order to produce group III nitride film donor substrate 13D of good crystallinity, suitable methods are gas phase methods such as HVPE (Hydride Vapor Phase Epitaxy), MOVPE (Metal Organic Vapor Phase Epitaxy), MBE (Molecular Beam Epitaxy), and sublimation method, as well as liquid phase methods such as flux method, high nitrogen pressure solution method, ammonothermal method, and the like. Group III nitride film donor substrate 13D prepared in this way is not particularly limited. In order to provide group III nitride film 13 of good crystallinity, the donor substrate preferably has a degree of crystallinity substantially identical to that of group III nitride film 13 to be provided. Specifically, it is preferable that the ratio $s_o/m_o$ of standard deviation $s_o$ of an absolute value of an off angle between main surface 13m of group III nitride film donor substrate 13D and a plane of a predetermined plane orientation, to a mean value $m_o$ of the absolute value of the off angle thereof is 0.005 or more and 0.6 or less.

The material and the method for forming joint film 12b as well as polishing of a main surface 12bn of joint film 12b are similar to the material and the method for forming the above-described joint film 12a as well as polishing of main surface 12am of joint film 12a.

Referring to FIG. 12 (C) and FIG. 13 (C), in the sub step of bonding joint film 12a formed on support substrate 11 and joint film 12b formed on group III nitride film donor substrate 13D to each other, the method for bonding them together is not particularly limited. Suitable methods include: a direct bonding method according to which respective surfaces to be bonded to each other are cleaned, directly bonded together, and thereafter heated to approximately 600° C. to 1200° C. so that the joint films are joined together; a surface activated bonding method according to which the surfaces to be bonded to each other are cleaned, subjected to an activation treatment by means of plasma or ions, and thereafter joined together under a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that the joint films are joined together; a high vacuum bonding method according to which the surfaces to be bonded to each other are cleaned with a chemical solution and pure water, and thereafter joined together under a high vacuum atmosphere on the order of $10^{-6}$ Pa to $10^{-3}$ Pa, and the like. Any of the above-referenced bonding methods can increase the temperature to approximately 600° C. to 1200° C. after the joint films are joined together to thereby further increase the joint strength. In particular, the surface activated bonding method, the high pressure bonding method, and the high vacuum bonding method exhibit a higher effect of increasing the joint strength through the heating to approximately 600° C. to 1200° C. after the joint films are joined together.

The above bonding causes joint film 12a and joint film 12b to be joined together and thereby integrated into joint film 12. Support substrate 11 and group III nitride film donor substrate 13D are joined together with joint film 12 interposed therebetween to thereby form joined substrate 1L, 1LS.

Respective surfaces of joint films 12a and 12b to be bonded to each other can thus be activated before being bonded to each other, to thereby increase the joint strength. Activation of the surfaces to be bonded is not particularly limited. The surfaces are preferably activated through plasma treatment, ion treatment, chemical treatment by means of a chemical solution, cleaning, CMP treatment, and the like, since they have a high activation effect.

<Step of Forming Group III Nitride Composite Substrate>

Referring to FIG. 12 (D) and FIG. 13 (D), in the step of forming group III nitride composite substrate 1, group III nitride film donor substrate 13D is cut along a plane located inwardly at a predetermined distance from bonded main surface 13n of group III nitride film donor substrate 13D in joined substrate 1L, 1LS. Accordingly, the donor substrate is separated into group III nitride film 13, which is joined to support substrate 11 with joint film 12 interposed therebetween, and a remaining group III nitride film donor substrate 13Dr. Thus, group III nitride composite substrate 1 in which support substrate 11 and group III nitride film 13 are bonded to each other with joint film 12 interposed therebetween is formed.

The method for cutting group III nitride film donor substrate 13D is not particularly limited, and may be any of the methods such as wire saw, blade saw, laser processing, electrical discharge processing, water jet, and the like.

As to cutting of group III nitride film donor substrate 13D by means of a wire saw, it is preferable to use a fixed-abrasive wire in order to flatly cut group III nitride film donor substrate 13D of a large diameter, and it is preferable to use a thin wire in order to reduce a cutting allowance, which is a portion to be removed away through cutting. For reduction of the cutting allowance, loose-abrasive processing is preferred. In addition, as to cutting of group III nitride film donor substrate 13D by means of a wire saw, it is preferable to increase the tension of the wire and increase the wire speed, in order to reduce bending of the wire caused by the cut resistance and thereby improve the thickness precision and the flatness. For this purpose, a high-rigidity wire saw apparatus is preferred.

It is also preferable to swing the wire and vibrate group III nitride film donor substrate 13D in synchronization therewith, in order to reduce the cut resistance and thereby improve the thickness precision and the flatness. Specifically, the cutting resistance can be reduced in the following manner. In the case where the wire saw is positioned at a right angle or an angle close thereto relative to the direction in which group III nitride film donor substrate 13D is cut, group III nitride film donor substrate 13D is moved along the direction in which it is cut. In the case where the wire saw is located at an angle further from the right angle relative to the direction in which group III nitride film donor substrate 13D is cut, group III nitride film donor substrate 13D is moved in the direction opposite to the direction in which it is cut.

The group III nitride such as GaN is more brittle and more prone to crack as compared with sapphire, SiC, and the like, and therefore cannot be cut appropriately by a cutting method similar to that used for sapphire and SiC. It is therefore necessary for cutting of the group III nitride to further reduce the cut resistance. In order to reduce the cut resistance and thereby enhance the thickness precision and the flatness, it is preferable that the resistance coefficient R (N) is within an appropriate range, specifically a range of 4000 or more and 5000 or less. The resistance coefficient R (N) is represented by $(\eta \times Q \times V)/(L \times P \times n)$ where $\eta$ (Pa·s) is the viscosity of a machining fluid for slicing, Q (m$^3$/s) is the flow rate of the machining fluid, V (m/s) is the wire speed, L (m) is the maximum cut length, P (m/s) is the cut speed, and n is the number of workpieces that are cut simultaneously.

For group III nitride composite substrate 1 obtained through the cutting, respective main surfaces 13m, 11n of group III nitride film 13 and support substrate 11 can be polished so that a desired thickness, a desired off angle, and the uniformity of them are obtained. Specifically, in order to bond group III nitride composite substrate 1 to a polishing apparatus in a polishing process, group III nitride composite substrate 1 can be secured by means of suction and/or a back pad. Group III nitride composite substrate 1 may also be bonded first to a holding plate and then bonded to a polishing apparatus. For this bonding, mechanical pressurization such as vacuum chuck, air back pressurization, weight or the like can be used to reduce inclination and correct warp. Group III nitride composite substrate 1 may also be secured by means of suction. Group III nitride composite substrate 1 can uniformly be bonded to the polishing apparatus to reduce the thickness variation and the off-angle variation after polishing.

As seen from the above, regarding the method for manufacturing a group III nitride composite substrate in the present reference embodiment, it is preferable to polish main surface 13m of group III nitride film 13 in group III nitride composite substrate 1 obtained through cutting, in order to reduce the thickness variation and the off-angle variation of group III nitride film 13 in group III nitride composite substrate 1, keep the crystal quality high by eliminating a damaged layer caused by cutting of group III nitride film 13, and smooth main surface 13m.

Accordingly, regarding the method for manufacturing a group III nitride composite substrate in the present reference embodiment, the predetermined distance of the plane located inwardly from bonded main surface 13n of group III nitride film donor substrate 13D, for cutting group III nitride film donor substrate 13D in joined substrate 1L, 1LS along the plane at this distance, is preferably the sum determined by adding a polishing allowance, which is a portion to be removed away by polishing, to the thickness of group III nitride film 13 of group III nitride composite substrate 1 to be manufactured. Here, the polishing allowance is not particularly limited, but preferably 10 μm or more, more preferably 20 μm or more, and still more preferably 30 μm or more, in order to reduce the thickness variation and the off-angle variation and remove a damaged layer. Meanwhile, in order to reduce the material loss of group III nitride film donor substrate 13D, the polishing allowance is preferably 100 μm or less, more preferably 80 μm or less, and still more preferably 60 μm or less.

Referring also to FIGS. 12 (D) and (B) and FIGS. 13 (D) and (B), the remaining group III nitride film donor substrate 13Dr may have its main surface polished so that it can be used repeatedly.

<Use of Support-Incorporated Group III Nitride Film Donor Substrate>

Referring to FIG. 13 (B) to (D), a support-incorporated group III nitride film donor substrate 5D in which a group III nitride film donor substrate support 15 is bonded to group III nitride film donor substrate 13D can be used to produce a group III nitride composite substrate 1 in a similar manner to the above. Support-incorporated group III nitride film donor substrate 5D has group III nitride film donor substrate support 15 which supports group III nitride film donor substrate 13D, and can therefore be used repeatedly even if group III nitride film donor substrate 13D becomes thinner to such an extent that substrate 13D cannot stand by itself.

Regarding support-incorporated group III nitride film donor substrate 5D, the form in which group III nitride film donor substrate support 15 and group III nitride film donor substrate 13D are bonded to each other is not particularly limited. In order to increase the joint strength of the bonding, however, it is preferable to dispose a joint film 14 therebetween. Group III nitride film donor substrate support 15 is also not particularly limited. In order to increase the support strength and prevent occurrence of crack and warp, however, it is preferable that support 15 is formed of a material having similar physical properties to support substrate 11. While joint film 14 is not particularly limited, it may preferably be any of $SiO_2$ film, $Si_3N_4$ film, $TiO_2$ film, $Ga_2O_3$ film, and the like, since these films provide a good joint to group III nitride film donor substrate support 15 and group III nitride film donor substrate 13D.

Reference Embodiment I-5: Another Method for Manufacturing Group III Nitride Composite Substrate Referring to FIG. 14, a method for manufacturing a group III nitride composite substrate, which is a still further reference embodiment of Reference Invention I, is specifically a method for manufacturing group III nitride composite substrate 1 of the Reference Embodiment I-1, including the steps of: forming joined substrate 1L having a diameter of 75 mm or more by bonding support substrate 11 and group III nitride film donor substrate 13D to each other (FIG. 14 (A) to (C)); and forming group III nitride composite substrate 1 by performing at least one of grinding, polishing, and etching on a main surface of group III nitride film donor substrate 13D of joined substrate 1L, the main surface being located opposite to the bonded main surface of group III nitride film donor substrate 13D (FIG. 14 (D)).

In accordance with the method for manufacturing a group III nitride composite substrate in the present reference embodiment, low-cost and large-diameter group III nitride composite substrate 1 including a group III nitride film having a large thickness and a high crystal quality can efficiently be manufactured.

Regarding the method for manufacturing group III nitride composite substrate 1 in the present reference embodiment, at least one of grinding, polishing, and etching is performed on the main surface opposite to the bonded main surface of group III nitride film donor substrate 13D to thereby adjust the film thickness by reducing it, and accordingly, group III nitride composite substrate 1 including group III nitride film 13 having a desired thickness of 10 μm or more and 250 μm less can be obtained.

According to the method for manufacturing group III nitride composite substrate 1 in the present reference embodiment, in the step of forming a group III nitride composite substrate, at least one of grinding, polishing, and etching is performed on the main surface opposite to the bonded main surface of the group III nitride film donor substrate. Therefore, in order to reduce the material loss of group III nitride film donor substrate 13D, the thickness of group III nitride film donor substrate 13D to be used is preferably 500 μm or less, and more preferably 400 μm or less.

<Step of Forming Joined Substrate>

Figure 14:
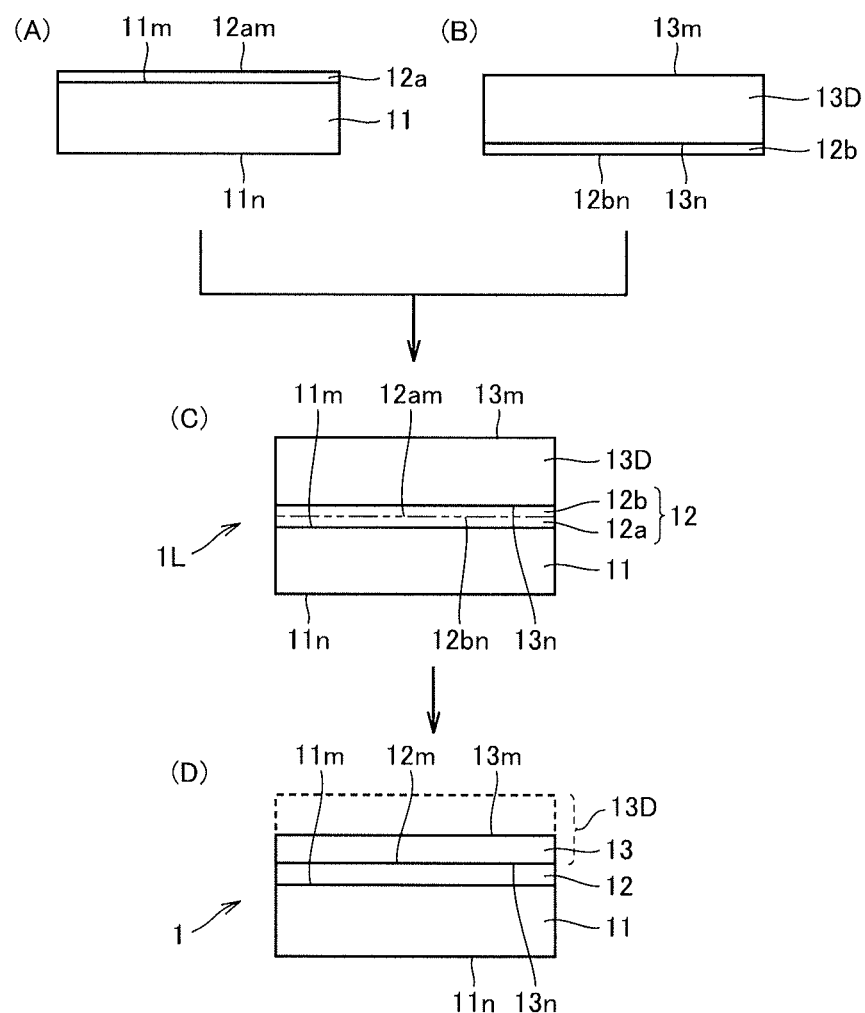
FIG. 14 is a schematic cross-sectional view showing still another example of the method for manufacturing a group III nitride composite substrate according to the reference invention.

Referring to FIG. 14 (A) to (C), the step of forming joined substrate 1L includes, similarly to the method for manufacturing a group III nitride composite substrate in Reference Embodiment I-4, the sub step of forming joint film 12a on main surface 11m of support substrate 11 (FIG. 14 (A)), the sub step of forming joint film 12b on main surface 13n of group III nitride film donor substrate 13D (FIG. 14 (B)), and the step of bonding joint film 12a formed on support substrate 11 and joint film 12b formed on group III nitride film donor substrate 13D to each other (FIG. 14 (C)).

Here, the sub step of forming joint film 12a on main surface 11m of support substrate 11 as shown in FIG. 14 (A) is similar to the sub step of forming joint film 12a on main surface 11m of support substrate 11 as shown in FIG. 12 (A). The sub step of forming joint film 12b on main surface 13n of group III nitride film donor substrate 13D as shown in FIG. 14 (B) is similar to the sub step of forming joint film 12b on main surface 13n of group III nitride film donor substrate 13D as shown in FIG. 12 (B). The sub step of bonding joint film 12a formed on support substrate 11 and joint film 12b formed on group III nitride film donor substrate 13D to each other as shown in FIG. 14 (C) is similar to the sub step of bonding joint film 12a formed on support substrate 11 and joint film 12b formed on group III nitride film donor substrate 13D to each other as shown in FIG. 12 (C). Therefore, the description of them will not be repeated.

<Step of Forming Group III Nitride Composite Substrate>

Referring to FIG. 14 (D), in the step of forming group III nitride composite substrate 1, at least one of grinding, polishing, and etching is performed on main surface 13m opposite to bonded main surface 13n of group III nitride film donor substrate 13D in joined substrate 1L, to thereby form group III nitride film 13 with its thickness reduced, from group III nitride film donor substrate 13D, and accordingly form group III nitride composite substrate 1 in which support substrate 11 and group III nitride film 13 are bonded together with joint film 12 interposed therebetween.

The method for grinding group III nitride film donor substrate 13D is not particularly limited, and may be grinding by means of one of a grinding wheel and abrasive grains. The method for polishing group III nitride film donor substrate 13D is not particularly limited, and may be rough polishing such as mechanical polishing, precision polishing such as CMP and chemical polishing, or the like. The method for etching group III nitride film donor substrate 13D is not particularly limited, and may be wet etching using a chemical solution, dry etching such as RIE (Reactive Ion Etching), or the like.

In order to reduce the thickness variation and the off-angle variation of group III nitride film 13 to be formed, it is preferable to polish main surface 13m of group III nitride film 13 of group III nitride composite substrate 1 obtained through at least one of grinding and etching. The reduction of the thickness by at least one of grinding, polishing, and etching is preferably 10 μm or more, more preferably 20 μm or more, and still more preferably 30 μm or more, in order to reduce the thickness variation and the off-angle variation, and remove a damaged layer. Meanwhile, the reduction of the thickness by at least one of grinding, polishing, and etching is preferably 100 μm or less, more preferably 80 μm or less, and still more preferably 60 μm or less, in order to reduce the material loss of group III nitride film donor substrate 13D.

Reference Embodiment I-6: Method for Manufacturing Group III Nitride Semiconductor Device Referring to FIG. 15, a method for manufacturing a group III nitride semiconductor device, which is a still further reference embodiment of Reference Invention I, includes the steps of: preparing group III nitride composite substrate 1 of Reference Embodiment I-1; and growing at least one group III nitride layer 20 on group III nitride film 13 of group III nitride composite substrate 1 (FIG. 15 (A)). The method for manufacturing a group III nitride semiconductor device in the present reference embodiment can be used to manufacture group III nitride semiconductor devices having excellent characteristics with a high yield.

Figure 15:
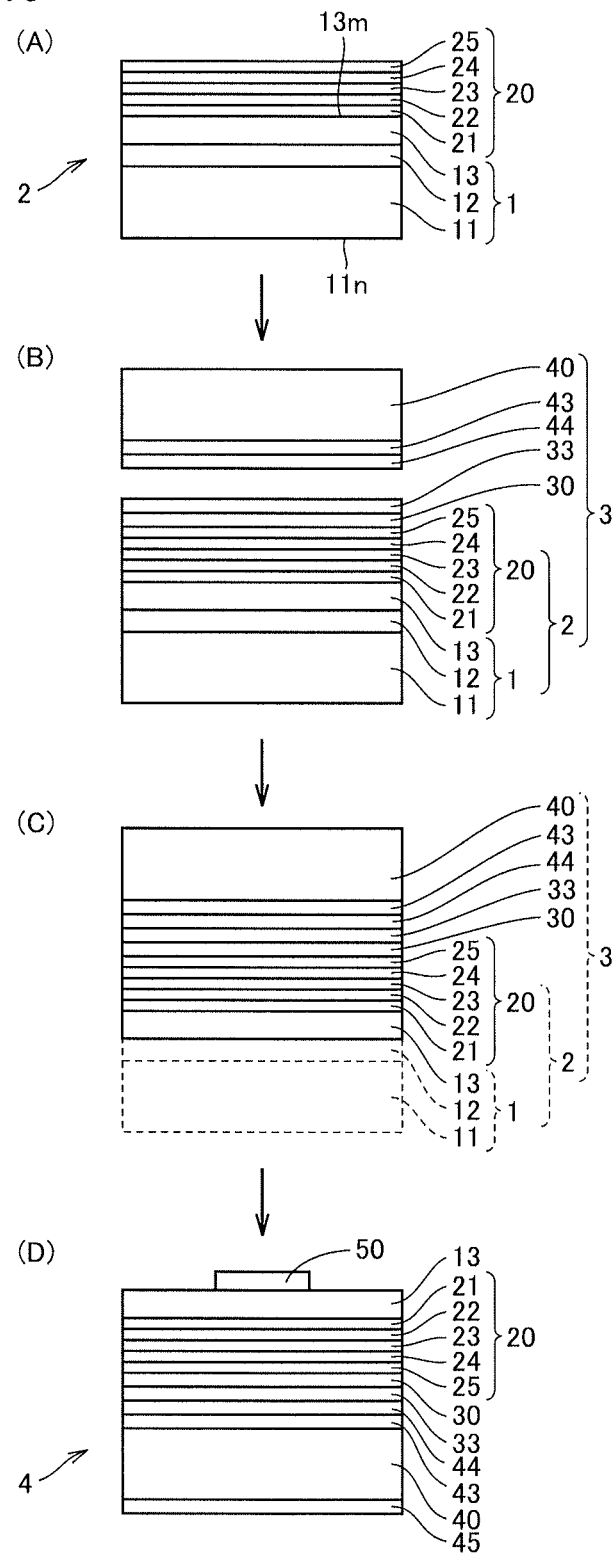
FIG. 15 is a schematic cross-sectional view showing an example of the method for manufacturing a group III nitride semiconductor device according to the reference invention.

The method for manufacturing a group III nitride semiconductor device in the present reference embodiment may further include the steps of: bonding a device support substrate 40 onto group III nitride layer 20 (FIG. 15 (B)); and removing support substrate 11 from group III nitride composite substrate 1 (FIG. 15 (C)). These steps can be added to manufacture, with a high yield, group III nitride semiconductor devices supported by device support substrate 40 and having a high mechanical strength and excellent characteristics.

The method for manufacturing a group III nitride semiconductor device in the present reference embodiment may specifically be performed through the following steps.

<Step of Growing Group III Nitride Layer>

Referring to FIG. 15 (A), in the step of growing at least one group III nitride layer 20 on group III nitride film 13 of group III nitride composite substrate 1, suitable methods for growing group III nitride layer 20 are gas phase methods such as MOVPE, MBE, HVPE, and sublimation method, as well as liquid phase methods such as flux method, in order to epitaxially grow group III nitride layer 20 having a high crystal quality, and a particularly suitable method is MOVPE.

The structure of group III nitride layer 20 varies depending on the type of group III nitride semiconductor device 4. In the case where group III nitride semiconductor device 4 is a light-emitting device, group III nitride layer 20 may be configured by successively growing, on group III nitride film 13, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25.

In this way, at least one group III nitride layer 20 is grown on group III nitride film 13 of group III nitride composite substrate 1, and accordingly laminated group III nitride composite substrate 2 is obtained.

<Step of Bonding Device Support Substrate>

Referring to FIG. 15 (B), the step of bonding device support substrate 40 onto group III nitride layer 20 is performed by forming a first electrode 30 and a pad electrode 33 on group III nitride layer 20 of laminated group III nitride composite substrate 2, forming a pad electrode 43 and a joint metal film 44 on device support substrate 40, and bonding joint metal film 44 to pad electrode 33. Through these steps, laminated substrate 3 is obtained. As device support substrate 40, Si substrate, CuW substrate, or the like is used.

<Step of Removing Support Substrate>

Referring to FIG. 15 (C), the step of removing support substrate 11 from group III nitride composite substrate 1 is performed by removing support substrate 11 of group III nitride composite substrate 1 from laminated substrate 3. In the case where group III nitride composite substrate 1 includes joint film 12 interposed between support substrate 11 and group III nitride film 13, joint film 12 can also be removed.

The method for removing support substrate 11 and joint film 12 is not particularly limited, and suitable methods to be used are grinding, etching, and the like. For example, support substrate 11 formed of a material which is low in hardness, strength, and wear resistance, and is likely to be ground off, can be removed by at least one of grinding and polishing, in order to reduce the manufacturing cost. Support substrate 11 formed of a material which can be dissolved in a chemical solution such as acid solution or alkali solution, can be removed through etching with a chemical solution, since it requires low manufacturing cost. As support substrate 11, a support substrate formed of a polycrystalline material such as ceramic material is more preferred as compared with a support substrate formed of a monocrystalline material such as sapphire, SiC, group III nitride (such as GaN), or the like, since the support substrate 11 of the polycrystalline material is easier to remove.

<Step of Forming Electrode>

Referring to FIG. 15 (D), on group III nitride film 13 which has been exposed after removal of support substrate 11 and joint film 12 from laminated substrate 3, a second electrode 50 is formed and, on device support substrate 40, a device support substrate electrode 45 is formed.

<<Reference Invention II>>

Reference Invention II relates to a low-cost and large-diameter group III nitride composite substrate which includes a thick group III nitride film and has a small temperature variation on a main surface when a group III nitride layer is grown, to enable reduction of the cost of manufacturing a semiconductor device and enable group III nitride semiconductor devices to be manufactured with a high yield. It also relates to a method for manufacturing the group III nitride composite substrate, a laminated group III nitride composite substrate, as well as a group III nitride semiconductor device and a method for manufacturing the same.

[Background Art Regarding Reference Invention II]

Group III nitrides such as GaN have superior semiconductor properties and are therefore used as materials suitable for semiconductor devices. In addition, group III nitrides such as GaN have excellent material characteristics different from those of Si, GaAs, SiC, or the like for different types of semiconductor devices such as light-emitting device and electronic device for example, and can therefore be used for a variety of devices.

For example, Japanese Patent Laying-Open No. 2009-126722 discloses a free-standing group III nitride substrate to be used as a substrate for a semiconductor device. The free-standing group III nitride substrate has a diameter of 25 mm or more and 160 mm or less and a thickness of 100 μm or more and 1000 μm or less. It discloses, as a specific example thereof, a free-standing GaN substrate having a diameter of 100 mm and a thickness of 400 μm.

Japanese Patent Laying-Open No. 2008-010766 discloses a GaN-thin-film-bonded substrate to be used as a substrate for manufacturing a semiconductor device. The GaN-thin-film-bonded substrate includes a heterogeneous substrate whose chemical composition is different from that of GaN, and a GaN thin film having a thickness of 0.1 μm or more and 100 μm or less and bonded to the heterogeneous substrate. It discloses, as a specific example thereof, a GaN-thin-film-bonded substrate having a diameter of 50.8 mm and including a sapphire substrate and a GaN thin film having a thickness of 0.1 μm or 100 μm and bonded to the sapphire substrate.

Japanese Patent Laying-Open No. 2010-182936 discloses a composite substrate to be used as a substrate for a semiconductor device. The composite substrate includes a support substrate, a nitride semiconductor layer, and a joint layer disposed between the support substrate and the nitride semiconductor layer. It discloses, as a specific example thereof, a composite substrate having a diameter of 50.8 mm and including a sapphire substrate, a GaN layer, and a joint layer formed by press fitting between the substrate and the GaN layer, in which the GaN layer has a thickness of 5 μm to 220 μm.

Problems to be Solved by Reference Invention II

The free-standing group III nitride substrate disclosed in Japanese Patent Laying-Open No. 2009-126722 involves problems that the substrate is manufactured at high cost and therefore very expensive, and that the substrate is likely to crack, resulting in difficulty in increasing the diameter of the substrate and decreasing the thickness thereof. Further, it is necessary to reduce the thickness of the free-standing group III nitride substrate when a semiconductor device is to be formed, which is accompanied by a problem of an increase in manufacturing cost due to a process step such as grinding of the rear surface (a main surface opposite to a main surface on which a group III nitride layer is formed for implementing device functions, and this definition of the rear surface is applied hereinafter) of the free-standing group III nitride substrate.

Regarding the GaN-thin-film-bonded substrate having the GaN thin film of 0.1 μm in thickness as disclosed in Japanese Patent Laying-Open No. 2008-010766, ion implantation is performed to form the GaN thin film, which, however, involves a problem that the ion implantation degrades the crystal quality of the GaN thin film. In order to enhance the characteristics of the semiconductor device to be formed, the thickness of the GaN thin film is preferably 10 μm or more. An increase in thickness of the GaN thin film, however, involves a problem that the variation in depth to which ions are implanted from the main surface increases, which accordingly increases the variation in thickness of the GaN thin film in the resultant GaN-thin-film-bonded substrate.

Moreover, the GaN-thin-film composite substrate disclosed in Japanese Patent Laying-Open No. 2008-010766 and the composite substrate disclosed in Japanese Patent Laying-Open No. 2010-182936 are each a composite substrate in which a film or layer of group III nitride is joined onto a support substrate, and are therefore likely to have a large temperature variation on the main surface of the substrate when the group III nitride layer is formed on the substrate for manufacturing a group III nitride semiconductor device, as compared with the free-standing group III nitride substrate disclosed in Japanese Patent Laying-Open No. 2009-126722. Accordingly, the above-referenced composite substrates suffer from a problem of difficulty in increasing the yield of semiconductor devices to be manufactured, if the diameter of the substrate is increased.

An object of Reference Invention II is to solve the above problems and thereby provide a low-cost and large-diameter group III nitride composite substrate which includes a thick group III nitride film and has a small temperature variation (namely unevenness, and this definition of the variation is applied hereinafter) on a main surface when a group III nitride layer is grown, to enable reduction of the cost of manufacturing a semiconductor device and enable group III nitride semiconductor devices to be manufactured with a high yield, and provide a method for manufacturing the group III nitride composite substrate, a laminated group III nitride composite substrate, as well as a group III nitride semiconductor device and a method for manufacturing the same.

Solution to the Problems

According to an aspect, Reference Invention II provides a group III nitride composite substrate with a diameter of 75 mm or more including a support substrate and a group III nitride film having a thickness of 10 μm or more and 250 μm or less that are bonded to each other, a mean value ms of a root mean square roughness of a support-substrate-side main surface being 0.3 nm or more and 20 nm or less, and a ratio $s_S/m_S$ of a standard deviation $s_S$ of the root mean square roughness, to the mean value ms of the root mean square roughness of the support-substrate-side main surface, being 0.005 or more and 0.4 or less.

Regarding the group III nitride composite substrate according to the above aspect of Reference Invention II, a mean value $m_{III-N}$ of a root mean square roughness of a group III-nitride-film-side main surface may be 0.15 nm or more and 3 nm or less, and a ratio $s_{III-N}/m_{III-N}$ of a standard deviation $s_{III-N}$ of the root mean square roughness, to the mean value $m_{III-N}$ of the root mean square roughness of the group III-nitride-film-side main surface, may be 0.008 or more and 0.5 or less. A ratio W/D of a warp W of the support-substrate-side main surface to the diameter D may be $-7\times10^{-4}$ or more and $8\times10^4$ or less. A ratio $\alpha_{III-N}/\alpha_S$ of a thermal expansion coefficient $\alpha_{III-N}$ of the group III nitride film to a thermal expansion coefficient $\alpha_S$ of the support substrate may be 0.75 or more and 1.25 or less, and a ratio $t_{III-N}/t_S$ of a thickness $t_{III-N}$ of the group III nitride film to a thickness $t_S$ of the support substrate may be 0.02 or more and 1 or less. The support substrate may have a thermal conductivity $\lambda_S$ of 3 W·m$^{-1}$·K$^{-1}$ or more and 280 W·m$^{-1}$·K$^{-1}$ or less. The support substrate may have a Young's modulus $E_S$ of 150 GPa or more and 500 GPa or less. The diameter may be 100 mm or more. Further, the diameter may be 125 mm or more and 300 mm or less.

According to another aspect, Reference Invention II provides a laminated group III nitride composite substrate including the group III nitride composite substrate according to the above aspect, and at least one group III nitride layer disposed on the group III-nitride-film-side main surface of the group III nitride composite substrate.

According to still another aspect, Reference Invention 11 provides a group III nitride semiconductor device including the group III nitride film in the group III nitride composite substrate according to the above aspect, and at least one group III nitride layer disposed on the group III nitride film.

According to a further aspect, Reference Invention II provides a method for manufacturing a group III nitride composite substrate according to the above aspect, including the steps of: forming a joined substrate with a diameter of 75 mm or more by bonding a support substrate and a group III nitride film donor substrate to each other; forming the group III nitride composite substrate by cutting the group III nitride film donor substrate in the joined substrate along a plane located inwardly at a predetermined distance from a bonded main surface of the group III nitride film donor substrate; and adjusting the root mean square roughness of the support-substrate-side main surface by polishing the support-substrate-side main surface of the group III nitride composite substrate before, in, or after any one of the above steps.

According to a still further aspect, Reference Invention 11 provides a method for manufacturing a group III nitride composite substrate according to the above aspect, including the steps of: forming a joined substrate with a diameter of 75 mm or more by bonding a support substrate and a group III nitride film donor substrate to each other; forming the group III nitride composite substrate by performing at least one of grinding, polishing, and etching on a main surface of the group III nitride film donor substrate in the joined substrate, the main surface being opposite to a bonded main surface of the group III nitride film donor substrate; and adjusting the root mean square roughness of the support-substrate-side main surface by polishing the support-substrate-side main surface of the group III nitride composite substrate before, in, or after any one of the above steps.

According to a still further aspect, Reference Invention II provides a method for manufacturing a group III nitride semiconductor device, including the steps of: preparing a group III nitride composite substrate according to the above aspect; and growing at least one group III nitride layer on a group III-nitride-film-side main surface of the group III nitride composite substrate.

The method for manufacturing a group III nitride semiconductor device according to this aspect of Reference Invention II may further include the step of removing the support substrate from the group III nitride composite substrate, after the step of growing the group III nitride layer. It may further include the step of bonding a device support substrate onto the group III nitride layer, after the step of growing the group n nitride layer and before the step of removing the support substrate.

[Effects of Reference Invention II]

Reference Invention II can provide a low-cost and large-diameter group III nitride composite substrate which includes a thick group III nitride film and has a small temperature variation on a main surface when a group III nitride layer is grown, to enable reduction of the cost of manufacturing a semiconductor device and enable group III nitride semiconductor devices to be manufactured with a high yield, and provide a method for manufacturing the group III nitride composite substrate, a laminated group III nitride composite substrate, as well as a group III nitride semiconductor device and a method for manufacturing the same.

Reference Embodiment II-1: Group III Nitride Composite Substrate

Referring to FIG. 6, a group III nitride composite substrate 1 which is a reference embodiment of Reference Invention II is a group III nitride composite substrate 1 with a diameter of 75 mm or more including a support substrate 11 and a group III nitride film 13 having a thickness of 10 μm or more and 250 μm or less that are bonded to each other, a mean value ms of a root mean square roughness (hereinafter also referred to as RMS) of a support-substrate 11-side main surface 11n, which is a main surface on the support-substrate side, is 0.3 nm or more and 20 nm or less, and a ratio $s_S/m_S$ of a standard deviation $s_S$ of the RMS, to the mean value ms of the RMS of support-substrate 11-side main surface 11n, is 0.005 or more and 0.4 or less.

Regarding group I nitride composite substrate 1 in the present reference embodiment, the temperature variation (namely unevenness) on the main surface is small when a group III nitride layer is grown for manufacturing a group III nitride semiconductor device, and therefore, the group III nitride layer having a high crystal quality can be grown. Thus, high-quality group III nitride semiconductor devices can be manufactured with a high yield. This will be described in more detail in the following.

Referring to FIGS. 6 and 8, group III nitride composite substrate 1 in the present reference embodiment has a structure in which group III nitride film 13 is bonded onto support substrate 11. When a group III nitride semiconductor device is manufactured, a susceptor (not shown) including a temperature raising apparatus is arranged so that support-substrate 11-side main surface 11n, which corresponds to the rear side of group III nitride composite substrate 1, is opposite to a main surface of the susceptor, and at least one group III nitride layer 20 is grown on a group III-nitride-film 13-side main surface 13m, which corresponds to the front side of group III nitride composite substrate 1.

Group III nitride composite substrate 1 in the present reference embodiment has a diameter of 75 mm or more, group III nitride film 13 bonded onto support substrate 11 of the composite substrate has a thickness of 10 μm or more and 250 μm or less, mean value ms of the RMS of support-substrate 11-side main surface 11n is 0.3 nm or more and 20 nm or less, and a ratio $s_S/m_S$ of standard deviation $s_S$ of the RMS, to mean value ms of the RMS of support-substrate 11-side main surface 11n is 0.005 or more and 0.4 or less. Thus, heat is uniformly transmitted from the main surface of the susceptor whose temperature has been raised, to the whole of support-substrate 11-side main surface 11n which is the rear side of large-diameter group III nitride composite substrate 1 and has a small average and variation of the RMS. Therefore, group III nitride composite substrate 1 with a large diameter is entirely heated uniformly. Accordingly, a small and uniform temperature variation on the group III-nitride-film 13-side main surface 13m, which is the front side of group III nitride composite substrate 1 of a large diameter, is obtained. Thus, on group III-nitride-film 13-side main surface 13m of large-diameter group III nitride composite substrate 1, uniform and large-diameter group III nitride layer 20 having a high crystal quality can be grown, and therefore, group III nitride semiconductor devices having excellent characteristics can be manufactured with a high yield.

Referring to FIG. 6, the manner in which support substrate 11 and group III nitride film 13 are bonded to each other in group III nitride composite substrate 1 is not particularly limited. In order to increase the joint strength of the bonding, however, it is preferable to provide a joint film 12 between the support substrate and the group III nitride film.

<Thickness of Group III Nitride Film>

Referring to FIGS. 6 and 7, the thickness of group III nitride film 13 of group III nitride composite substrate 1 in the present reference embodiment is 10 μm or more and 250 μm or less. Here, the thickness of group III nitride film 13 refers to the mean value calculated from the thicknesses measured at 13 measurement points on main surface 13m of group III nitride film 13 shown in FIG. 7. The 13 measurement points P on the main surface of group III nitride film 13 shown in FIG. 7 are constituted, regardless of the magnitude of the diameter of the group III nitride film: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

In order to grow a group III nitride layer having a high crystal quality, group III nitride film 13 needs a thickness of 10 μm or more, preferably 30 μm or more, more preferably 80 μm or more, and still more preferably 100 μm or more. Meanwhile, in order to reduce the cost of the material for group III nitride composite substrate 1, group III nitride film 13 needs a thickness of 250 μm or less, preferably 200 μm or less, more preferably 180 or less, and still more preferably 130 μm or less.

<Diameter of Group III Nitride Composite Substrate>

Referring to FIG. 6, group III nitride composite substrate 1 in the present reference embodiment has a diameter of 75 mm or more. In order to produce a greater number of semiconductor device chips from one composite substrate, group III nitride composite substrate 1 needs a diameter of 75 mm or more, preferably 100 mm or more, more preferably 125 mm or more, and still more preferably 150 mm or more. Meanwhile, in order to reduce the warp of the composite substrate and increase the yield of semiconductor devices, the diameter of group III nitride composite substrate 1 is preferably 300 mm or less, and more preferably 200 mm or less.

<RMS of Support-Substrate-Side Main Surface>

Referring to FIGS. 6 and 7, group III nitride composite substrate 1 in the present reference embodiment has a mean value ms of the RMS of support-substrate 11-side main surface 11n of 0.3 nm or more and 20 nm or less, and a ratio $s_S/m_S$ of standard deviation $s_S$ of the RMS to mean value ms of the RMS of support-substrate 11-side main surface 11n of 0.005 or more and 0.4 or less.

Regarding support-substrate 11-side main surface 11n which is the rear side of group III nitride composite substrate 1, in order to grow a uniform group III nitride layer having a high quality on group III-nitride-film 13-side main surface 13m of group III nitride composite substrate 1, support-substrate 11-side main surface 11n needs a mean value ms of the RMS of 20 nm or less, preferably 10 nm or less, and more preferably 5 nm or less, and a ratio $s_S/m_S$ of standard deviation $s_S$ of the RMS to mean value ms of the RMS of 0.4 or less, preferably 0.3 or less, and more preferably 0.2 or less.

Regarding support-substrate 11-side main surface 11n which is the rear side of group III nitride composite substrate 1, in order to reduce the cost of surface treatment of main surface 11n, support-substrate 11-side main surface 1 in needs a mean value ms of the RMS of 0.3 nm or more, preferably 0.5 nm or more, and more preferably 1 nm or more, and a ratio $s_S/m_S$ of standard deviation $s_S$ of the RMS to mean value ms of the RMS of 0.005 or more, preferably 0.01 or more, and more preferably 0.05 or more.

Referring to FIG. 7, mean value ms and standard deviation $s_S$ of the RMS of support-substrate 11-side main surface 1 in of group III nitride composite substrate 1 are respectively the arithmetic mean and the standard deviation that are calculated from the RMS measured at the 13 measurement points P on main surface 11n of support substrate 11. The 13 measurement points P on main surface 11n of support substrate 11 shown in FIG. 7 are constituted, regardless of the magnitude of the diameter of support substrate 11: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$. The standard deviation refers to the positive square root of unbiased variance.

The RMS measured at the 13 measurement points P on main surface 11n of support substrate 11 shown in FIG. 7 refers to the positive square root of the mean of respective squares of the distances to the points from a reference plane which is calculated from each point in a measurement region having a size of 85 μm×85 μm in which measurement point P is located at the center, and is measured by means of an AFM (Atomic Force Microscope), an interferometric roughness meter, a laser microscope, a stylus-based roughness meter, or the like.

It should be noted that mean value $m_s$ and standard deviation $s_S$ of the RMS of support-substrate 11-side main surface 11n of group III nitride composite substrate 1 can be adjusted, as described later herein, by physical properties of abrasives, a surface plate, and a polishing pad for polishing main surface 11n of support substrate 11, the shapes of the surface plate and the polishing pad, and polishing conditions.

<RMS of Group III-Nitride-Film-Side Main Surface>

Referring to FIGS. 6 and 7, group III nitride composite substrate 1 in the present reference embodiment preferably has a mean value $m_{III-N}$ of the RMS of group III-nitride-film 13-side main surface 13m of 0.15 nm or more and 3 nm or less, and preferably has a ratio $s_{III-N}/m_{III-N}$ of standard deviation $s_{III-N}$ of the RMS to mean value $m_{III-N}$ of the RMS of group III-nitride-film 13-side main surface 13m of 0.008 or more and 0.5 or less.

Regarding group III-nitride-film 13-side main surface 13m which is the front side of group III nitride composite substrate 1, in order to grow a uniform group III nitride layer having a high crystal quality on main surface 13m, mean value $m_{III-N}$ of the RMS is preferably 3 nm or less, more preferably 2 nm or less, and still more preferably 1.6 nm or less, and ratio $s_{III-N}/m_{III-N}$ of standard deviation $s_{III-N}$ of the RMS to mean value $m_{III-N}$ of the RMS is preferably 0.5 or less, more preferably 0.4 or less, and still more preferably 0.2 or less.

Further, regarding group III-nitride-film 13-side main surface 13m which is the front side of group III nitride composite substrate 1, in order to reduce the cost of surface treatment of main surface 13m, mean value $m_{III-N}$ of the RMS is preferably 0.15 nm or more, more preferably 0.4 nm or more, and still more preferably 0.8 nm or more, and ratio $s_{III-N}/m_{III-N}$ of standard deviation $s_{III-N}$ of the RMS to mean value $m_{III-N}$ of the RMS is preferably 0.008 or more, more preferably 0.02 or more, and still more preferably 0.05 or more.

Referring to FIG. 7, mean value $m_{III-N}$ and standard deviation $s_{III-N}$ of the RMS of group III-nitride-film 13-side main surface 13m of group III nitride composite substrate 1 are respectively the arithmetic mean and the standard deviation that are calculated from the RMS measured at the 13 measurement points P on main surface 13m of group III nitride film 13. The 13 measurement points P on main surface 13m of group III nitride film 13 shown in FIG. 7 are constituted, regardless of the magnitude of the diameter of group III nitride film 13: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$. The standard deviation refers to the positive square root of unbiased variance.

The RMS measured at the 13 measurement points P on main surface $13m$ of group III nitride film 13 shown in FIG. 7 refers to the positive square root of the mean of respective squares of the distances to the points from a reference plane which is calculated from each point in a measurement region having a size of 85 μm×85 μm in which measurement point P is located at the center, and is measured by means of an AFM (Atomic Force Microscope), an interferometric roughness meter, a laser microscope, a stylus-based roughness meter, or the like.

It should be noted that mean value $m_{III-N}$ and standard deviation $s_{III-N}$ of the RMS of group III-nitride-film 13-side main surface $13m$ of group III nitride composite substrate 1 can be adjusted, as described later herein, by physical properties of abrasives, a surface plate, and a polishing pad for polishing main surface $13m$ of group III nitride film 13, the shapes of the surface plate and the polishing pad, and polishing conditions.

<Ratio of Warp of Support-Substrate-Side Main Surface to Diameter>

Referring to FIG. 6, regarding group III nitride composite substrate 1 in the present reference embodiment, a ratio W/D of a warp W of support-substrate 11-side main surface $11n$ to a diameter D is preferably $-7 \times 10^{-4}$ or more and $8 \times 10^{-4}$ or less, more preferably $-4 \times 10^{-4}$ or more and $5 \times 10^{-4}$ or less, still more preferably $-2.5 \times 10^{-4}$ or more and $3 \times 10^{-4}$ or less, and particularly preferably $-1 \times 10^{-4}$ or more and $1.5 \times 10^{-4}$ or less. Regarding the signs for warp W and ratio W/D, a concave warp of support-substrate 11-side main surface $11n$ is herein indicated with the +(positive) sign, and a convex warp of support-substrate 11-side main surface $11n$ is herein indicated with the — (negative) sign. If ratio W/D of warp W of support-substrate 11-side main surface $11n$ to diameter D of group III nitride composite substrate 1 is a small value of preferably $-7 \times 10^{-4}$ or more and $8 \times 10^{-4}$ or less, more preferably $-4 \times 10^{4}$ or more and $5 \times 10^{-4}$ or less, still more preferably $-2.5 \times 10^{-4}$ or more and $3 \times 10^{-4}$ or less, and particularly preferably $-1 \times 10^{-4}$ or more and $1.5 \times 10^{-4}$ or less, heat is uniformly transmitted to the whole of support-substrate 11-side main surface $11n$ of large-diameter group III nitride composite substrate 1, from the main surface of the susceptor with its temperature increased, when a group III nitride layer is grown on group III-nitride-film 13-side main surface $13m$ of group III nitride composite substrate 1, and therefore, the whole of group III nitride composite substrate 1 is uniformly heated. Accordingly, the temperature on group III-nitride-film 13-side main surface $13m$ which is the front side of group III nitride composite substrate 1 has a small variation and uniformity. Thus, a uniform and large-diameter group III nitride layer having a high crystal quality can be grown on group III-nitride-film 13-side main surface $13m$ of group III nitride composite substrate 1. Accordingly, group III nitride semiconductor devices having excellent characteristics can be manufactured with a high yield.

<Ratio of Thermal Expansion Coefficient of Group III Nitride Film to Thermal Expansion Coefficient of Support Substrate>

Referring to FIG. 6, regarding group III nitride composite substrate 1 in the present reference embodiment, in order to suppress warp and cracks of group III nitride composite substrate 1 and of a group III nitride layer grown on group III nitride film 13 and thereby increase the yield of group III nitride semiconductor devices, a ratio $\alpha_{III-N}/\alpha_S$ of a thermal expansion coefficient $\alpha_{III-N}$ of group III nitride film 13 to a thermal expansion coefficient $\alpha_S$ of support substrate 1 is preferably 0.75 or more and 1.25 or less, more preferably 0.85 or more and 1.15 or less, and still more preferably 0.95 or more and 1.05 or less. Thermal expansion coefficient $\alpha_S$ of support substrate 11 and thermal expansion coefficient $\alpha_{III-N}$ of group III nitride film 13 can be measured with a thermomechanical analysis apparatus.

<Ratio of Thickness of Group III Nitride Film to Thickness of Support Substrate>

Referring to FIG. 6, regarding group III nitride composite substrate 1 in the present reference embodiment, in order to suppress warp and cracks of group III nitride composite substrate 1 and of a group III nitride layer grown on group III nitride film 13 and thereby increase the yield of group III nitride semiconductor devices, a ratio $t_{III-N}/t_S$ of a thickness $t_{III-N}$ of group III nitride film 13 to a thickness $t_S$ of support substrate 11 is preferably 0.02 or more and 1 or less, more preferably 0.1 or more and 0.6 or less, and still more preferably 0.2 or more and 0.4 or less. Thickness $t_S$ of support substrate 11 and thickness $t_{III-N}$ of group III nitride film 13 can be measured through observation of a cross section of the film with an optical microscope and/or an SEM or with a digital indicator, or the like.

Thus, in order to suppress warp and cracks of group III nitride composite substrate 1 and a group III nitride layer grown on group III nitride film 13 and thereby increase the yield of group III nitride semiconductor devices, ratio $\alpha_{III-N}/\alpha_S$ of thermal expansion coefficient $\alpha_{III-N}$ of group III nitride film 13 to thermal expansion coefficient as of support substrate 11 is preferably 0.75 or more and 1.25 or less, and ratio $t_{III-N}/t_S$ of a thickness $t_{III-N}$ of the group III nitride film to thickness $t_S$ of support substrate 11 is preferably 0.02 or more and 1 or less. It is more preferable that ratio $\alpha_{III-N}/\alpha_S$ is 0.85 or more and 1.15 or less and ratio $t_{III-N}/t_S$ is 0.1 or more and 0.6 or less, and it is further preferable that ratio $\alpha_{III-N}/\alpha_S$ is 0.95 or more and 1.05 or less and ratio $t_{III-N}/t_S$ is 0.2 or more and 0.4 or less.

<Support Substrate>

Support substrate 11 included in group III nitride composite substrate 1 in the present reference embodiment is not particularly limited as long as support substrate 11 can support group III nitride film 13. In order to reduce the amount of use of the expensive group III nitride to thereby lower the cost, however, the support substrate is preferably a hetero-composition substrate whose chemical composition is different from that of the group III nitride.

As described above, group III nitride composite substrate 1 in the present reference embodiment preferably has a ratio $\alpha_{III-N}/\alpha_S$ of thermal expansion coefficient $\alpha_{III-N}$ of group III nitride film 13 to thermal expansion coefficient $\alpha_s$ of support substrate 11 of 0.75 or more and 1.25 or less.

Regarding group III nitride composite substrate 1 in the present reference embodiment, thermal conductivity $\lambda_S$ of support substrate 11 is preferably 3 $W \cdot m^{-1} \cdot K^{-1}$ or more and 280 $W \cdot m^{-1} \cdot K^{-1}$ or less, more preferably 5 $W \cdot m^{-1} \cdot K^{-1}$ or more and 210 $W \cdot m^{-1} \cdot K^{-1}$ or less, and still more preferably 10 $W \cdot m^{-1} \cdot K^{-1}$ or more and 120 $W \cdot m^{-1} \cdot K^{-1}$ or less. Here, thermal conductivity $\lambda_s$ of support substrate 1 can be measured by a laser flash method. Group III nitride composite substrate 1 having support substrate 11 with a thermal conductivity $\lambda_S$ of preferably 3 $W \cdot m^{-1} \cdot K^{-1}$ or more, more preferably 5 $W \cdot m^{-1} \cdot K^{-1}$ or more, and still more preferably 10 $W \cdot m^{-1} \cdot K^{-1}$ or more, can efficiently transmit heat from the main surface of the susceptor to main surface 13m of group III nitride film 13 of group III nitride composite substrate 1, when a group III nitride layer is grown. Group III nitride composite substrate 1 having support substrate 11 with a thermal conductivity Is of preferably 280 W·m$^{-1}$·K$^{-1}$ or less, more preferably 210 W·m$^{-1}$·K$^{-1}$ or less, still more preferably 120 W·m$^{-1}$·K$^{-1}$ or less, and particularly preferably 50 W·m$^{-1}$·K$^{-1}$ or less, can uniformly transmit heat from the main surface of the susceptor to the whole main surface of group III nitride film 13 of group III nitride composite substrate 1, when a group III nitride layer is grown. Support substrate 11 having a thermal conductivity $\lambda_S$ of 280 W·m$^{-1}$·K$^{-1}$ or less can more uniformly transmit the heat from the main surface of the susceptor to the whole main surface of group III nitride film 13 of group III nitride composite substrate 1 when a group III nitride layer is grown, as compared with the case where an SiC substrate having a thermal conductivity $\lambda_S$ of about 300 W·m$^{-1}$·K$^{-1}$ is used as the support substrate.

Regarding group III nitride composite substrate 1 in the present reference embodiment, support substrate 11 has a Young's modulus $E_S$ of preferably 150 GPa or more and 500 GPa or less, and more preferably 200 GPa or more and 350 GPa or less. Here, Young's modulus $E_S$ of support substrate 11 can be measured by a resonance method. Group III nitride composite substrate 1 having support substrate 11 with a Young's modulus $E_S$ of preferably 150 GPa or more and more preferably 200 GPa or more can suppress occurrence of warp to group III nitride composite substrate 1 and/or a group III nitride layer, when a group III nitride semiconductor device is formed by growing the group III nitride layer on the composite substrate. Group III nitride composite substrate 1 having support substrate 11 with a Young's modulus $E_S$ of preferably 500 GPa or less and more preferably 350 GPa or less can suppress occurrence of warp and/or cracks to group III nitride composite substrate 1 and/or a group III nitride layer, when a group III nitride semiconductor device is formed by growing the group III nitride layer on the composite substrate.

Support substrate 11 is not particularly limited. In view of the above-described respects, however, support substrate 11 preferably satisfies at least one of: ratio $\alpha_{III-N}/\alpha_S$ of thermal expansion coefficient $\alpha_{III-N}$ of group III nitride film 13 to thermal expansion coefficient $\alpha_S$ of support substrate 11 is 0.75 or more and 1.25 or less; support substrate 11 has a thermal conductivity $\lambda_S$ of 3 W·m$^{-1}$·K$^{-1}$ or more and 280 W·m$^{-1}$·K$^{-1}$ or less; and support substrate 11 has a Young's modulus $E_S$ of 150 GPa or more and 500 GPa or less. Support substrate 11 is preferably a substrate formed of mullite (3Al$_2$O$_3$·2SiO$_2$-2Al$_2$O$_3$·SiO$_2$), a substrate formed of mullite-YSZ (Yttria Stabilized Zirconia), a substrate formed of spinel (MgAl$_2$O$_4$), a substrate formed of a sintered body of an Al$_2$O$_3$—SiO$_2$-based composite oxide, and substrates formed respectively of sintered bodies of them to which oxide, carbonate or the like is added, a molybdenum (Mo) substrate, a tungsten (W) substrate, or the like. Here, preferred elements to be contained in the oxide and the carbonate are Ca, Mg, Sr, Ba, Al, Sc, Y, Ce, Pr, Si, Ti, Zr, V, Nb, Ta, Cr, Mn, Fe, Co, Ni, Cu, Zn, and the like.

Support substrate 11 may include any of single crystal, polycrystal, and amorphous material. It preferably includes polycrystal, since removal by grinding or etching when a device is to be formed is easy and the strength by which warp or cracks can be suppressed can be maintained.

<Joint Film>

Referring to FIG. 6, a joint film 12 which may be included in group III nitride composite substrate 1 in the present reference embodiment is not particularly limited as long as the joint film can join support substrate 11 and group III nitride film 13 to each other. Joint film 12, however, is preferably SiO$_2$ film, Si$_3$N$_4$ film, TiO$_2$ film, Ga$_2$O$_3$ film, or the like because these films have a high joining ability for joining support substrate 11 and group III nitride film 13 to each other.

<Group III Nitride Film>

Referring to FIG. 6, group III nitride film 13 in the present reference embodiment is a film formed of a group III nitride, specifically an In$_x$Al$_y$Ga$_{1-x-y}$N film (0≤x, 0≤y, x+y≤1) such as GaN film, AlN film, or the like.

In order to form a group ITT nitride semiconductor device having excellent characteristics, the thickness of group III nitride film 13 needs to be 10 µm or more, preferably 30 µm or more, more preferably 80 µm or more, and still more preferably 100 µm or more, as described above. Meanwhile, in order to reduce the amount of use of the expensive group III nitride, the thickness of group III nitride film 13 is 250 µm or less, preferably 200 µm or less, more preferably 180 µm or less, and particularly preferably 130 µm or less, as described above.

The crystal structure of group III nitride film 13 is preferably the wurtzite structure, since it enables semiconductor devices having excellent characteristics to be produced. The predetermined plane orientation to which the main surface of group III nitride film 13 is closest is not limited as long as it is suitable for a desired semiconductor device, and may be any of {0001}, {10-10}, {11-20}, {21-30}, {20-21}, {10-11}, {11-22}, and {22-43}, as well as plane orientations that are 15° or less off (displaced by an angle of 15° or less) from these plane orientations, respectively. It may also be any of the plane orientations opposite to the above-listed plane orientations, as well as plane orientations that are 15° or less off from these plane orientations, respectively. Namely, main surface 13m of group III nitride film 13 may be any of polar plane, nonpolar plane, and semipolar plane. Main surface 13m of group III nitride film 13 is preferably the {0001} plane and the opposite plane thereof, since such planes make it easy to increase the diameter, or any of {10-10} plane, {20-21} plane, and the opposite planes thereof, since such planes suppress blue shift of a light-emitting device to be produced.

In order to enhance the crystal quality of a group III nitride layer to be grown on group III nitride film 13 and enhance the characteristics of semiconductor devices to be formed, impurity metal atoms of main surface 13m of group III nitride film 13 are preferably 1×10$^{13}$ atoms/cm$^2$ or less, more preferably 3×10$^{12}$ atoms/cm$^2$ or less, still more preferably 1×10$^{12}$ atoms/cm$^2$ or less, and particularly preferably 1×10$^{11}$ atoms/cm$^2$ or less.

Group III nitride composite substrate 1 which includes support substrate 11 such as a substrate of mullite (3Al$_2$O$_3$·2SiO$_2$-2Al$_2$O$_3$·SiO$_2$), mullite-YSZ (Yttria Stabilized Zirconia), spinel (MgAl$_2$O$_4$), a sintered body of an Al$_2$O$_3$—SiO$_2$-based composite oxide, or the like is preferably subjected to cleaning that suppresses elution of metal atoms from support substrate 11, such as scrub cleaning with a surfactant and/or pure water, two-fluid cleaning, or megasonic cleaning (cleaning with ultrasonic waves in a megasonic frequency range of 500 kHz to 5 MHz), as well as cleaning of a single side (the single side is main surface 13m of group III nitride film 13) such as sheet-fed cleaning with low-concentration acid and/or alkali, for example, to thereby reduce the concentration of impurity metal atoms in main surface 13m of group III nitride film 13. A protective film can also be formed on the support substrate to suppress elution of metal atoms.

Regarding impurities other than impurity metal atoms in main surface 13m of group I nitride film 13, in order to enhance the crystal quality of a group III nitride layer grown on group III nitride film 13 and enhance the characteristics of a semiconductor device to be formed, the impurities are preferably Cl atoms of $2 \times 10^{14}$ atoms/cm$^2$ or less, preferably Si atoms of $9 \times 10^{13}$ atoms/cm$^2$ or less. The dislocation density of group III nitride film 13 is not particularly limited. In order to reduce leak current of the semiconductor device, the dislocation density is preferably $1 \times 10^8$ cm$^{-2}$ or less, and more preferably $1 \times 10^7$ cm$^{-2}$ or less. The carrier concentration of group III nitride film 13 is not particularly limited. In order to reduce the resistance of the semiconductor device, the carrier concentration is preferably $1 \times 10^{17}$ cm$^{-1}$ or more, and more preferably $1 \times 10^{18}$ cm$^{-3}$ or more.

Reference Embodiment II-2: Laminated Group III Nitride Composite Substrate

Referring to FIG. 8, a laminated group III nitride composite substrate 2 which is another reference embodiment of Reference Invention 11 includes group III nitride composite substrate 1 of Reference Embodiment II-1, and at least one group III nitride layer 20 disposed on group III-nitride-film 13-side main surface 13m of group III nitride composite substrate 1.

Laminated group III nitride composite substrate 2 in the present reference embodiment includes group III nitride composite substrate 1 having a small mean value ms and a small standard deviation $s_S$ of the RMS of support-substrate 11-side main surface 11n, as well as group III nitride layer 20 having a high crystal quality grown and thereby disposed on composite substrate 1. Therefore, semiconductor devices having excellent characteristics can be produced with a high yield.

In laminated group III nitride composite substrate 2 of the present reference embodiment, group III nitride layer 20 disposed on group III-nitride-film 13-side main surface 13m varies depending on the type of the semiconductor device to be produced.

Referring to FIG. 9, in the case where the semiconductor device to be produced is a light-emitting device, group III nitride layer 20 may be configured to include, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25.

Referring to FIG. 10, in the case where the semiconductor device to be produced is an HEMT (High Electron Mobility Transistor) which is an example of electronic devices, group III nitride layer 20 may be configured to include, for example, a GaN layer 26 and an Al$_{0.2}$Ga$_{0.8}$N layer 27. Referring to FIG. 11, in the case where the semiconductor device to be produced is an SBD (Schottky Barrier Diode) which is another example of electronic devices, group III nitride layer 20 may be configured to include, for example, an n$^+$-GaN layer 28 (having a carrier concentration for example of $2 \times 10^{18}$ cm$^{-3}$) and an n$^-$-GaN layer 29 (having a carrier concentration for example of $5 \times 10^{15}$ cm$^{-3}$).

Reference Embodiment II-3: Group III Nitride Semiconductor Device

Referring to FIGS. 9 to 11, a group III nitride semiconductor device 4 which is still another reference embodiment of Reference Invention II includes group III nitride film 13 in the group III nitride composite substrate of Reference Embodiment II-1, and at least one group III nitride layer 20 disposed on group III nitride film 13.

Group III nitride semiconductor device 4 of the present reference embodiment includes group III nitride film 13 in group III nitride composite substrate 1 having a small mean value ms and a small standard deviation $s_S$ of the RMS of support-substrate 11-side main surface 11n, as well as group III nitride layer 20 having a high crystal quality grown and thereby disposed on composite substrate 1. Therefore, semiconductor device 4 has excellent characteristics.

In group III nitride semiconductor device 4, group III nitride layer 20 varies depending on the type of group III nitride semiconductor device 4. Referring to FIG. 9, in the case where group III nitride semiconductor device 4 is a light-emitting device, group III nitride layer 20 may be configured to include, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25. Referring to FIG. 10, in the case where group III nitride semiconductor device 4 is an HEMT which is an example of electronic devices, group III nitride layer 20 may be configured to include, for example, a GaN layer 26 and an Al$_{0.2}$Ga$_{0.8}$N layer 27. Referring to FIG. 11, in the case where group III nitride semiconductor device 4 is an SBD which is another example of electronic devices, group III nitride layer 20 may be configured to include, for example, an n$^+$-GaN layer 28 (having a carrier concentration for example of $2 \times 10^{18}$ cm$^{-3}$) and an n$^-$-GaN layer 29 (having a carrier concentration for example of $5 \times 10^{15}$ cm$^{-3}$). Other examples of electronic devices may include PND (PN diode), transistor, and the like. The above-described semiconductor devices may either be a vertical type or be a lateral type.

Referring to FIG. 9, preferably group III nitride semiconductor device 4 further includes at least one of support substrate 11 and a device support substrate 40 for supporting group III nitride layer 20. Here, the shape of device support substrate 40 is not limited to the shape of a flat plate, and may be any as long as it supports group III nitride film 13 and group III nitride layer 20 so that group III nitride semiconductor device 4 can be formed.

Reference Embodiment III-4: Method for Manufacturing Group III Nitride Composite Substrate

Reference Embodiment II-4-1: A Method for Manufacturing Group III Nitride Composite Substrate Referring to FIGS. 12 and 13, a method for manufacturing a group III nitride composite substrate which is a further reference embodiment of Reference Invention II is a method for manufacturing group III nitride composite substrate 1 of Reference Embodiment II-1, including the steps of: forming a joined substrate 1L, 1LS having a diameter of 75 mm or more by bonding support substrate 11 and a group III nitride film donor substrate 13D to each other (FIG. 12 (A) to (C) and FIG. 13 (A) to (C)); forming group III nitride composite substrate 1 by cutting group III nitride film donor substrate 13D in joined substrate 1L, 1LS along a plane located inwardly at a predetermined distance from the bonded main surface of group III nitride film donor substrate 13D (FIG. 12 (D), FIG. 13 (D)); and adjusting the RMS of support-substrate 11-side main surface 11n by polishing support-substrate 11-side main surface 11n of group III nitride composite substrate 1 before, in, or after any one of the above-described steps.

The method for manufacturing group III nitride composite substrate 1 in the present reference embodiment can efficiently manufacture low-cost and large-diameter group III nitride composite substrate 1 having a thick group III nitride film and a small temperature variation on the main surface when a group III nitride layer is grown, to enable group III nitride semiconductor devices to be manufactured with a high yield.

Here, in the step of forming group III nitride composite substrate 1, the predetermined distance of the plane located inwardly from the bonded main surface of group III nitride film donor substrate 13D, for cutting group III nitride film donor substrate 13D along the plane at this distance, is determined depending on the thickness of group III nitride film 13 of group III nitride composite substrate 1 to be manufactured.

In addition, in the step of forming group III nitride composite substrate 1, group III nitride film donor substrate 13D is cut to form group III nitride film 13, and thereafter at least one of grinding, polishing, and etching can be performed on the main surface 13m of group III nitride film 13 opposite to bonded main surface 13n thereof, to thereby reduce the thickness of group III nitride film 13. In particular, in order to reduce the thickness variation (namely unevenness) of group III nitride film 13 which is formed by cutting group III nitride film donor substrate 13D, it is preferable to polish the main surface of group III nitride film 13 in group III nitride composite substrate 1 obtained by cutting. In order to reduce the thickness variation of group III nitride film 13, the method for polishing is preferably precision polishing based on CMP (Chemical Mechanical Polishing), chemical polishing, or the like.

In view of the above respects, the predetermined distance of the plane located inwardly from bonded main surface 13n of group III nitride film donor substrate 13D, for cutting group III nitride film donor substrate 13D along the plane at this distance, is preferably the sum determined by adding a polishing allowance, which is a portion to be removed away by polishing, to the thickness of group III nitride film 13 of group III nitride composite substrate 1 to be manufactured.

Regarding the method for manufacturing group III nitride composite substrate 1 of the present reference embodiment, group III nitride film donor substrate 13D is cut along a plane located inwardly at a predetermined distance from bonded main surface 13n of group III nitride film donor substrate 13D in joined substrate 1L, 1LS, and preferably at least one of grinding, polishing, and etching is performed on the main surface 13m which is opposite to bonded main surface 13n of group III nitride film 13, to thereby adjust the film thickness by reducing it. Accordingly, group III nitride composite substrate 1 including group III nitride film 13 having a desired thickness of 10 μm or more and 250 μm or less can be obtained.

As for the method for manufacturing group III nitride composite substrate 1 of the present reference embodiment, in order to improve the workability and the efficiency of cutting group III nitride film donor substrate 13D in the step of forming the group III nitride composite substrate, the thickness of group III nitride film donor substrate 13D to be used is preferably larger than 500 μm, more preferably 1 mm or more, and still more preferably 2 mm or more.

<Step of Forming Joined Substrate>

Referring to FIG. 12 (A) to (C) and FIG. 13 (A) to (C), the step of forming joined substrate 1L, 1LS includes the sub step of forming a joint film 12a on a main surface 11m of support substrate 11 (FIG. 12 (A), FIG. 13 (A)), the sub step of forming a joint film 12b on a main surface 13n of group III nitride film donor substrate 13D (FIG. 12 (B), FIG. 13 (B)), and the sub step of bonding a main surface 12am of joint film 12a formed on main surface 11m of support substrate 11 and a main surface 12bn of joint film 12b formed on main surface 13n of group III nitride film donor substrate 13D to each other (FIG. 12 (C), FIG. 13 (C)).

Referring to FIG. 12 (A) and FIG. 13 (A), in the sub step of forming joint film 12a on main surface 11m of support substrate 11, joint film 12a is to be integrated with joint film 12b, which will be described later herein, to form joint film 12, and is made of the same material as joint film 12. The method for forming joint film 12a is not particularly limited as long as the method is suitable for forming joint film 12a. In order to efficiently form joint film 12a of good quality, however, the method is preferably sputtering, CVD (Chemical Vapor Deposition), PLD (Pulsed Laser Deposition), MBE (Molecular Beam Epitaxy), electron-beam deposition, or the like.

CVD is particularly preferred since it enhances the quality of the joint film and enhances the film deposition rate. Among different CVD methods, P-CVD (Plasma-Chemical Vapor Deposition), PE-CVD (Plasma Enhanced-Chemical Vapor Deposition), and the like are more preferred since they enable the film to be deposited at a low temperature and at a high deposition rate, LP-CVD (Low Pressure-Chemical Vapor Deposition) and the like are still more preferred since they enhance the film quality and facilitate mass production, and AP-CVD (Atmospheric Pressure-Chemical Vapor Deposition) and the like are still more preferred since they enable the film to be deposited at a higher deposition rate and they are excellent in productivity.

Further, in order to improve the joint strength, annealing may be performed after joint films 12a, 12b are formed and before they are joined together. This annealing can degas joint films 12a, 12b to thereby densify joint films 12a, 12b.

Furthermore, in order to increase the joint strength between support substrate 11 and group III nitride film donor substrate 13D, main surface 12am of joint film 12a is preferably mirror-polished (into a mirror-finished surface having an RMS of 0.3 nm or less). The method for polishing main surface 12am of joint film 12a is not particularly limited. For example, CMP (Chemical Mechanical Polishing) or the like is used. In order to improve the cleanliness of the joint film for the purpose of increasing the joint strength, non-abrasive polishing may be performed, after CMP, with a solution containing no abrasive. In order to enhance the effect of removing the abrasive, non-abrasive polishing may be performed by means of an alkali such as KOH, TMAH (tetramethylammonium hydroxide), or an acid such as HCl, $HNO_3$, $H_2SO_4$. In addition, in order to improve the cleanliness of the joint film for the purpose of increasing the joint strength, scrub cleaning using sponge, brush, or the like may be performed. In addition, two-fluid cleaning, megasonic cleaning, ultrasonic cleaning, or the like may suitably be performed.

Referring to FIG. 12 (B) and FIG. 13 (B), in the sub step of forming joint film 12b on main surface 13n of group III nitride film donor substrate 13D, group III nitride film donor substrate 13D is a donor substrate which is to provide group III nitride film 13 in the subsequent sub step. The method for preparing this group III nitride film donor substrate 13D is not particularly limited. In order to produce group III nitride film donor substrate 13D of a high crystal quality, suitable methods are gas phase methods such as HVPE (Hydride Vapor Phase Epitaxy), MOVPE (Metal Organic Vapor Phase Epitaxy), MBE (Molecular Beam Epitaxy), and sublimation method, as well as liquid phase methods such as flux method, high nitrogen pressure solution method, ammonothermal method, and the like. Group III nitride film donor substrate 13D prepared in this way is not particularly limited. In order to provide group III nitride film 13 of a high crystal quality, the donor substrate preferably has a degree of crystal quality substantially identical to that of group III nitride film 13 to be provided.

The material and the method for forming joint film 12b as well as polishing of a main surface 12bn of joint film 12b are similar to the material and the method for forming the above-described joint film 12a as well as polishing of main surface 12am of joint film 12a.

Referring to FIG. 12 (C) and FIG. 13 (C), in the sub step of bonding main surface 12am of joint film 12a formed on main surface 11m of support substrate 11 and main surface 12bn of joint film 12b formed on main surface 13n of group III nitride film donor substrate 13D to each other, the method for bonding them together is not particularly limited. Suitable methods include: a direct bonding method according to which respective surfaces to be bonded to each other are cleaned, directly bonded together, and thereafter heated to approximately 600° C. to 1200° C. so that the joint films are joined together; a surface activated bonding method according to which the surfaces to be bonded to each other are cleaned, subjected to an activation treatment by means of plasma or ions, and thereafter joined together under a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that the joint films are joined together; a high vacuum bonding method according to which the surfaces to be bonded to each other are cleaned with a chemical solution and pure water, and thereafter joined together under a high vacuum atmosphere on the order of $10^{-6}$ Pa to $10^{-3}$ Pa, and the like. Any of the above-referenced bonding methods can increase the temperature to approximately 600° C. to 1200° C. after the joint films are joined together to thereby further increase the joint strength. In particular, the surface activated bonding method, the high pressure bonding method, and the high vacuum bonding method exhibit a higher effect of increasing the joint strength through the heating to approximately 600° C. to 1200° C. after the joint films are joined together.

The above bonding causes joint film 12a and joint film 12b to be joined together and thereby integrated into joint film 12. Support substrate 11 and group III nitride film donor substrate 13D are joined together with joint film 12 interposed therebetween to thereby form joined substrate 1L, 1LS.

Respective main surfaces 12am and 12bn of joint films 12a and 12b to be bonded to each other can thus be activated before being bonded to each other, to thereby increase the joint strength. Activation of main surfaces 12am and 12bn to be bonded is not particularly limited. The surfaces are preferably activated through plasma treatment, ion treatment, chemical treatment by means of a chemical solution, cleaning, CMP treatment, and the like, since they have a high activation effect.

<Step of Forming Group III Nitride Composite Substrate>

Referring to FIG. 12 (D) and FIG. 13 (D), in the step of forming group III nitride composite substrate 1, group III nitride film donor substrate 13D is cut along a plane located inwardly at a predetermined distance from bonded main surface 13n of group III nitride film donor substrate 13D in joined substrate 1L, 1LS. Accordingly, the donor substrate is separated into group III nitride film 13, which is joined to support substrate 11 with joint film 12 interposed therebetween, and a remaining group III nitride film donor substrate 13Dr. Thus, group III nitride composite substrate 1 in which support substrate 11 and group III nitride film 13 are bonded to each other with joint film 12 interposed therebetween is formed.

The method for cutting group III nitride film donor substrate 13D is not particularly limited, and may be any of the methods such as wire saw, blade saw, laser processing, electrical discharge processing, water jet, and the like.

As to cutting of group III nitride film donor substrate 13D by means of a wire saw, it is preferable to use a fixed-abrasive wire in order to flatly cut group III nitride film donor substrate 13D of a large diameter, and it is preferable to use a thin wire in order to reduce a cutting allowance, which is a portion to be removed away through cutting. For reduction of the cutting allowance, loose-abrasive processing is preferred.

In addition, as to cutting of group III nitride film donor substrate 13D by means of a wire saw, it is preferable to increase the tension of the wire and increase the wire speed, in order to reduce bending of the wire caused by the cut resistance and thereby improve the thickness precision and the flatness. For this purpose, a high-rigidity wire saw apparatus is preferred.

It is also preferable to swing the wire and vibrate group III nitride film donor substrate 13D in synchronization therewith, in order to reduce the cut resistance and thereby improve the thickness precision and the flatness. Specifically, the cutting resistance can be reduced in the following manner. In the case where the wire saw is positioned at a right angle or an angle close thereto relative to the direction in which group III nitride film donor substrate 13D is cut, group III nitride film donor substrate 13D is moved along the direction in which it is cut. In the case where the wire saw is located at an angle further from the right angle relative to the direction in which group III nitride film donor substrate 13D is cut, group III nitride film donor substrate 13D is moved in the direction opposite to the direction in which it is cut.

The group III nitride such as GaN is more brittle and more prone to crack as compared with sapphire, SiC, and the like, and therefore cannot be cut appropriately by a cutting method similar to that used for sapphire and SiC. It is therefore necessary for cutting of the group III nitride to further reduce the cut resistance. In order to reduce the cut resistance and thereby enhance the thickness precision and the flatness, it is preferable that the resistance coefficient R (unit: N) is within an appropriate range, specifically a range of 4000 N or more and 5000 N or less. The resistance coefficient R (N) is represented by $R=(\eta \times Q \times V)/(L \times P \times n)$ where n (unit: Pa·s) is the viscosity of a machining fluid for slicing, Q (unit: m³/s) is the flow rate of the machining fluid, V (unit: m/s) is the wire speed, L (unit: m) is the maximum cut length, P (unit: m/s) is the cut speed, and n is the number of workpieces that are cut simultaneously.

For group III nitride composite substrate 1 obtained through the cutting, respective main surfaces of group III nitride film 13 and support substrate 11 can be polished so that a desired thickness and the uniformity of them are obtained. Specifically, in order to bond group III nitride composite substrate 1 to a polishing apparatus in a polishing process, group III nitride composite substrate 1 can be secured by means of suction or a back pad. Group III nitride composite substrate 1 may also be bonded first to a holding plate and then bonded to a polishing apparatus. For this bonding, mechanical pressurization such as vacuum chuck, air back pressurization, weight or the like can be used to reduce inclination and correct warp. Group III nitride composite substrate 1 may also be secured by means of suction. Group III nitride composite substrate 1 can uniformly be bonded to the polishing apparatus to reduce the thickness variation after polishing. In addition, the shape of bonding can be controlled depending on the shape of a polishing surface plate and the shape of the pad to thereby reduce the thickness variation after polishing.

As seen from the above, regarding the method for manufacturing a group III nitride composite substrate in the present reference embodiment, it is preferable to polish main surface 13m of group III nitride film 13 in group III nitride composite substrate 1 obtained through cutting, in order to reduce the thickness variation of group III nitride film 13 in group III nitride composite substrate 1, keep the crystal quality high by eliminating a damaged layer caused by cutting of group III nitride film 13, and smooth the main surface.

Accordingly, regarding the method for manufacturing a group III nitride composite substrate in the present reference embodiment, the predetermined distance of the plane located inwardly from bonded main surface 13n of group III nitride film donor substrate 13D, for cutting group III nitride film donor substrate 13D in joined substrate 1L, 1LS along the plane at this distance, is preferably the sum determined by adding a polishing allowance, which is a portion to be removed away by polishing, to the thickness of group III nitride film 13 of group III nitride composite substrate 1 to be manufactured. Here, the polishing allowance is not particularly limited, but preferably 10 μm or more, more preferably 20 μm or more, and still more preferably 30 μm or more, in order to reduce the thickness variation and remove a damaged layer. Meanwhile, in order to reduce the material loss of group III nitride film donor substrate 13D, the polishing allowance is preferably 100 μm or less, more preferably 80 μm or less, and still more preferably 60 μm or less.

Referring also to FIGS. 12 (D) and (B) and FIGS. 13 (D) and (B), the remaining group III nitride film donor substrate 13Dr may have its main surface polished so that it can be used repeatedly.

<Use of Support-Incorporated Group III Nitride Film Donor Substrate>

Referring to FIG. 13 (B) to (D), a support-incorporated group III nitride film donor substrate 5D in which a group III nitride film donor substrate support 15 is bonded to group III nitride film donor substrate 13D can be used to produce a group III nitride composite substrate 1 in a similar manner to the above. Support-incorporated group III nitride film donor substrate 5D has group III nitride film donor substrate support 15 which supports group III nitride film donor substrate 13D, and can therefore be used repeatedly even if group III nitride film donor substrate 13D becomes thinner to such an extent that substrate 13D cannot stand by itself.

Regarding support-incorporated group III nitride film donor substrate 5D, the form in which group III nitride film donor substrate support 15 and group III nitride film donor substrate 13D are bonded to each other is not particularly limited. In order to increase the joint strength of the bonding, however, it is preferable to dispose a joint film 14 therebetween. Group III nitride film donor substrate support 15 is also not particularly limited. In order to increase the support strength and prevent occurrence of crack and warp, however, it is preferable that support 15 is formed of a material having similar physical properties to support substrate 11. While joint film 14 is not particularly limited, it may preferably be any of $SiO_2$ film, $Si_3N_4$ film, $TiO_2$ film, $Ga_2O_3$ film, and the like, since these films provide a good joint to group III nitride film donor substrate support 15 and group III nitride film donor substrate 13D.

<Step of Adjusting Root Mean Square Roughness of Support-Substrate-Side Main Surface of Group III Nitride Composite Substrate>

The method for manufacturing group IT nitride composite substrate 1 in the present reference embodiment includes the step of adjusting the RMS of support-substrate 11-side main surface 11n by polishing support-substrate 11-side main surface 11n of group III nitride composite substrate 1 before, in, or after any one of the above-described steps. Through the step of adjusting the RMS of support-substrate 11-side main surface 11n of group III nitride composite substrate 1, support-substrate 11-side main surface 11n can have a mean value ms of the RMS of 0.3 nm or more and 20 nm or less, and support-substrate 11-side main surface 111n can have a ratio $s_S/m_S$ of standard deviation $s_S$ of the RMS to mean value ms of the RMS of 0.005 or more and 0.4 or less.

Mean value ms of the RMS of support-substrate 11-side main surface 1 in can be controlled by means of the viscosity of the abrasive, the size of abrasive grains, the material and the surface shape of a surface plate and a polishing pad, and the polishing conditions. In order to make smaller mean value ms of the RMS, oil-base abrasives are more preferred relative to water-base abrasives, a higher viscosity of the abrasive is more preferred, a smaller abrasive grain size is more preferred, and a soft surface plate and a soft polishing pad are more preferred. As to the surface shape of the surface plate and the polishing pad, a shape having grooves formed therein for sludge removal is preferred. The grooves for sludge removal refer to grooves having a relatively wide width and a relatively wide pitch that are formed for removing away sludge and/or aggregated abrasive grains on the polishing interface. The polishing conditions are preferably a low pressure and a low circumferential velocity.

In order to control the ratio $s_S/m_S$ of standard deviation $s_S$ of the RMS to mean value ms of the RMS of support-substrate 11-side main surface 11n, a viscosity η (unit: mPa·S) and a flow rate Q (unit: $m^3/s$) of a polishing solution, and an area S (unit: $m^2$), a polishing pressure P (unit: kPa), and a circumferential velocity V (unit: m/s) of a surface plate are used so that an action coefficient FE (unit: $m^2/s$) defined by a formula: FE=η×Q×V/S×P is in a predetermined range, specifically $4\times10^{-17}$ or more and $1\times10^{-6}$ or less. As to the surface shape of the surface plate and the polishing pad, a shape having grooves formed for making the abrasive uniform is preferred. The grooves for making the abrasive uniform refer to grooves having a relatively narrow width and a relatively narrow pitch that are formed for uniformly holding the abrasive in a central portion of the substrate.

<Step of Adjusting RMS of Group III-nitride-Film-Side Main Surface of Group III Nitride Composite Substrate>

The method for manufacturing group III nitride composite substrate 1 in the present reference embodiment includes the step of adjusting the RMS of group III-nitride-film 13-side main surface 13m by polishing group III-nitride-film 13-side main surface 13m of group III nitride composite substrate 1 after the step of forming the group III nitride composite substrate. Through the step of adjusting the RMS of group III-nitride-film 13-side main surface 13m of group III nitride composite substrate 1, group III-nitride-film 13-side main surface 13m can have a mean value $m_{III-N}$ of the RMS of 0.15 nm or more and 3 nm or less, and group III-nitride-film 13-side main surface 13m can have a ratio $s_{III-N}/m_{III-N}$ of standard deviation $s_{III-N}$ of the RMS to mean value $m_{III-N}$ of the RMS of 0.008 or more and 0.5 or less.

Here, mean value $m_{III-N}$ of the RMS of group III-nitride-film 13-side main surface 13m can be controlled by means of the viscosity of the abrasive, the size of abrasive grains, the material and the surface shape of a surface plate and a polishing pad, and the polishing conditions. In order to make smaller mean value $m_{III-N}$ of the RMS, a higher viscosity of the abrasive is more preferred, a smaller abrasive grain size is more preferred, and a soft surface plate and a soft polishing pad are more preferred.

As to the surface shape of the surface plate and the polishing pad, a shape having grooves formed therein for sludge removal is preferred. The polishing conditions are preferably a low pressure and a low circumferential velocity.

For the ratio $s_{III-N}/m_{III-N}$ of standard deviation $s_{III-N}$ of the RMS to mean value $m_{III-N}$ of the RMS of group III-nitride-film 13-side main surface 13m, a viscosity η (unit: mPa·S) and a flow rate Q (unit: m$^3$/s) of a polishing solution, and an area S (unit: m$^2$), a polishing pressure P (unit: kPa), and a circumferential velocity V (unit: m/s) of a surface plate are used so that an action coefficient FE (unit: m$^2$/s) defined by a formula: FE=η×Q×V/S×P is in a predetermined range, specifically $4×10^{-14}$ or more and $1×10^{-13}$ or less. As to the surface shape of the surface plate and the polishing pad, a shape having grooves formed for making the abrasive uniform is preferred.

Reference Embodiment I-4-2: Another Method for Manufacturing Group III Nitride Composite Substrate Referring to FIG. 14, a method for manufacturing a group III nitride composite substrate, which is a still further reference embodiment of Reference Invention 11, is a method for manufacturing group III nitride composite substrate 1 of the Reference Embodiment II-1, including the steps of: forming joined substrate 1L having a diameter of 75 mm or more by bonding support substrate 11 and group III nitride film donor substrate 13D to each other (FIG. 14 (A) to (C)); forming group III nitride composite substrate 1 by performing at least one of grinding, polishing, and etching on a main surface of group III nitride film donor substrate 13D of joined substrate 1L, the main surface being located opposite to the bonded main surface of group III nitride film donor substrate 13D (FIG. 14 (D)); and adjusting the RMS of the support-substrate-side main surface by polishing the support-substrate-side main surface of the group III nitride composite substrate before, in, or after any one of the above-described steps.

The method for manufacturing group III nitride composite substrate 1 in the present reference embodiment can efficiently manufacture low-cost and large-diameter group III nitride composite substrate 1 having a thick group III nitride film and a small temperature variation on the main surface when a group III nitride layer is grown, to enable group III nitride semiconductor devices to be manufactured with a high yield.

Regarding the method for manufacturing group III nitride composite substrate 1 in the present reference embodiment, at least one of grinding, polishing, and etching is performed on the main surface opposite to the bonded main surface of group III nitride film donor substrate 13D to thereby adjust the thickness by reducing it, and accordingly, group III nitride composite substrate 1 including group III nitride film 13 having a desired thickness of 10 μm or more and 250 μm less can be obtained.

According to the method for manufacturing group III nitride composite substrate 1 in the present reference embodiment, in the step of forming a group III nitride composite substrate, at least one of grinding, polishing, and etching is performed on the main surface opposite to the bonded main surface of the group III nitride film donor substrate. Therefore, in order to reduce the material loss of group III nitride film donor substrate 13D, the thickness of group III nitride film donor substrate 13D to be used is preferably 500 μm or less, and more preferably 400 μm or less.

<Step of Forming Joined Substrate>

Referring to FIG. 14 (A) to (C), the step of forming joined substrate 1L includes, similarly to the method for manufacturing a group III nitride composite substrate in Reference Embodiment II-4-1, the sub step of forming joint film 12a on main surface 11m of support substrate 11 (FIG. 14 (A)), the sub step of forming joint film 12b on main surface 13n of group III nitride film donor substrate 13D (FIG. 14 (B)), and the sub step of bonding main surface 12am of joint film 12a formed on main surface 11m of support substrate 11 and main surface 12bn of joint film 12b formed on main surface 13n of group III nitride film donor substrate 13D to each other (FIG. 14 (C)).

Here, the sub step of forming joint film 12a on main surface 11m of support substrate 11 as shown in FIG. 14 (A) is similar to the sub step of forming joint film 12a on main surface 11m of support substrate 11 as shown in FIG. 12 (A). The sub step of forming joint film 12b on main surface 13n of group III nitride film donor substrate 13D as shown in FIG. 14 (B) is similar to the sub step of forming joint film 12b on main surface 13n of group III nitride film donor substrate 13D as shown in FIG. 12 (B). The sub step of bonding main surface 12am of joint film 12a formed on main surface 11m of support substrate 11 and main surface 12bn of joint film 12b formed on main surface 13n of group III nitride film donor substrate 13D to each other as shown in FIG. 14 (C) is similar to the sub step of bonding main surface 12am of joint film 12a formed on main surface 11m of support substrate 11 and main surface 12bn of joint film 12b formed on main surface 13n of group III nitride film donor substrate 13D to each other as shown in FIG. 12 (C). Therefore, the description of them will not be repeated.

<Step of Forming Group III Nitride Composite Substrate>

Referring to FIG. 14 (D), in the step of forming group III nitride composite substrate 1, at least one of grinding, polishing, and etching is performed on main surface 13m opposite to bonded main surface 13n of group III nitride film donor substrate 13D in joined substrate 1L, to thereby form group III nitride film 13 with its thickness reduced, from group III nitride film donor substrate 13D, and accordingly form group III nitride composite substrate 1 in which support substrate 11 and group III nitride film 13 are bonded together with joint film 12 interposed therebetween.

The method for grinding group III nitride film donor substrate 13D is not particularly limited, and may be grinding by means of one of a grinding wheel and abrasive grains. The method for polishing group III nitride film donor substrate 13D is not particularly limited, and may be rough polishing such as mechanical polishing, precision polishing such as CMP and chemical polishing, or the like. The method for etching group III nitride film donor substrate 13D is not particularly limited, and may be wet etching using a chemical solution, dry etching such as RIE (Reactive Ion Etching), or the like.

In order to reduce the thickness variation of group III nitride film 13 to be formed, it is preferable to polish main surface 13m of group III nitride film 13 of group III nitride composite substrate 1 obtained through at least one of grinding and etching. The reduction of the thickness by at least one of grinding, polishing, and etching is preferably 10 µm or more, more preferably 20 µm or more, and still more preferably 30 µm or more, in order to reduce the thickness variation and remove a damaged layer. Meanwhile, the reduction of the thickness by at least one of grinding, polishing, and etching is preferably 100 µm or less, more preferably 80 µm or less, and still more preferably 60 µm or less, in order to reduce the material loss of group III nitride film donor substrate 13D.

<Step of Adjusting RMS of Support-Substrate-Side Main Surface of Group III Nitride Composite Substrate>

The method for manufacturing group III nitride composite substrate 1 in the present reference embodiment includes the step of adjusting the RMS of support-substrate 11-side main surface 11n by polishing support-substrate 11-side main surface 11n of group III nitride composite substrate 1 before, in, or after any one of the above-described steps. Through the step of adjusting the RMS of support-substrate 11-side main surface 11n of group III nitride composite substrate 1, support-substrate 11-side main surface 11n can have a mean value ms of the RMS of 0.3 nm or more and 20 nm or less, and support-substrate 11-side main surface 11n can have a ratio $s_S/m_S$ of standard deviation $s_S$ of the RMS to mean value ms of the RMS of 0.005 or more and 0.4 or less.

Here, the control of mean value ms of the RMS of support-substrate 11-side main surface 111n and ratio $s_S/m_S$ of standard deviation $s_S$ of the RMS to mean value ms of the RMS of support-substrate 11-side main surface 11n is similar to that of the method for manufacturing group III nitride composite substrate 1 in Reference Embodiment II-4-1.

<Step of Adjusting RMS of Group III-Nitride-Film-Side Main Surface of Group III Nitride Composite Substrate>

The method for manufacturing group III nitride composite substrate 1 in the present reference embodiment preferably includes the step of adjusting the RMS of group III-nitride-film 13-side main surface 13m by polishing group III-nitride-film 13-side main surface 13m of group III nitride composite substrate 1 after the step of forming the group III nitride composite substrate. Through the step of adjusting the RMS of group III-nitride-film 13-side main surface 13m of group III nitride composite substrate 1, group III-nitride-film 13-side main surface 13m can have a mean value $m_{III-N}$ of the RMS of 0.15 nm or more and 3 nm or less, and group III-nitride-film 13-side main surface 13m can have a ratio $s_{III-N}/m_{III-N}$ of standard deviation $s_{III-N}$ of the RMS to mean value mm-N of the RMS of 0.008 or more and 0.5 or less.

Here, the control of mean value $m_{III-N}$ of the RMS of group III-nitride-film 13-side main surface 13m and ratio $s_{III-N}/m_{III-N}$ of standard deviation $s_{III-N}$ of the RMS to mean value $m_{III-N}$ of the RMS of group III-nitride-film 13-side main surface 13m is similar to that of the method for manufacturing group III nitride composite substrate 1 in Reference Embodiment II-4-1.

Reference Embodiment II-5: Method for Manufacturing Group III Nitride Semiconductor Device Referring to FIG. 15, a method for manufacturing a group III nitride semiconductor device, which is a still further reference embodiment of Reference Invention II, includes the steps of: preparing group III nitride composite substrate 1 of Reference Embodiment II-1; and growing at least one group III nitride layer 20 on group III-nitride-film 13-side main surface 13m of group III nitride composite substrate 1 (FIG. 15 (A)). The method for manufacturing a group III nitride semiconductor device in the present reference embodiment can be used to manufacture group III nitride semiconductor devices having excellent characteristics with a high yield, since the group III nitride layer is grown on group III-nitride-film 13-side main surface 13m having a small temperature variation on main surface 13m when the group III nitride layer is grown.

The method for manufacturing a group III nitride semiconductor device in the present reference embodiment may further include the step of removing support substrate 11 from group III nitride composite substrate 1 (FIG. 15 (C)) after the step of growing group III nitride layer 20 (FIG. 15 (A)). This step enables group III nitride semiconductor devices of a variety of forms to be manufactured.

Further, the method for manufacturing a group III nitride semiconductor device in the present reference embodiment may further include the step of bonding device support substrate 40 onto group III nitride layer 20 (FIG. 15 (B)) after the step of growing the group III nitride layer (FIG. 15 (A)) and before the step of removing the support substrate (FIG. 15 (C)). This step enables group III nitride semiconductor devices having a high mechanical strength and excellent characteristics and supported by device support substrate 40 to be manufactured with a high yield.

The method for manufacturing a group III nitride semiconductor device in the present reference embodiment may specifically be performed through the following steps.

<Step of Growing Group III Nitride Layer>

Referring to FIG. 15 (A), in the step of growing at least one group III nitride layer 20 on group III-nitride-film 13-side main surface 13m of group III nitride composite substrate 1, suitable methods for growing group III nitride layer 20 are gas phase methods such as MOVPE, MBE, HVPE, and sublimation method, as well as liquid phase methods such as flux method, in order to epitaxially grow group III nitride layer 20 having a high crystal quality, and a particularly suitable method is MOVPE.

The structure of group III nitride layer 20 varies depending on the type of group III nitride semiconductor device 4. In the case where group III nitride semiconductor device 4 is a light-emitting device, group III nitride layer 20 may be configured by successively growing, on group III nitride film 13, for example, an n-GaN layer 21, an n-$In_{0.05}Ga_{0.95}N$ layer 22, an active layer 23 having a multiple quantum well structure, a p-$Al_{0.09}Ga_{0.91}N$ layer 24, and a p-GaN layer 25.

In this way, at least one group III nitride layer 20 is grown on group III-nitride-film 13-side main surface 13m of group III nitride composite substrate 1, and accordingly laminated group III nitride composite substrate 2 is obtained.

<Step of Bonding Device Support Substrate>

Referring to FIG. 15 (B), the step of bonding device support substrate 40 onto group III nitride layer 20 is performed by forming a first electrode 30 and a pad electrode 33 on group III nitride layer 20 of laminated group III nitride composite substrate 2, forming a pad electrode 43 and a joint metal film 44 on device support substrate 40, and bonding joint metal film 44 to pad electrode 33. Through these steps, laminated substrate 3 is obtained. As device support substrate 40, Si substrate, CuW substrate, Mo substrate, or the like is used.

<Step of Removing Support Substrate>

Referring to FIG. 15 (C), the step of removing support substrate 11 from group III nitride composite substrate 1 is performed by removing support substrate 11 of group III nitride composite substrate 1 from laminated substrate 3. In the case where group III nitride composite substrate 1 includes joint film 12 interposed between support substrate 11 and group III nitride film 13, joint film 12 can also be removed.

The method for removing support substrate 11 and joint film 12 is not particularly limited, and suitable methods to be used are grinding, etching, and the like. For example, support substrate 11 formed of a material which is low in hardness, strength, and wear resistance, and is likely to be ground off, can be removed by at least one of grinding and polishing, in order to reduce the manufacturing cost. Support substrate 11 formed of a material which can be dissolved in a chemical solution such as acid solution or alkali solution, can be removed through etching with a chemical solution, since it requires low manufacturing cost. As support substrate 11, a support substrate formed of a polycrystalline material such as ceramic material is more preferred as compared with a support substrate formed of a monocrystalline material such as sapphire, SiC, group III nitride (GaN for example), or the like, since the support substrate 11 of the polycrystalline material is easier to remove.

It should be noted that, regarding manufacturing of a group III nitride semiconductor device using a free-standing group III nitride substrate, a rear surface of the free-standing group III nitride substrate (the rear surface refers to a main surface opposite to a main surface on which a group III nitride layer is formed, and this definition is applied as well hereinafter) is subjected to grinding or the like for the purpose of reducing the thickness of the device. In contrast, regarding manufacturing of a group III nitride semiconductor device using a group III nitride composite substrate, it is easy to remove the support substrate by etching, grinding, or the like for the purpose of reducing the thickness of the device, and therefore, the cost of manufacturing the group III nitride semiconductor device can be reduced.

<Step of Forming Electrode>

Referring to FIG. 15 (D), on group III nitride film 13 which has been exposed after removal of support substrate 11 and joint film 12 from laminated substrate 3, a second electrode 50 is formed and, on device support substrate 40, a device support substrate electrode 45 is formed.

<<Reference Invention III>>

Reference Invention III relates to a group III nitride composite substrate that can be manufactured at a low cost, has a large diameter, and has a group III nitride film with an appropriate thickness and a high crystal quality, a method for manufacturing the group III nitride composite substrate, a laminated group III nitride composite substrate, as well as a group III nitride semiconductor device and a method for manufacturing the same.

[Background Art Regarding Reference Invention III]

Group III nitrides such as GaN have superior semiconductor properties and are therefore used as materials suitable for semiconductor devices.

For example, Japanese Patent Laying-Open No. 2009-126722 discloses a free-standing group III nitride substrate to be used as a substrate for a semiconductor device.

The free-standing group III nitride substrate has a diameter of 25 mm or more and 160 mm or less and a thickness of 100 $\mu$m or more and 1000 $\mu$m or less. It discloses, as a specific example thereof, a free-standing GaN substrate having a diameter of 10 mm and a thickness of 400 $\mu$m.

Japanese Patent Laying-Open No. 2008-010766 discloses a GaN-thin-film-bonded substrate to be used as a substrate for manufacturing a semiconductor device.

The GaN-thin-film-bonded substrate includes a heterogeneous substrate whose chemical composition is different from that of GaN, and a GaN thin film having a thickness of 0.1 $\mu$m or more and 100 $\mu$m or less and bonded to the heterogeneous substrate. It discloses, as a specific example thereof, a GaN-thin-film-bonded substrate having a diameter of 50.8 mm and including a sapphire substrate and a GaN thin film having a thickness of 0.1 $\mu$m or 100 $\mu$m and bonded to the sapphire substrate.

Problems to be Solved by Reference Invention III

The free-standing group III nitride substrate disclosed in Japanese Patent Laying-Open No. 2009-126722, however, is very expensive. This is chiefly for the reason that the group III nitride does not form a liquid phase and therefore a liquid-phase growth method which is a low-cost manufacturing method cannot be employed, namely it is inevitable to employ a vapor-phase growth method of a low yield. In addition, the group III nitride is a low-fracture-toughness material which is highly susceptible to fracture. Due to this, it is difficult to increase the diameter of the substrate. Further, if the thickness of the substrate is reduced to a thickness on the order of 250 $\mu$m for the purpose of reducing the manufacturing cost, the substrate is susceptible to warp. Accordingly, in the step of growing an epitaxial layer on the substrate, the crystal quality may be deteriorated or substrate peeling may occur, which reduces the yield of manufacture of semiconductor devices. It has therefore been difficult to produce a high-value-added semiconductor device.

In contrast, for the bonded substrate as disclosed in Japanese Patent Laying-Open No. 2008-010766, the amount of use of the expensive group III nitride can be reduced, and therefore, the cost of manufacturing a semiconductor device can be reduced.

In order to obtain excellent characteristics of a semiconductor device, it is preferable that the thickness of a group III nitride film which is to serve as a base is preferably 10 $\mu$m or more. In the conventional bonded substrate as disclosed in Japanese Patent Laying-Open No. 2008-010766, however, the thickness of the group III nitride film is limited to approximately 1 $\mu$m, for the following reasons. For the bonded substrate as disclosed in Japanese Patent Laying-Open No. 2008-010766, the heterogeneous substrate and the GaN bulk crystal are bonded together, and thereafter the ion implantation method is used to divide the GaN bulk crystal to thereby form a GaN thin film. On this method, however, a certain limitation in terms of the depth of ion implantation is imposed. Therefore, if a group III nitride film of a 10 $\mu$m or more is produced, the depth to which ions are implanted varies, and consequently the thickness of the group III nitride film varies. In this case, an adequate quality cannot be ensured. Namely, for the conventional bonded substrate as disclosed in Japanese Patent Laying-Open No. 2008-010766, adequate characteristics of semiconductor devices and an adequate yield of manufacture of semiconductor devices cannot be achieved if the thickness of the group III nitride film is 10 $\mu$m or more.

In the case where a wire saw for example is used instead of the ion implantation method for the conventional bonded substrate as disclosed in Japanese Patent Laying-Open No. 2008-010766 to cut and separate the group III nitride film and thereby obtain the bonded substrate having a group III nitride film of 10 $\mu$m or more, the substrate is susceptible to warp or cracks. In this case as well, it is difficult to grow an epitaxial layer of a high quality on the group III nitride film.

As seen from the above, it has been considerably difficult for the conventional known technique to obtain a group III nitride composite substrate which includes a group III nitride film having an appropriate thickness range, and enables excellent semiconductor device characteristics to be achieved, while the amount of use of the expensive group III nitride is reduced.

An object of the present invention is to provide a group III nitride composite substrate that can be manufactured at a low cost, and has a large diameter and has a group III nitride film with an appropriate thickness and a high crystal quality, a method for manufacturing the group III nitride composite substrate, a laminated group III nitride composite substrate, as well as a group III nitride semiconductor device and a method for manufacturing the same.

Solution to the Problems

According to an aspect, Reference Invention III provides a group III nitride composite substrate with a diameter of 75 mm or more including a support substrate and a group III nitride film having a thickness of 10 µm or more and 250 µm or less that are bonded to each other, the group III nitride composite substrate includes a joint film interposed between the support substrate and the group III nitride film and joining the support substrate and the group III nitride film to each other, and the joint film has a thickness variation of 2% or more and 40% or less.

According to another aspect, Reference Invention III provides a group III nitride composite substrate with a diameter of 75 mm or more including a support substrate and a group III nitride film having a thickness of 10 µm or more and 250 µm or less that are bonded to each other, the group III nitride composite substrate includes a joint film interposed between the support substrate and the group III nitride film and joining the support substrate and the group III nitride film to each other, a shear joint strength between the support substrate and the group III nitride film is 4 MPa or more and 40 MPa or less, and a ratio of a joint area between the support substrate and the group III nitride film is 60% or more and 99% or less.

Regarding the group III nitride composite substrates according to these aspects of Reference Invention III, a ratio $\alpha_{III-N}/\alpha_S$ of a thermal expansion coefficient $\alpha_{III-N}$ of the group III nitride film to a thermal expansion coefficient $\alpha_S$ of the support substrate may be 0.75 or more and 1.25 or less, and a ratio $t_{III-N}/t_S$ of a thickness $t_{III-N}$ of the group III nitride film to a thickness $t_S$ of the support substrate may be 0.02 or more and 1 or less.

The support substrate may have a thermal conductivity $\lambda_S$ of 3 W·m$^{-1}$·K$^{-1}$ or more and 280 W·m$^{-1}$·K$^{-1}$ or less.

The support substrate may have a Young's modulus $E_S$ of 150 GPa or more and 500 GPa or less.

Further, the diameter of the group III nitride composite substrate may be 125 mm or more and 300 mm or less.

According to still another aspect, Reference Invention III provides a laminated group III nitride composite substrate including the group III nitride composite substrate according to the above aspect, and at least one group III nitride layer disposed on the group III-nitride-film-side main surface of the group III nitride composite substrate.

According to a further aspect, Reference Invention III provides a group III nitride semiconductor device including the group III nitride film in the group III nitride composite substrate according to the above aspect, and at least one group III nitride layer disposed on the group III nitride film.

According to a still further aspect, Reference Invention III provides a method for manufacturing a group III nitride composite substrate according to the above aspect, including the steps of: forming a joined substrate with a diameter of 75 mm or more by bonding a support substrate and a group III nitride film donor substrate to each other; and forming the group III nitride composite substrate by cutting the group III nitride film donor substrate in the joined substrate along a plane located inwardly at a predetermined distance from a bonded main surface of the group III nitride film donor substrate.

According to a still further aspect, Reference Invention III provides a method for manufacturing a group III nitride composite substrate according to the above aspect, including the steps of: forming a joined substrate with a diameter of 75 mm or more by bonding a support substrate and a group III nitride film donor substrate to each other; and forming the group III nitride composite substrate by performing at least one of grinding, polishing, and etching on a main surface of the group III nitride film donor substrate in the joined substrate, the main surface being opposite to a bonded main surface of the group III nitride film donor substrate.

According to a still further aspect, Reference Invention III provides a method for manufacturing a group III nitride semiconductor device, including the steps of: preparing a group III nitride composite substrate; and growing at least one group III nitride layer on a group III nitride film of the group III nitride composite substrate.

The method for manufacturing a group III nitride semiconductor device according to this aspect of Reference Invention III may further include the steps of: bonding a device support substrate onto the group III nitride layer; and removing the support substrate from the group III nitride composite substrate.

[Effects of Reference Invention III]

Reference Invention III can provide a group III nitride composite substrate that can be manufactured at a low cost, and has a large diameter and has a group III nitride film with an appropriate thickness and a high crystal quality, a method for manufacturing the group III nitride composite substrate, a laminated group III nitride composite substrate, as well as a group III nitride semiconductor device and a method for manufacturing the same.

Reference Embodiment III-1: Group III Nitride Composite Substrate

Referring to FIG. 6, a group III nitride composite substrate 1 which is a reference embodiment of Reference Invention III is a substrate with a diameter of 75 mm or more including a support substrate 11 and a group III nitride film 13 having a thickness of 10 µm or more and 250 µm or less that are bonded to each other. Group III nitride composite substrate 1 includes a joint film 12 interposed between support substrate 11 and group III nitride film 13 and joining support substrate 11 and group III nitride film 13 to each other. The group III nitride composite substrate is characterized in that joint film 12 has a thickness variation of 2% or more and 40% or less.

Group III nitride composite substrate 1 in the present reference embodiment is also characterized in that a shear joint strength between support substrate 1 and group III nitride film 13 joined to each other by joint film 12 is 4 MPa or more and 40 MPa or less, and a ratio of a joint area between support substrate 11 and group III nitride film 13 is 60% or more and 99% or less.

In contrast to the conventional free-standing group III nitride substrate, the present reference embodiment provides a composite substrate in which group III nitride film 13 is joined to support substrate 11. This feature can be employed to reduce the thickness of the expensive group III nitride film and reduce the cost of the semiconductor device.

Further, also in contrast to the conventional bonded substrate, the present reference embodiment provides the substrate having a large diameter of 75 mm or more and group III nitride film 13 having a thickness of 10 μm or more and 250 μm or less.

Accordingly, the group III nitride composite substrate of the present reference embodiment can be used to obtain significantly excellent semiconductor device characteristics.

The above-described features can be obtained from that the thickness variation of joint film 12 is 2% or more and 40% or less, or that the shear joint strength between support substrate 11 and group III nitride film 13 is 4 MPa or more and 40 MPa or less, and the ratio of the joint area between support substrate 11 and group III nitride film 13 is 60% or more and 99% or less.

The group III nitride composite substrate includes joint film 12 having its thickness variation which is controlled so that the thickness variation falls within a specific range. Therefore, even in the case where group III nitride film 13 of a substrate having a large diameter of 75 mm or more is cut with a wire saw or the like to separate a part thereof and thereby reduce the thickness thereof to 10 μm or more and 250 μm or less, the heat from a susceptor on which the substrate is mounted is transmitted uniformly in the film in a semiconductor device process of forming an epitaxial layer on group III nitride film 13. Thus, the epitaxial layer having a good thickness variation and a high crystal quality can be obtained, and accordingly, the yield of manufacture of semiconductor devices can also be increased.

The joint strength and the ratio of the joint area between support substrate 11 and group III nitride film 13 are controlled so that they fall within specific ranges respectively. Therefore, the stress applied to the joint film is alleviated and occurrence of warp can be suppressed. Accordingly, the yield of manufacture of semiconductor devices can be increased.

Group III nitride composite substrate 1 in the present reference embodiment can have at least one of: the above-described feature of the thickness variation of joint film 12; and the above-described feature of the joint strength and the ratio of the joint area between support substrate 11 and group III nitride film 13, to thereby increase the yield of manufacture of semiconductor devices and improve the characteristics of the semiconductor devices. It is particularly preferable that group III nitride composite substrate 1 has both the above-described features, since respective effects of the features are synergistically produced and thus the effects of the present invention can further be enhanced.

<Diameter of Group III Nitride Composite Substrate>

In order to produce a greater number of semiconductor device chips from one composite substrate, the diameter of group III nitride composite substrate 1 is 75 mm or more, and is preferably 100 mm or more, more preferably 125 mm or more, and still more preferably 150 mm or more. Meanwhile, in order to reduce the warp of the composite substrate and increase the yield of semiconductor devices, the diameter of group III nitride composite substrate 1 is preferably 300 mm or less, and more preferably 200 mm or less.

In the following, each of the parts constituting group III nitride composite substrate 1 in the present reference embodiment will be described.

<Joint Film>

Joint film 12 in the present reference embodiment has a function of absorbing and alleviating unevenness of a joint surface of support substrate 11 and a joint surface of group III nitride film 13 to thereby increase the joint strength between support substrate 11 and group III nitride film 13.

Joint film 12 is not particularly limited as long as joint film 12 can join support substrate 11 and group III nitride film 13 to each other. Joint film 12 is preferably SiO$_2$ film, Si$_3$N$_4$ film, TiO$_2$ film, Ga$_2$O$_3$ film, or the like, because these films have a high joining ability for joining support substrate 11 and group III nitride film 13 to each other. While the average thickness of joint film 12 is not particularly limited, the average thickness thereof may for example be approximately 100 nm to 4 μm.

<Thickness Variation of Joint Film>

In the present reference embodiment, the thickness variation of joint film 12 is 2% or more and 40% or less. "Thickness variation" is herein an indicator of the uniformity of the thickness of joint film 12 and calculated in accordance with the following formula, from "maximum value $t_{max}$ of the thickness" and "minimum value $t_{min}$ of the thickness" among the thicknesses measured in the entire main surface of joint film 12.

$$\text{thickness variation (\%)} = \{(t_{max}-t_{min})/(t_{max}+t_{min})\} \times 100 \quad \text{Formula:}$$

Here, as a reference surface for the thickness of the joint film, main surface 11m of support substrate 11 may be used. The measurement points where the thickness is measured are preferably at least 13 points, and the measurement points adjacent to each other are preferably located at substantially regular intervals.

The thickness of the joint film can be measured with a conventionally known optical-interference film thickness meter, step meter, or the like. The thickness can also be measured through observation of a cross section perpendicular to the main surface of joint film 12 with a scanning electron microscope (SEM) or the like.

If the thickness variation is less than 2%, heat conduction from the susceptor on which the substrate is mounted is nonuniform when an epitaxial layer is grown. As a result, the substrate is warped in a concave form and has a large difference between the temperature of a central portion and the temperature of a peripheral portion. In this case, the epitaxial layer with a high quality cannot be grown, the yield of manufacture of semiconductor devices is low, and the characteristics of the semiconductor devices are deteriorated. If the thickness variation is more than 40%, there are a greater number of regions where the joint film is thinner and regions where the joint film is absent (namely non-joined regions). In this case as well, an epitaxial layer with a high quality cannot be grown and the yield of manufacture of semiconductor devices is low. In view of the above, the thickness variation of the joint film in the present reference embodiment is 2% or more and 40% or less. The thickness variation falling within this range produces superior effects that the temperature is distributed uniformly over the whole composite substrate during epitaxial growth and a high-quality epitaxial layer having a high crystal quality can be grown. The thickness variation is more preferably 5% or more and 25% or less, and still more preferably 7% or more and 16% or less.

The thickness variation falling within these ranges enables the uniformity of the thickness of the joint film to be further improved and the crystal quality of the epitaxial layer formed on group III nitride film 13 to be further enhanced.

The thickness variation of the joint film can be controlled so that it falls within a desired range, by appropriately adjusting the conditions of chemical mechanical polishing (hereinafter also referred to as "CMP") performed on the surface of the joint film, for example. Examples of the conditions may be the material for the abrasive, the linear velocity of polishing, the material for the polishing pad, and the like.

<Shear Joint Strength>

In the present reference embodiment, the shear joint strength between support substrate 11 and group III nitride film 13 joined together by joint film 12 is 4 MPa or more and 40 MPa or less. In the case where the shear joint strength falls in this range, substrate peeling does not occur and the warp of the substrate is alleviated in a process of manufacturing a semiconductor device. Therefore, the yield of manufacture of semiconductor devices is remarkably increased. The shear joint strength is more preferably 10 MPa or more and 30 MPa or less. This is suitable since such a shear strength tends to further increase the effect of alleviating the warp of the substrate. If the shear joint strength is less than 4 MPa, the joint strength is not sufficient. In this case, substrate peeling occurs during epitaxial growth, because of deformation of the substrate due to heat conduction from the susceptor on which the substrate is mounted, resulting in a lower yield of manufacture of semiconductor devices. If the shear joint strength is more than 40 MPa, a greater stress is applied to joint film 12 and the warp of the substrate tends to be increased, resulting in a lower yield of manufacture of semiconductor devices.

In the present reference embodiment, the shear joint strength can be measured with a die shear tester, tensile tester, or the like, by a method in accordance with JIS K 6850 "Determination of tensile lap-shear strength of rigid-to-rigid bonded assemblies." Specifically, a rectangular composite substrate (6 mm in length×8 mm in width) is prepared as a measurement sample, and the composite substrate is placed flat and secured on a sample stage of a tester so that the support substrate faces downward. After this, a test jig of 9 mm in width is used to apply a load in the direction parallel to the joint surface between the support substrate and the group III nitride film (namely the shear direction), and a maximum shear load at the time when the joint surface is broken is measured. Then, the maximum shear load is divided by the area of the joint surface ($4.8 \times 10^{-5}$ $m^2$), to thereby calculate the shear joint strength.

As a method for achieving a shear joint strength of 4 MPa or more and 40 MPa or less between support substrate 11 and group III nitride film 13, a method according to which an annealing treatment is performed before and after support substrate 11 and group III nitride film 13 are joined to each other, for example, can appropriately be used. Namely, a suitable method is as follows. After a joint film is formed on each of one main surface of support substrate 11 and one main surface of group III nitride film 13, each of support substrate 11 and group III nitride film 13 is subjected to an annealing treatment. Annealed support substrate 11 and annealed group III nitride film 13 are joined to each other with the joint film interposed therebetween, and thereafter subjected again to the annealing treatment.

Regarding conditions for the annealing treatment, the annealing treatment is performed preferably in a nitrogen atmosphere at 400° C. or more for one hour or more, more preferably in a nitrogen atmosphere at 600° C. or more for one hour or more, and particularly preferably in a nitrogen atmosphere at 800° C. or more for one hour or more.

In terms of the quality of the joint film, the temperature condition for the annealing treatment is preferably 1200° C. or less, and the time for the treatment is preferably 48 hours or less.

The shear joint strength can also be controlled by means of the surface state (namely the surface roughness) before the joint film is joined.

<Ratio of Joint Area>

Group III nitride composite substrate 1 in the present reference embodiment needs to have a shear joint strength between support substrate 11 and group III nitride film 13 of 4 MPa or more and 40 MPa or less, and a ratio of the joint area between support substrate 11 and group III nitride film 13 of 60% or more and 99% or less as described above. The relation between support substrate 11 and group III nitride film 13 is thus defined in terms of these two respects, and therefore, group III nitride composite substrate 1 in the present reference embodiment enables a warp of the substrate during epitaxial growth to be remarkably reduced and enables a high-flatness and high-quality epitaxial layer to be grown. Accordingly, the composite substrate has superior effects that the frequency of occurrence of substrate peeling is extremely low in the process of manufacturing a semiconductor device and the yield of manufacture of semiconductor devices is high. In the case where the ratio of the joint area is less than 60%, the frequency of occurrence of substrate peeling is high in the process of epitaxial growth and the process of manufacturing a semiconductor device, resulting in a lower yield of manufacture of semiconductor devices. In the case where the ratio of the joint area is higher than 99%, a greater stress is applied to joint film 12 and a warp is likely to occur to the substrate. Therefore, in this case as well, the yield of manufacture of semiconductor devices is lower.

In the present reference embodiment, "ratio of joint area" is a value determined by calculating the sum of areas detected as joint defects (void or peeling) through observation of joint film 12 which is a joint surface between support substrate 11 and group III nitride film 13 with an ultrasonic microscope, dividing the sum by the area of main surface 11*m* of support substrate 11, and multiplying the quotient by 100. The ratio of the joint area is more preferably 70% or more and 90% or less, and still more preferably 80% or more and 86% or less. In the case where the ratio of the joint area falls in these ranges, the stress applied to joint film 12 is significantly alleviated, and the yield of manufacture of semiconductor devices can further be increased.

As a method for achieving a ratio of the joint area of 60% or more and 99% or less, a method according to which the surface of joint film 12 is cleaned, for example, can be used. Specifically, a method can appropriately be used according to which dirt on the surface of joint film 12 is removed by CMP and thereafter the surface is further subjected to ultrasonic cleaning with water. As a more preferred method, a method can be used according to which dirt on the surface of joint film 12 is removed by CMP and thereafter dirt is further removed by non-abrasive polishing cleaning with a chemical solution such as an aqueous solution of potassium hydroxide (KOH) or water. Both the ultrasonic cleaning and the non-abrasive polishing cleaning, for example, may also be used.

The ratio of the joint area can more precisely be controlled by the thickness variation of joint film 12 defined as 2% or more and 40% or less. Namely, it is particularly preferable that the thickness variation of joint film 12 is 2% or more and 40% or less and the ratio of the joint area is 60% or more and 99% or less.

<Support Substrate>

Support substrate 11 is not particularly limited as long as support substrate 11 can support group III nitride film 13. In order to reduce the amount of use of the expensive group III nitride to thereby lower the cost, however, the support substrate is preferably a hetero-composition substrate whose chemical composition is different from that of the group III nitride. Support substrate 11 may be either transparent or opaque, and one of the transparent one and the opaque one can appropriately be selected depending on a semiconductor device to be used.

As the material forming support substrate 11, a conventionally known ceramic material, semiconductor material, metal material, polycrystalline material, monocrystalline material, or the like can be used. For example, the material for support substrate 11 may be a sintered body material of aluminum nitride (AlN), spinel ($MgAl_2O_4$), mullite ($3Al_2O_3 \cdot 2SiO_2$-$2Al_2O_3 \cdot SiO_2$), alumina ($Al_2O_3$), graphite, or the like, a monocrystalline material such as AlN, sapphire, or the like, a metal material such as molybdenum (Mo), tungsten (W), or the like, or an alloy material such as copper-tungsten (Cu—W), or the like.

Support substrate 11 may be exposed to a high-temperature corrosive gas such as ammonia gas during epitaxial growth for example, and is therefore preferably a substrate resistant to corrosion. Thus, the substrate may be covered with any of various surface protection coatings for improving the corrosion resistance of its surface.

<Thermal Conductivity of Support Substrate>

Support substrate 11 has a thermal conductivity $\lambda_S$ of preferably 3 $W \cdot m^{-1} \cdot K^{-1}$ or more and 280 $W \cdot m^{-1} \cdot K^{-1}$ or less, more preferably 5 $W \cdot m^{-1} \cdot K^{-1}$ or more and 210 $W \cdot m^{-1} \cdot K^{-1}$ or less, and still more preferably 10 $W \cdot m^{-1} \cdot K^{-1}$ or more and 120 $W \cdot m^{-1} \cdot K^{-1}$ or less. Thermal conductivity s of support substrate 11 can be measured by a laser flash method. Group III nitride composite substrate 1 having support substrate 11 with a thermal conductivity $\lambda_S$ of preferably 3 $W \cdot m^{-1} \cdot K^{-1}$ or more, more preferably 5 $W \cdot m^{-1} \cdot K^{-1}$ or more, and still more preferably 10 $W \cdot m^{-1} \cdot K^{-1}$ or more, can efficiently transmit heat from the main surface of the susceptor to main surface 13m of group III nitride film 13 of group III nitride composite substrate 1, when a group III nitride layer is grown. Group III nitride composite substrate 1 having support substrate 11 with a thermal conductivity $\lambda_S$ of preferably 280 $W \cdot m^{-1} \cdot K^{-1}$ or less, more preferably 210 $W \cdot m^{-1} \cdot K^{-1}$ or less, and still more preferably 120 $W \cdot m^{-1} \cdot K^{-1}$ or less, can uniformly transmit heat from the main surface of the susceptor to the whole main surface of group III nitride film 13 of group III nitride composite substrate 1, when a group III nitride layer is grown. Support substrate 11 having a thermal conductivity $\lambda_S$ of 280 $W \cdot m^{-1} \cdot K^{-1}$ or less can more uniformly transmit the heat from the main surface of the susceptor to the whole main surface of group III nitride film 13 of group III nitride composite substrate 1 when a group III nitride layer is grown, as compared with the case where an SiC substrate having a thermal conductivity $\lambda_S$ of about 300 $W \cdot m^{-1} \cdot K^{-1}$ is used as the support substrate. It should be noted that the thermal conductivity of support substrate 11 may be different from the thermal conductivity of group III nitride film 13.

<Thermal Expansion Coefficient of Support Substrate>

Support substrate 11 is preferably a substrate which is not prone to crack. The thermal expansion coefficient of support substrate 11 is preferably close to the thermal expansion coefficient of group III nitride film 13. Support substrate 11 having such properties is appropriate, since it makes group III nitride composite substrate 1 less prone to crack even when group III nitride composite substrate 1 is heated in the process of epitaxial growth, the process of manufacturing a semiconductor device, or the like.

Specifically, a ratio $\alpha_{III-N}/\alpha_S$ of a thermal expansion coefficient $\alpha_{III-N}$ of group III nitride film 13 to a thermal expansion coefficient $\alpha_S$ of support substrate 11 is preferably 0.75 or more and 1.25 or less, more preferably 0.8 or more and 1.2 or less, still more preferably 0.9 or more and 1.1 or less, and particularly preferably 0.95 or more and 1.05 or less.

<Thickness of Support Substrate 11>

While the thickness itself of support substrate 11 is not particularly limited, it is preferable that the thickness of support substrate 11 and the thickness of group III nitride film 13 satisfy the following relation, in order to suppress warp, crack, or the like of group III nitride film 13 when it is heated. Namely, a ratio $t_{III-N}/t_S$ of a thickness $t_{III-N}$ of group III nitride film 13 to a thickness $t_S$ of support substrate 11 is preferably 0.02 or more and 1 or less. The fact that the ratio $\alpha_{III-N}/\alpha_S$ of the thermal expansion coefficient is 0.75 or more and 1.25 or less and the ratio $t_{III-N}/t_S$ of the thickness is 0.02 or more and 1 or less makes it possible to significantly reduce occurrences of defective pieces due to warp or crack of group III nitride film 13, on various occasions such as a process of manufacturing the composite substrate, a process of epitaxial growth, and a process of manufacturing a semiconductor device. The ratio $t_{III-N}/t_S$ of the thickness is more preferably 0.07 or more and 0.5 or less.

<Young's Modulus of Support Substrate>

Regarding Young's modulus $E_S$ of support substrate 11, $E_S$ is preferably 150 GPa or more and 500 GPa or less, in order to suppress occurrence of warp when group III nitride composite substrate 1 is heated. If $E_S$ is less than 150 GPa, warp tends to be likely to occur during heating. If $E_S$ is more than 500 GPa, breakage or crack tends to be likely to occur during heating. These $E_s$ are therefore not preferred. $E_S$ is more preferably in a range of 200 GPa or more and 350 GPa or less. While the Young's modulus of support substrate 11 may be different from that of group III nitride film 13, preferably Young's modulus of support substrate 11 is substantially identical to that of group III nitride film 13.

Regarding the material which forms support substrate 11, support substrate 11 may be formed of a material having its thermal expansion coefficient and its Young's modulus that are close to those of group III nitride film 13, such as a substrate formed of mullite ($3Al_2O_3 \cdot 2SiO_2$-$2Al_2O_3 \cdot SiO_2$), a substrate formed of mullite-YSZ (Yttria Stabilized Zirconia), a substrate formed of spinel ($MgAl_2O_4$), a substrate formed of a sintered body of an $Al_2O_3$—$SiO_2$-based composite oxide, and substrates formed respectively of sintered bodies of them to which oxide, nitride, carbonate or the like is added, a molybdenum (Mo) substrate, a tungsten (W) substrate, and the like. Here, preferred elements to be contained in the oxide, the nitride, and the carbonate are Ca, Mg, Sr, Ba, Al, Sc, Y, Ce, Pr, Si, Ti, Zr, V, Nb, Ta, Cr, Mn, Fe, Co, Ni, Cu, Zn, and the like.

<Group III Nitride Film>

Group III nitride film 13 is a film formed of a group III nitride, specifically an $In_xAl_yGa_{1-x-y}N$ film ($0 \leq x$, $0 \leq y$, $x+y \leq 1$) such as GaN film, AlN film, or the like.

The thickness of group III nitride film 13 is 10 μm or more and 250 μm or less. In the case where the thickness is less than 10 μm, adequate semiconductor device characteristics tend to fail to be obtained. If the thickness is more than 250

μm, the amount of use of the expensive group III nitride is larger, which makes it difficult to produce a high-value-added semiconductor device. In order to enhance the semiconductor device characteristics, the thickness of group III nitride film 13 is preferably 30 μm or more, more preferably 80 μm or more, and particularly preferably 100 μm or more. In order to produce a high-value-added semiconductor device, the thickness is preferably 200 μm or less, more preferably 180 μm or less, and particularly preferably 130 μm or less.

The crystal structure of group III nitride film 13 is preferably the wurtzite structure, since it enables semiconductor devices having excellent characteristics to be produced. The predetermined plane orientation to which the main surface of group III nitride film 13 is closest is not limited as long as it is suitable for a desired semiconductor device, and may be any of {0001}, {10-10}, {11-20}, {21-30}, {20-21}, {10-11}, {11-22}, and {22-43}, as well as plane orientations that are displaced by an angle of 15° or less (off by 15° or less) from these plane orientations, respectively. It may also be any of the plane orientations opposite to the above-listed plane orientations, as well as plane orientations that are 15° or less off from these plane orientations, respectively. Namely, main surface 13m of group III nitride film 13 may be any of polar plane, nonpolar plane, and semipolar plane. Main surface 13m of group III nitride film 13 is preferably the {0001} plane and the opposite plane thereof, since such planes make it easy to increase the diameter, or any of {10-10} plane, {20-21} plane, and the opposite planes thereof, since such planes suppress blue shift of a light-emitting device to be produced.

Impurity metal atoms in main surface 13m of group III nitride film 13 are preferably $3 \times 10^{12}$ atoms/cm$^2$ or less, more preferably $1 \times 10^{12}$ atoms/cm$^2$ or less, and still more preferably $1 \times 10^{11}$ atoms/cm$^2$ or less, in order to enhance the crystal quality of a group III nitride layer grown on group III nitride film 13 and enhance the characteristics of a semiconductor device to be formed. Group III nitride composite substrate 1 which includes support substrate 11 such as a substrate of mullite ($3Al_2O_3 \cdot 2SiO_2$-$2Al_2O_3 \cdot SiO_2$), mullite-YSZ (Yttria Stabilized Zirconia), spinel ($MgAl_2O_4$), a sintered body of an $Al_2O_3$—$SiO_2$-based composite oxide, or the like is preferably subjected to cleaning that suppresses elution of metal atoms from support substrate 11, such as scrub cleaning with a surfactant and pure water, two-fluid cleaning, megasonic cleaning, sheet-fed cleaning of a single side with low-concentration acid or alkali, for example, to thereby reduce the concentration of impurity metal atoms in main surface 13m of group III nitride film 13.

Regarding other impurities in main surface 13m of group III nitride film 13, in order to enhance the crystal quality of a group III nitride layer grown on group III nitride film 13 and enhance the characteristics of a semiconductor device to be formed, the impurities are preferably Cl atoms of $2 \times 10^{14}$ atoms/cm$^2$ or less, Si atoms of $9 \times 10^{13}$ atoms/cm$^2$ or less. The dislocation density of group III nitride film 13 is not particularly limited. In order to reduce leak current of the semiconductor device, the dislocation density is preferably $1 \times 10^8$ cm$^2$ or less. The carrier concentration of group III nitride film 13 is not particularly limited. In order to reduce the resistance of the semiconductor device, the carrier concentration is preferably $1 \times 10^{17}$ cm$^{-3}$ or more.

The above-described group III nitride composite substrate can be manufactured through the following manufacturing method. Namely, the group III nitride composite substrate obtained through the following manufacturing method can be manufactured at a low cost, has a large diameter, and has a group III nitride film with an appropriate thickness and a high crystal quality.

Reference Embodiment III-2: Method for Manufacturing Group III Nitride Composite Substrate Referring now to FIGS. 12 and 14, a method for manufacturing group III nitride composite substrate 1, which is another reference embodiment of Reference Invention III, is not particularly limited as long as it is a method according to which group III nitride film 13 is disposed on support-substrate 11-side main surface 11n, and may be any of the following first and second methods.

The first method is a method as shown in FIG. 12 according to which a group III nitride film donor substrate 13D is bonded to main surface 1m of support substrate 11, and thereafter group III nitride film donor substrate 13D is cut along a plane located at a predetermined depth from the bonded surface, to thereby form group III nitride film 13 on main surface 11m of support substrate 11.

The second method is a method as shown in FIG. 14 according to which a group III nitride film donor substrate 13D is bonded to main surface 11m of support substrate 11, and thereafter at least one of grinding, polishing, and etching is performed on a main surface of group III nitride film donor substrate 13D, which is a main surface opposite to the bonded surface thereof, to adjust the thickness by reducing the thickness, and thereby form group III nitride film 13 on main surface 11m of support substrate 1.

Regarding the above-described first and second methods, the method for bonding group III nitride film donor substrate 13D to support substrate 11 may be a method according to which group III nitride film donor substrate 13D is bonded to main surface 11m of support substrate 11 with a joint film 12 interposed therebetween (see FIGS. 12 and 14), or the like.

FIGS. 12 and 14 illustrate a method according to which a joint film 12a is formed on support substrate 11, a joint film 12b is formed on group III nitride film 13, and these joint films are bonded to each other. Alternatively, for example, joint film 12 may be formed on only support substrate 11 and this joint film may be bonded to group III nitride film 13.

<First Method: Cutting Method>

The method for manufacturing a composite substrate by the first method illustrated in FIG. 12 is not particularly limited. In order to efficiently manufacture the composite substrate, the method preferably includes the steps of: forming a joined substrate 1L by bonding support substrate 11 and group III nitride film donor substrate 13D to each other (FIG. 12 (A) to (C)); and cutting group III nitride film donor substrate 13D along a plane located inwardly at a predetermined depth from main surface 13n, which is the bonded surface, of group III nitride film donor substrate 13D of joined substrate 1L (FIG. 12 (D)).

Support substrate 11 is not particularly limited, and can be obtained for example by mixing, at a predetermined molar ratio, MO, (x is an arbitrary positive real number) which is an oxide containing a metal element M, $Al_2O_3$ which is an oxide containing Al, and $SiO_2$ which is an oxide containing Si, sintering the resultant mixture, cutting a substrate of a predetermined size from the resultant sintered body, and polishing a main surface of this substrate.

Group III nitride film donor substrate 13D is a donor substrate which provides group III nitride film 13 by being separated in a later step. As a method for forming such group III nitride film donor substrate 13D, MOCVD (Metal Organic Chemical Vapor Deposition), sputtering, MBE (Molecular Beam Epitaxy), PLD (Pulsed Laser Deposition), HVPE (Hydride Vapor Phase Epitaxy), sublimation method, flux method, high nitrogen pressure solution method, or the like can appropriately be used.

As shown in FIG. 12 (A) to (C), the step of forming joined substrate 1L by bonding support substrate 11 and group III nitride film donor substrate 13D to each other includes: the sub step of forming joint film 12a on main surface 11m of support substrate 11 (FIG. 12 (A)); the sub step of forming joint film 12b on main surface 13n of group III nitride film donor substrate 13D (FIG. 12 (B)); and the sub step of bonding joint film 12a formed on main surface 11m of support substrate 11 and joint film 12b formed on main surface 13n of group III nitride film donor substrate 13D to each other (FIG. 12 (C)). These sub steps are performed to join and thereby integrate joint film 12a and joint film 12b bonded to each other into joint film 12, and support substrate 11 and group III nitride film donor substrate 13D are joined to each other with joint film 12 interposed therebetween to thereby form joined substrate 1L.

Here, the method for forming joint films 12a, 12b is not particularly limited. In order to reduce the cost of forming the films, sputtering, vapor deposition, CVD (Chemical Vapor Deposition), or the like is appropriately performed. The method for bonding joint film 12a and joint film 12b to each other is not particularly limited, and suitable methods include: a direct bonding method according to which respective surfaces to be bonded to each other are cleaned, directly bonded together, and thereafter heated to approximately 600° C. to 1200° C. so that the joint films are joined together; a surface activated bonding method according to which the surfaces to be bonded to each other are cleaned, subjected to an activation treatment by means of plasma or ions, and thereafter joined together under a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that the joint films are joined together; a high vacuum bonding method according to which the surfaces to be bonded to each other are cleaned with a chemical solution and pure water, and thereafter joined together under a high vacuum atmosphere on the order of $10^{-6}$ Pa to $10^{-3}$ Pa, and the like. Any of the above-referenced bonding methods can increase the temperature to approximately 600° C. to 1200° C. after the joint films are joined together to thereby further increase the joint strength. In particular, the surface activated bonding method, the high pressure bonding method, and the high vacuum bonding method exhibit a higher effect of increasing the joint strength through the heating to approximately 600° C. to 1200° C. after the joint films are joined together.

The step of cutting along a plane located inwardly at a predetermined depth from main surface 13n, which is the bonded surface, of group III nitride film donor substrate 13D of joined substrate 1L shown in FIG. 12 (D) is performed by cutting group III nitride film donor substrate 13D along a plane located inwardly at a predetermined depth from main surface 13n, which is the bonded surface, of group III nitride film donor substrate 13D of joined substrate 1L. The method for cutting group III nitride film donor substrate 13D is not particularly limited, and wire saw, inner circumferential blade, outer circumferential blade, or the like is appropriately used.

In this way, joined substrate 1L is cut along a plane located inwardly at a predetermined depth from main surface 13n which is the bonded surface of group III nitride film donor substrate 13D, and accordingly group III nitride composite substrate 1 including support substrate 11, joint film 12 disposed on main surface 11m of support substrate 11, and group III nitride film 13 disposed on the main surface of joint film 12 is obtained.

<Second Method: Grinding, Polishing, and Etching Methods>

The method for manufacturing a composite substrate by the second method as illustrated in FIG. 14 is not particularly limited. In order to efficiently manufacture the composite substrate, the method preferably includes the steps of: forming joined substrate 1L by bonding support substrate 11 and group III nitride film donor substrate 13D to each other (FIG. 14 (A) to (C)); and performing at least one of grinding, polishing, and etching on main surface 13m located opposite to main surface 13n which is the bonded surface of group III nitride film donor substrate 13D of joined substrate 1L (FIG. 14 (D)).

As shown in FIG. 14 (A) to (C), the step of forming joined substrate 1L by bonding support substrate 11 and group III nitride film donor substrate 13D to each other includes: the sub step of forming joint film 12a on main surface 11m of support substrate 11 (FIG. 14 (A)); the sub step of forming joint film 12b on main surface 13n of group III nitride film donor substrate 13D (FIG. 14 (B)); and the sub step of bonding joint film 12a formed on main surface 11m of support substrate 11 and joint film 12b formed on main surface 13n of group III nitride film donor substrate 13D to each other (FIG. 14 (C)). These sub steps are performed to join and thereby integrate joint film 12a and joint film 12b bonded to each other into joint film 12, and support substrate 11 and group III nitride film donor substrate 13D are joined to each other with joint film 12 interposed therebetween to thereby form joined substrate 1L.

The method for forming group III nitride film donor substrate 13D is similar to the method for forming group III nitride film donor substrate 13D according to the first method as described above. The method for forming joint films 12a, 12b is also similar to the method for forming joint films 12a, 12b in the method for manufacturing a composite substrate according to the first method. The method for bonding support substrate 11 and group III nitride film donor substrate 13D to each other is also similar to the method for bonding support substrate 11 and group III nitride film donor substrate 13D to each other in the method for manufacturing a composite substrate according to the first method as described above.

As shown in FIG. 14 (D), by the step of performing at least one of grinding, polishing, and etching on main surface 13m opposite to main surface 13n which is the bonded surface of group III nitride film donor substrate 13D of joined substrate 1L, the thickness of group III nitride film donor substrate 13D is reduced to thereby form group III nitride film 13 having a desired thickness. Accordingly, group III nitride composite substrate 1 including support substrate 11, joint film 12 disposed on main surface 11m of support substrate 11, and group III nitride film 13 disposed on the main surface of joint film 12 is obtained.

Here, the method for grinding group III nitride film donor substrate 13D is not particularly limited, and may be grinding with a grinding wheel (surface grinding), shot blast, or the like. The method for polishing group III nitride film donor substrate 13D is not particularly limited, and may be mechanical polishing, chemical mechanical polishing, or the like. The method for etching group III nitride film donor substrate 13D is not particularly limited, and may be wet etching with a chemical solution, dry etching such as RIE (Reaction Ion Etching), or the like.

In this way, group III nitride composite substrate 1 can be manufactured.

Group III nitride composite substrate 1 manufactured in the above-described way has excellent effects that a high-quality epitaxial layer can be grown on the composite substrate and the yield of manufacture of semiconductor devices is improved.

Reference Embodiment III-3: Laminated Group III Nitride Composite Substrate

Referring now to FIG. 8, a laminated group III nitride composite substrate 2 which is still another embodiment of Reference Invention III will be described.

Laminated group III nitride composite substrate 2 includes group III nitride composite substrate 1 of Reference Embodiment III-1, and at least one group III nitride layer 20 disposed on group III-nitride-film 13-side main surface 13m of group III nitride composite substrate 1.

Thus, group III nitride layer 20 is disposed on group III-nitride-film 13-side main surface 13m of group III nitride composite substrate 1 and therefore, group III nitride layer 20 can be grown as a high-quality epitaxial layer.

In laminated group III nitride composite substrate 2 of the present reference embodiment, group III nitride layer 20 disposed on group III-nitride-film 13-side main surface 13m varies depending on the type of the semiconductor device to be produced. Referring to FIG. 9, in the case where the semiconductor device to be produced is a light-emitting device, group III nitride layer 20 may be configured to include, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25. Referring to FIG. 10, in the case where the semiconductor device to be produced is an HEMT (High Electron Mobility Transistor) which is an example of electronic devices, the group III nitride layer may be configured to include, for example, a GaN layer 26 and an Al$_{0.2}$Ga$_{0.8}$N layer 27. Referring to FIG. 11, in the case where the semiconductor device to be produced is an SBD (Schottky Barrier Diode) which is another example of electronic devices, the group III nitride layer may be configured to include, for example, an n$^{+}$-GaN layer 28 (having a carrier concentration for example of 2×10$^{18}$ cm$^{-3}$) and an n$^{-}$-GaN layer 29 (having a carrier concentration for example of 5×10$^{15}$ cm$^{-3}$).

Reference Embodiment III-4: Group III Nitride Semiconductor Device

Referring now to FIGS. 9 and 10, a group III nitride semiconductor device 4 which is a further reference embodiment of Reference Invention III will be described.

Group III nitride semiconductor device 4 includes group III nitride film 13 in the group III nitride composite substrate of Reference Embodiment III-1, and at least one group III nitride layer 20 disposed on group III nitride film 13.

Thus, group III nitride semiconductor device 4 in the present reference embodiment includes: group III nitride composite substrate 1 which includes group III nitride film 13 having a thickness of 10 μm or more and 250 μm or less; and group III nitride layer 20 with a remarkably high crystal quality grown and thereby disposed on the composite substrate, and therefore has excellent semiconductor characteristics.

In group III nitride semiconductor device 4, group III nitride layer 20 varies depending on the type of group III nitride semiconductor device 4. As shown in FIG. 9, in the case where group III nitride semiconductor device 4 is a light-emitting device, group III nitride layer 20 may be configured to include, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25. As shown in FIG. 10, in the case where group III nitride semiconductor device 4 is an HEMT which is an example of electronic devices, group III nitride layer 20 may be configured to include, for example, a GaN layer 26 and an Al$_{0.2}$Ga$_{0.8}$N layer 27, and a source electrode 60, a drain electrode 70, a gate electrode 80, and the like can be formed on Al$_{0.2}$Ga$_{0.8}$N layer 27. As shown in FIG. 11, in the case where the semiconductor device is an SBD which is another example of electronic devices, the group III nitride layer may be configured to include, for example, an n$^{+}$-GaN layer 28 (having a carrier concentration for example of 2×10$^{18}$ cm$^{-3}$) and an n$^{-}$-GaN layer 29 (having a carrier concentration for example of 5×10$^{13}$ cm$^{-3}$).

As shown in FIGS. 9 and 10, preferably group III nitride semiconductor device 4 further includes at least one of support substrate 11 and a device support substrate 40 for supporting group III nitride layer 20. Here, the shape of device support substrate 40 is not limited to the shape of a flat plate, and may be any as long as it supports group III nitride film 13 and group I nitride layer 20 so that group III nitride semiconductor device 4 can be formed.

The group III nitride semiconductor device in the reference embodiment as described above can be manufactured by the following manufacturing method.

Namely, by the following manufacturing method, group III nitride semiconductor devices can be manufactured at a low cost and with a high yield, and have remarkably excellent semiconductor characteristics.

Reference Embodiment II-5: Method for Manufacturing Group III Nitride Semiconductor Device Referring now to FIG. 15, a method for manufacturing a group III nitride semiconductor device which is a further reference embodiment of Reference Invention III will be described.

The method for manufacturing a group III nitride semiconductor device in the present reference embodiment includes the steps of: preparing group III nitride composite substrate 1; and growing at least one group III nitride layer 20 on group III-nitride-film 13-side main surface 13m of group III nitride composite substrate 1.

Here, the step of preparing group III nitride composite substrate 1 is similar to that of the method for manufacturing a group III nitride composite substrate described above in connection with Reference Embodiment III-2. Therefore, the same description will not be repeated. In the following, the steps after the step of preparing group III nitride composite substrate 1 will be described.

The method for manufacturing a group III nitride semiconductor device in the present reference embodiment includes, as shown in FIG. 15, the step of growing at least one group III nitride layer 20 on group III-nitride-film 13-side main surface 13m of group III nitride composite substrate 1 (FIG. 15 (A)). The method for manufacturing a group III nitride semiconductor device in the present reference embodiment can be used to manufacture group III nitride semiconductor devices having excellent characteristics with a high yield, since the group III nitride layer is grown on group III-nitride-film 13-side main surface 13m when the group III nitride layer is grown.

The method for manufacturing a group III nitride semiconductor device in the present reference embodiment can further include the step of further bonding device support substrate 40 onto group III nitride layer 20 (FIG. 15 (B)), and the step of removing support substrate 11 from group III nitride composite substrate 1 (FIG. 15 (C)). These steps can be added to enable group III nitride semiconductor devices having a high mechanical strength and excellent characteristics and supported by device support substrate 40 to be manufactured with a high yield. In the following, each step will be described specifically.

<Step of Growing Group III Nitride Layer>

In the step of growing at least one group III nitride layer 20 on group III-nitride-film 13-side main surface 13m of group III nitride composite substrate 1 as shown in FIG. 15 (A), suitable methods for growing group III nitride layer 20 are gas phase methods such as MOVPE, MBE, HVPE, and sublimation method, as well as liquid phase methods such as flux method, in order to epitaxially grow group III nitride layer 20 having a high crystal quality, and a particularly suitable method is MOVPE.

The structure of group III nitride layer 20 varies depending on the type of group III nitride semiconductor device 4. In the case where group III nitride semiconductor device 4 is a light-emitting device, group III nitride layer 20 may be configured by successively growing, on group III nitride film 13, for example, an n-GaN layer 21, an n-$In_{0.05}Ga_{0.95}N$ layer 22, an active layer 23 having a multiple quantum well structure, a p-$Al_{0.09}Ga_{0.91}N$ layer 24, and a p-GaN layer 25.

In this way, at least one group III nitride layer 20 is grown on group III nitride film 13 of group III nitride composite substrate 1, and accordingly laminated group III nitride composite substrate 2 is obtained.

<Step of Bonding Device Support Substrate>

The step of further bonding device support substrate 40 onto group III nitride layer 20 as shown in FIG. 15 (B) is performed by forming a first electrode 30 and a pad electrode 33 on group III nitride layer 20 of laminated group III nitride composite substrate 2, forming a pad electrode 43 and a joint metal film 44 on device support substrate 40, and bonding joint metal film 44 to pad electrode 33. Through these steps, laminated substrate 3 is obtained. As device support substrate 40, Si substrate, CuW substrate, or the like is used.

<Step of Removing Support Substrate>

The step of removing support substrate 11 from group III nitride composite substrate 1 as shown in FIG. 15 (C) is performed by removing support substrate 11 of group III nitride composite substrate 1 from laminated substrate 3. Thus, joint film 12 interposed between support substrate 11 and group III nitride film 13 can simultaneously be removed.

The method for removing support substrate 11 and joint film 12 is not particularly limited, and suitable methods to be used are grinding, etching, and the like.

For example, support substrate 11 formed of a material which is low in hardness, strength, and wear resistance, and is likely to be ground off, can be removed by at least one of grinding and polishing, in order to reduce the manufacturing cost. Support substrate 11 formed of a material which can be dissolved in a chemical solution such as acid solution or alkali solution, can be removed through etching with a chemical solution, since it requires low manufacturing cost. As support substrate 11, a support substrate formed of a polycrystalline material such as ceramic material is more preferred as compared with a support substrate formed of a monocrystalline material such as sapphire, SiC, group III nitride (GaN for example), or the like, since the support substrate 11 of the polycrystalline material is easier to remove.

<Step of Forming Electrode>

As shown in FIG. 15 (D), on group III nitride film 13 which has been exposed after removal of support substrate 11 and joint film 12 from laminated substrate 3, a second electrode 50 is formed and, on device support substrate 40, a device support substrate electrode 45 is formed.

In this way, group III nitride semiconductor devices having remarkably excellent characteristics can be manufactured with a high yield.

EXAMPLES

Examples 1 to 5 and Comparative Examples 1 to 2 according to the present invention will be illustrated below.

Example 1

1. Fabrication of Group III Nitride Composite Substrate
(1) Bonding Group III Nitride Film and Support Substrate
Referring to FIG. 4 (A), group III nitride film 13 and support substrate 11 were bonded to each other in the following way.

Referring to FIG. 4 (A1), support substrate 11 was prepared. Specifically, three mullite ($Al_2O_3$—$SiO_2$) substrates each having two main surfaces both polished into a mirror surface (flat surface having an arithmetic mean roughness Ra defined under JIS B0601 of 1 nm or less, this definition will be applied hereinafter) and having a diameter of 10.0 cm and a thickness of 500 μm were prepared. On main surface 11m of this support substrate 11, an $SiO_2$ film of 1 μm in thickness was formed as joint film 12a by CVD.

Referring to FIG. 4 (A2), group III nitride film 13 was prepared. Specifically, three different GaN films A to C each having two main surfaces both polished into a mirror surface and having a diameter of 10.0 cm and a thickness of 400 μm were prepared. GaN film A was not actively doped with a conductivity improver impurity. GaN film B was doped with O (oxygen) atoms serving as a conductivity improver impurity at a concentration of $7 \times 10^{17}$ $cm^{-3}$. GaN film C was doped with O (oxygen) atoms serving as a conductivity improver impurity at a concentration of $1.6 \times 10^{18}$ $cm^{-3}$.

On main surface 13n which was a (000-1) plane corresponding to an N atomic plane of group III nitride film 13, an $SiO_2$ film of 1 μm in thickness was formed as joint film 12b by CVD.

Referring next to FIG. 4 (A3), each of main surface 12am of joint film 12a formed on support substrate 11 and main surface 12bn of joint film 12b formed on group III nitride film 13 was polished into a mirror surface, and thereafter main surface 12am of joint film 12a and main surface 12bn of joint film 12b were bonded to each other. Annealing was performed by raising the temperature to 700° C. in an $N_2$ gas (nitrogen gas) atmosphere to thereby increase the joint strength.

The three different bonded substrates in which they were thus bonded to each other were each cut by dicing into eight bonded substrate pieces having a main surface of 20 mm×20 mm (square of 20 mm×20 mm, which will also be applied hereinafter).

(2) Adjustment of Thickness of Group III Nitride Film

Referring to FIG. 4 (B), the thickness of group III nitride film 13 of the eight bonded substrate pieces obtained from each of the three different bonded substrates was adjusted by polishing the main surface so that respective group III nitride films were 5 µm, 8 µm, 10 µm, 20 µm, 50 µm, 100 µm, 200 µm, and 500 µm. Thus, eight group III nitride composite substrates were obtained.

2. Measurement of Sheet Resistance of Group III-Nitride-Film-Side Main Surface of Group III Nitride Composite Substrate For the 24 group III nitride composite substrates 1 obtained from the three different bonded substrates produced in the above-described manner (eight group III nitride composite substrates per each of the three different bonded substrates), the sheet resistance of group III-nitride-film 13-side main surface 13m was measured by the four-terminal method. The results are summarized in Table 1.

TABLE 1

| group III nitride film | | sheet resistance |
|---|---|---|
| type | thickness (µm) | (Ω/sq) |
| GaN film A | 5 | 403.6 |
|  | 8 | 250.8 |
|  | 10 | 196.1 |
|  | 20 | 101.6 |
|  | 50 | 41.5 |
|  | 100 | 19.8 |
|  | 200 | 9.7 |
|  | 500 | 3.8 |
| GaN film B | 5 | 157.7 |
|  | 8 | 101.3 |
|  | 10 | 78.9 |
|  | 20 | 39.2 |
|  | 50 | 18.1 |
|  | 100 | 7.4 |
|  | 200 | 3.7 |
|  | 500 | 1.3 |
| GaN film C | 5 | 40.7 |
|  | 8 | 24.5 |
|  | 10 | 19.4 |
|  | 20 | 9.7 |
|  | 50 | 3.6 |
|  | 100 | 1.7 |
|  | 200 | 0.9 |
|  | 500 | 0.3 |

3. Fabrication of Group III Nitride Semiconductor Device

Figure 5:
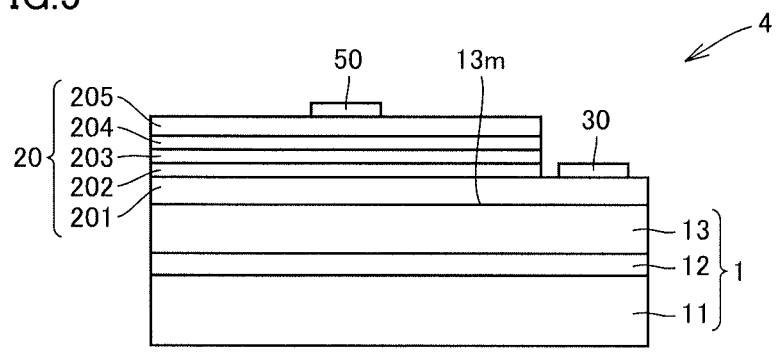
FIG. 5 is a schematic cross-sectional view showing an example of the group III nitride semiconductor device produced by the method for manufacturing a group III nitride semiconductor device according to the present invention.

Referring to FIG. 5, on main surface 13m which was a {0001} plane corresponding to a group III atomic plane of group III nitride film 13 in group III nitride composite substrate 1, group III nitride layer 20 was grown by MOCVD. Specifically, an n-type GaN layer having a thickness of 5 µm which was first-conductivity-type GaN layer 201, an n-type $Al_{0.05}Ga_{0.95}N$ layer having a thickness of 0.5 µm which was first-conductivity-type $Al_sGa_{1-s}N$ layer 202 (here, s meets 0<s<1), an MQW (Multiple Quantum Well) structure layer having a thickness of 100 nm and made up of six cycles of $In_{0.15}Ga_{0.85}N$ layer and $In_{0.01}Ga_{0.99}N$ layer which was light-emitting layer 203, a p-type $Al_{0.20}Ga_{0.80}N$ layer having a thickness of 20 nm which was second-conductivity-type $Al_tGa_{1-t}N$ layer 204 (here, t meets 0<t<1), and a p-type GaN layer having a thickness of 0.15 µm which was second-conductivity-type GaN layer 205 were grown in this order.

Next, second-conductivity-type GaN layer 205, second-conductivity-type $Al_tGa_{1-t}N$ layer 204, light-emitting layer 203, and first-conductivity-type $Al_sGa_{1-s}N$ layer 202 were each partially removed by mesa etching to expose a part of first-conductivity-type GaN layer 201.

Next, on the exposed main surface of first-conductivity-type GaN layer 201, an n-side electrode was formed as first electrode 30 by electron beam vapor deposition. In addition, on the exposed main surface of second-conductivity-type GaN layer 205, a p-side electrode was formed as second electrode 50 by electron beam vapor deposition. In this way, 24 group III nitride semiconductor devices were fabricated.

A reference group III nitride semiconductor device was prepared in the following way. On main surface 13m of the GaN substrate that was a (0001) plane corresponding to a group III atomic plane, namely Ga atomic plane, group III nitride layer 20 of the same structure as the above-described one was formed in a similar manner to the above-described one. The GaN substrate had the two main surfaces both polished into a mirror surface and having a size of 20 mm×20 mm and a thickness of 500 µm, and was doped with a conductivity improver impurity, namely O (oxygen) atoms, at a concentration of $1.6 \times 10^{18}$ cm$^{-3}$.

4. Measurement of Emission Intensity of Group III Nitride Semiconductor Device

The emission intensity of the 24 group III nitride semiconductor devices and the reference group III nitride semiconductor device obtained as described above was measured in the following way. Current of 80 mA was applied to the group III nitride semiconductor device. The emission intensity at a peak wavelength of 450 nm of the emission spectrum at this time was measured by the EL (Electro Luminescence) method. The ratio of the emission intensity of each of the 24 group III nitride semiconductor devices, relative to the emission intensity of the reference group III nitride semiconductor device, was calculated for use as a relative emission intensity. A light-emitting device having a group III nitride composite substrate including GaN film A of 5 µm in thickness and having a sheet resistance of 403.6 Ω/sq, and a light-emitting device having a group III nitride composite substrate including GaN film A of 8 µm in thickness and having a sheet resistance of 250.8 Ω/sq each had a low relative emission intensity of 0.01 or less. The relative emission intensity of light-emitting devices having the other group III nitride composite substrates had a higher relative emission intensity of 0.1 or more.

Example 2

As group III nitride films 13, 20 GaN films having a diameter of two inches (5.08 cm) and a thickness of 500 µm, doped with O (oxygen) atoms which were a conductivity improver impurity at a concentration of $7 \times 10^{17}$ cm$^{-3}$, and having two main surfaces both polished into a mirror surface were prepared.

Of these GaN films, ten GaN films were polished so that the thickness was reduced to 200 µm. As a result, breakage and/or cracks occurred to seven GaN films out of the ten GaN films.

To the remaining ten GaN films each, a mullite substrate having a diameter of two inches (5.08 cm) and a thickness of 400 µm was bonded through a similar procedure to Example 1, and thereafter the bonded GaN film was polished so that the thickness was reduced to 200 µm. Then, no breakage and/or cracks occurred to all of the ten GaN films.

Example 3

Six group III nitride composite substrates 1 were fabricated through a similar procedure to Example 1, except that a GaN film having a diameter of two inches (5.08 cm) and a thickness of 500 μm, doped with no conductivity improver impurity, and having two main surfaces both polished into a mirror surface was used as group III nitride film 13, and that a watermark was formed on the surface to be bonded to thereby change the area of the bonded region. Here, the watermark is a dry stain formed as follows. As moisture in a portion of a surface where an impurity is present due to cleaning contamination or the like is dried, the portion is dried with the impurity aggregated, and accordingly the dry stain is formed. The watermark can be formed by wetting a surface where the watermark is to be formed, with low-purity water rather than ultrapure water and drying it to thereby form the watermark in the portion wet with the low-impurity water.

For the obtained six group III nitride composite substrates 1, the area of joined region 100b was measured with a surface defect inspection apparatus using a laser. As a result, respective areas of the joined regions of the substrates relative to the area of main surface 11m were 34%, 57%, 64%, 70%, 87%, and 95%. Of these group III nitride composite substrates, group III nitride composite substrates 1 in which the area of joined region 100b was 70% or more relative to the area of main surface 1m had non-joined partial regions constituting non-joined region 100n that all had a maximum size in radial direction of less than 20 mm. As for group III nitride composite substrates 1 in which the area of joined region 100b was 64% or less relative to the area of main surface 1m, some non-joined partial regions constituting non-joined region 100n had a maximum size in radial direction of 20 mm or more. Moreover, group III nitride composite substrates 1 in which the area of joined region 100b was 64% or less relative to the area of main surface 11m were heated to 700° C. As a result, group III nitride film 13 was peeled off during the heating, from support substrate 11 from the non-joined partial region with a maximum size in radial direction of 20 mm or more.

Example 4

Three group III nitride composite substrates 1 were fabricated through a similar procedure to Example 1, except that: a GaN film having a diameter of two inches (5.08 cm) and a thickness of 500 μm, doped with no conductivity improver impurity, and having two main surfaces both polished into a mirror surface was used as group III nitride film 13; a polycrystalline Mo substrate having a diameter of two inches (5.08 cm) and a thickness of 500 μm and having two main surfaces both polished into a mirror surface was used as support substrate 11; the surfaces to be bonded to each other were cleaned in the process of bonding to thereby reduce generation of non-joined regions; and a water mark having a diameter on the order of 15 mm was formed on the surface to be bonded to thereby form a non-joined region at a predetermined position of the group III nitride composite substrate.

For the obtained three group III nitride composite substrates 1, the position of the non-joined region was measured with an ultrasonic microscope. As a result, in one group III nitride composite substrate, there was formed the non-joined region including a non-joined partial region having a maximum size in radial direction on the order of 10 mm and abutting on the perimeter of the main surface. In another group III nitride composite substrate, there was formed the non-joined region including only a non-joined partial region having a maximum size in radial direction on the order of 10 mm and failing to abut on the perimeter of the main surface. In the remaining one group III nitride composite substrate, the area of the non-joined region was 83% relative to the area of the main surface.

The obtained three group III nitride composite substrates were heated to 700° C. As a result, the group III nitride composite substrate in which there was formed the non-joined region including the non-joined partial region which had a maximum size in radial direction on the order of 10 mm and abutted on the perimeter of the main surface was broken during the heating. The remaining group III nitride composite substrates were not broken.

Example 5

As group III nitride films, eight GaN films whose two main surfaces were both polished into a mirror surface, main surface was 20 mm×20 mm, and thickness was 300 μm were prepared. The eight GaN films were divided into four sets each including two GaN films, and main-surface through holes having a diameter on the order of 50 μm were formed so that the area of the main-surface through holes relative to the area of the main surface were 5%, 10%, 20%, and 30%, respectively in these four sets.

Moreover, eight substrates were prepared in which the support substrate was a sapphire substrate whose main surface was 20 mm×20 mm and thickness was 400 μm and an $SiO_2$ film was formed as the joint film on the main surface of the sapphire substrate. The main surface of the joint film was polished into a mirror surface. After this, four of the eight substrates were cleaned multiple times in an aqueous solution containing 37% by mass of HCl (hydrochloric acid) and 30% by mass of $H_2O_2$ (hydrogen peroxide), to thereby remove an impurity containing metal on the surface to be bonded. The remaining four substrates were cleaned with IPA (isopropyl alcohol).

The four group III nitride films in which respective areas of the main-surface through holes were 5%, 10%, 20%, and 30% relative to the area of the main surface, and the four support substrates in which the surface of the joint film to be bonded was cleaned with HCl and $H_2O_2$ were bonded to each other under similar conditions to Example 1. Further, the four group III nitride films in which respective areas of the main-surface through holes were 5%, 10%, 20%, and 30% relative to the area of the main surface and the four support substrates in which the surface of the joint film to be bonded was cleaned with IPA were bonded to each other under similar conditions to Example 1.

After they were thus bonded to each other, a tensile test was performed in the following way. The tensile test was performed by attaching a jig of 10 mm×10 mm with an epoxy adhesive to the front and rear sides of the group III nitride composite substrate and pulling both ends of the jig. The results are summarized in Table 2. In Table 2, the composite substrates on which fracture occurred between the epoxy adhesive and the jig exhibit a higher joint strength than those in which the group III nitride film and the joint film are separated from each other along their interface.

TABLE 2

| method for cleaning surface to be bonded | area (%) of main-surface through hole in group III nitride film relative to area of main surface | region of fracture and form of fracture under tensile test |
|---|---|---|
| cleaning with HCl and $H_2O_2$ | 5 | fracture along interface between epoxy adhesive and jig |
| | 10 | separation along interface between group III nitride film and joint film |

TABLE 2-continued

| method for cleaning surface to be bonded | area (%) of main-surface through hole in group III nitride film relative to area of main surface | region of fracture and form of fracture under tensile test |
|---|---|---|
| | 20 | separation along interface between group III nitride film and joint film |
| | 30 | separation along interface between group III nitride film and joint film |
| cleaning with IPA | 5 | fracture along interface between epoxy adhesive and jig |
| | 10 | fracture along interface between epoxy adhesive and jig |
| | 20 | separation along interface between group III nitride film and joint film |
| | 30 | separation along interface between group III nitride film and joint film |

Referring to Table 2, the composite substrates which were cleaned with IPA had a higher joint strength where the area of the main-surface through hole of the group III nitride film was 10% or less relative to the area of the main surface. In addition, the concentration of an impurity containing metal on the surface to be bonded of the joint film cleaned with HCl and $H_2O_2$ and that of the joint film cleaned with IPA were measured by TXRF (total reflection x-ray fluorescence) analysis. Those cleaned with HCl and $H_2O_2$ had an Fe concentration and an Ni concentration which were both $1\times10^{10}$ cm$^{-2}$ or less. Those cleaned with IPA had an Fe concentration of $5.7\times10^{11}$ cm$^{-2}$ and an Ni concentration of $1.5\times10^{11}$ cm$^2$.

Comparative Example 1

As the group III nitride film, one GaN film having a diameter of two inches (5.08 cm) and a thickness of 400 μm, doped with O (oxygen) atoms at a concentration of $6\times10^7$ cm$^{-3}$ which was a conductivity improver impurity, and having two main surfaces both polished into a mirror surface was prepared. In a main surface, which was an N atomic surface of the group III nitride film, H (hydrogen) ions were implanted to a position at a depth of about 0.7 μm from the main surface. The H ions were implanted with an acceleration voltage of 100 keV and a dose of $5\times10^{17}$ cm$^{-2}$. The main surface, where the H ions were implanted, of the group III nitride film implanted with the H ions, and a mullite substrate having a diameter of two inches (5.08 cm) and a thickness of 500 μm, were bonded to each other and annealed through a similar procedure to Example 1. Accordingly, the group III nitride film was separated along the region where the H ions were implanted, so that a group III nitride composite substrate in which a group III nitride film of 0.3 μm in thickness is formed on the mullite substrate was obtained. The sheet resistance of the obtained group III nitride composite substrate was $1\times10^{10}$ f/sq or more.

Comparative Example 2

A group III nitride composite substrate having a group III nitride film of 0.3 μm in thickness on an Mo substrate was produced through a similar procedure to Comparative Example 1, except that the Mo substrate having a diameter of two inches (5.08 cm) and a thickness of 300 μm and having two main surfaces both polished into a mirror surface was used as the support substrate, and that the dose of H ions was $3.5\times10^{17}$ cm$^{-2}$. The obtained group III nitride composite substrate was further heat-treated at 800° C. for three hours in an $N_2$ gas (nitrogen gas) atmosphere. Accordingly, the sheet resistance was reduced to 6700 Ω/sq in most of the region, while the sheet resistance was still a high resistance of 35000 Ω/sq in a part of the region.

Reference Example I-A to Reference Example I-I according to Reference Invention I will be illustrated below.

Reference Example I-A

1. Fabrication of Group III Nitride Composite Substrate

Referring to FIG. 12 (A), a mullite substrate having a diameter of 75 mm was prepared for use as support substrate 11. Both surfaces of support substrate 11 were subjected to rough polishing by means of diamond abrasive grains and a copper-based surface plate, intermediate polishing by means of diamond abrasive grains and a tin surface plate, and finish polishing by means of a nonwoven polishing pad so that the surfaces were mirror-finished to have an RMS (root mean square roughness) of 5 nm or less. After this, an $SiO_2$ film was grown on this to a thickness of 800 nm by the LP-CVD (Low Pressure-Chemical Vapor Deposition) method. Then, CMP was performed using a slurry having a pH of 10 and containing colloidal silica abrasive grains having an average grain size of 40 nm, to thereby form joint film 12a having a thickness of 400 nm and planarized so that the RMS of the main surface was 0.3 nm or less. In order to remove abrasive grains used for CMP, non-abrasive polishing cleaning with a KOH aqueous solution and cleaning with pure water were performed.

Referring to FIG. 12 (B), a GaN crystal body having a diameter of 75 mm and a thickness of 8 mm was prepared for use as group III nitride film donor substrate 13D. A surface-to-be-bonded of group III nitride film donor substrate 13D was subjected to mechanical polishing and CMP so that it was mirror-finished to have an RMS of 2 nm or less. After this, an $SiO_2$ film having a thickness of 800 nm was grown by the LP-CVD (Low Pressure-Chemical Vapor Deposition) method on the surface-to-be-bonded, and CMP was performed using a slurry having a pH of 10 and containing colloidal silica abrasive grains having an average grain size of 40 nm, to thereby form joint film 12b having a thickness of 500 nm and having a main surface planarized to have an RMS of 0.3 nm or less. In order to remove abrasive grains used for CMP, non-abrasive polishing cleaning with a KOH aqueous solution and cleaning with pure water were performed. Here, group III nitride film donor substrate 13D was produced through growth by the HVPE method using a GaAs substrate as a base substrate.

Referring to FIG. 12 (C), joint film 12a and joint film 12b were bonded together to thereby produce joined substrate 1L in which support substrate 11 and group III nitride film 13 were bonded to each other with joint film 12 interposed therebetween. After they were bonded together, joined substrate 1L was annealed by being heated in a nitrogen gas atmosphere to 800° C., to thereby increase the joint strength.

Referring to FIG. 12 (D), group III nitride film donor substrate 13D in joined substrate L was cut, with a wire saw, along a plane located inwardly at a depth of 180 μm from the bonded surface, namely the surface of group III nitride film donor substrate 13D bonded to joint film 12, to thereby produce group III nitride composite substrate 1 in which support substrate 11 and the GaN film which was group III nitride film 13 were bonded together with joint film 12 interposed therebetween. As the wire, a fixed-abrasive wire on which diamond abrasive grains were electrodeposited was used. As for the cutting method, in order to reduce the cut resistance and enhance the thickness precision and the flatness, the method was used that caused the wire to swing and caused group III nitride film donor substrate 13D to vibrate in synchronization therewith. The resistance coefficient for cutting with the wire saw was set to 4200 N. After cutting, group III nitride film 13 of group III nitride composite substrate 1 was subjected to mechanical polishing and CMP. In order to have a uniform thickness and a uniform off angle of group III nitride film 13, the composite substrate was mounted on a CMP apparatus in the following way. The shape of the substrate was corrected in advance by vacuum chuck suction, and thereafter the composite substrate was suction-fixed onto the apparatus.

Regarding group III nitride composite substrate 1 thus produced, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof are shown in Table 3. Here, mean value $m_t$ of the thickness, standard deviation $s_t$ of the thickness, mean value $m_o$ of the absolute value of the off angle, and standard deviation $s_o$ of the absolute value of the off angle, were calculated from the thickness and the absolute value of the off angle of group III nitride film 13 at the 13 measurement points P on main surface 13m of group III nitride film 13 as shown in FIG. 7, constituted of: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

2. Fabrication of Group III Nitride Semiconductor Device

Referring to FIG. 15 (A), on group III nitride film 13 of group IT nitride composite substrate 1, group III nitride layer 20 was formed by the MOVPE method. Specifically, on group III nitride film 13, n-GaN layer 21 having a thickness of 5 μm, n-$In_{0.05}Ga_{0.95}N$ layer 22 having a thickness of 50 nm, active layer 23 having a multiple quantum well structure of three cycles constituted of an $In_{0.14}Ga_{0.86}N$ well layer having a thickness of 3 nm and a GaN barrier layer having a thickness of 15 nm, p-$Al_{0.09}Ga_{0.91}N$ layer 24 having a thickness of 20 nm, and p-GaN layer 25 having a thickness of 150 nm were successively epitaxially grown to thereby produce laminated group III nitride composite substrate 2. After this, it was annealed by an RTA (Rapid Thermal Annealing) apparatus and accordingly activated.

Referring to FIG. 15 (B), on p-GaN layer 25, which was the topmost layer in group III nitride layer 20 of laminated group III nitride composite substrate 2, an Ni layer having a thickness of 4 nm and an Au layer having a thickness of 200 nm were successively formed by the EB (Electron Beam) deposition method, and annealed into an alloy, to thereby form first electrode 30. On first electrode 30, a Ti layer having a thickness of 200 nm, a Pt layer having a thickness of 100 nm, and an Au layer having a thickness of 1000 nm were successively formed by the EB deposition method to thereby form pad electrode 33.

A CuW substrate was prepared for use as device support substrate 40. On device support substrate 40, a Ti layer having a thickness of 200 nm, a Pt layer having a thickness of 100 nm, and an Au layer having a thickness of 1000 nm were successively formed by the EB deposition method to thereby form pad electrode 43. On pad electrode 43, an AuSn solder film was formed as joint metal film 44.

Subsequently, joint metal film 44 was bonded to pad electrode 33 to thereby produce laminated substrate 3.

Referring to FIG. 15 (C), from laminated substrate 3, support substrate 11 and joint film 12 in group III nitride composite substrate 1 were etched away by means of hydrofluoric acid.

Referring to FIG. 15 (D), on group III nitride film 13 having been exposed by removal of support substrate 11 and joint film 12 from laminated substrate 3, a Ti layer having a thickness of 20 nm, an Al layer having a thickness of 200 nm, and an Au layer having a thickness of 300 nm were successively formed by the EB deposition method, and then annealed to form second electrode 50. On device support substrate 40, a Ti layer having a thickness of 20 nm and an Au layer having a thickness of 300 nm were successively formed by the EB deposition method, and annealed to thereby form device support substrate electrode 45. In this way, group III nitride semiconductor device 4 was obtained.

For group III nitride semiconductor device 4 thus obtained, its optical output was measured by means of an integrating sphere under the condition that injected current was 4 A. The optical output of the light-emitting device was measured in the following way. Specifically, into the light-emitting device mounted in the integrating sphere, predetermined current was injected, and the optical output was measured by a detector receiving the light collected from the light-emitting device. The resultant group III nitride semiconductor devices were classified into non-defective devices meeting a standard that the optical output was 2 W or more and defective devices failing to meet this standard, and the percentage of the ratio determined by dividing the non-defective devices by the sum of the non-defective devices and the defective devices was defined as a yield. The yield of the group III nitride semiconductor devices is summarized in Table 3.

TABLE 3

| Reference Example I-A | I-A1 | I-A2 | I-A3 | I-A4 | I-A5 | I-A6 | I-A7 | I-A8 | I-A9 |
|---|---|---|---|---|---|---|---|---|---|
| ratio $s_t/m_t$ | 0.001 | 0.002 | 0.01 | 0.05 | 0.1 | 0.15 | 0.2 | 0.25 | 0.2 |
| ratio $s_o/m_o$ | 0.005 | 0.008 | 0.05 | 0.2 | 0.4 | 0.5 | 0.6 | 0.6 | 0.7 |
| device yield (%) | 78 | 77 | 75 | 72 | 68 | 62 | 58 | 35 | 32 |

Referring to Table 3, group III nitride semiconductor devices manufactured with a high yield were those using a group III nitride composite substrate having a diameter of 75 mm and including a group III nitride film having a thickness of 150 μm, where the ratio si/me of standard deviation $s_t$ of the thickness of the group III nitride film, to mean value $m_t$ of the thickness thereof was 0.001 or more and 0.2 or less, and the ratio $s_o/m_o$ of standard deviation $s_o$ of an absolute value of an off angle between the main surface of the group III nitride film and the {0001} plane, to mean value $m_o$ of the absolute value of the off angle thereof was 0.005 or more and 0.6 or less. It should be noted that, as to Reference Example I-A1, sophisticated control was necessary for cutting and polishing in order to reduce the thickness variation and the off-angle variation, and thus the cutting and polishing took a long time.

Reference Example I-B

Referring to FIGS. 12 and 15, group III nitride composite substrate 1 and group III nitride semiconductor device 4 were produced in a similar manner to Reference Example I-A, except that a mullite-YSZ substrate (with respect to the whole substrate, mullite was 70% by mass and YSZ was 30% by mass and, with respect to YSZ, $ZrO_2$ was 90% by mole and $Y_2O_3$ was 10% by mole) was used as support substrate 11, and group III nitride composite substrates 1 having a diameter of 75 mm, a diameter of 100 mm, a diameter of 125 mm, and a diameter of 150 m, respectively, were produced.

In a similar manner to Reference Example I-A, the ratio $s_t/m_t$ of standard deviation $s_t$ of the thickness of group III nitride film 13, to mean value m, of the thickness thereof, and the ratio $s_o/m_o$ of standard deviation so of an absolute value of an off angle between the main surface of the group III nitride film and the (0001) plane, to mean value $m_o$ of the absolute value of the off angle thereof were calculated for group III nitride composite substrate 1. The results are summarized in Table 4. The yield of group III nitride semiconductor devices 4 was also calculated in a similar manner to Reference Example I-A. The results are summarized in Table 4.

Reference Example I-C

As substrates for semiconductor devices, a group III nitride free-standing substrate (hereinafter also referred to as FS substrate), a group III nitride composite substrate (hereinafter also referred to as BP substrate) produced by the ion implantation method, and a group III nitride composite substrate (hereinafter also referred to as BS substrate) produced in accordance with Reference Embodiment I-4 of the present invention were prepared.

The FS substrate was prepared to have the diameter and the thickness shown in Table 5, by cutting a GaN crystal body having a predetermined diameter with a wire saw and polishing it.

Figure 17:
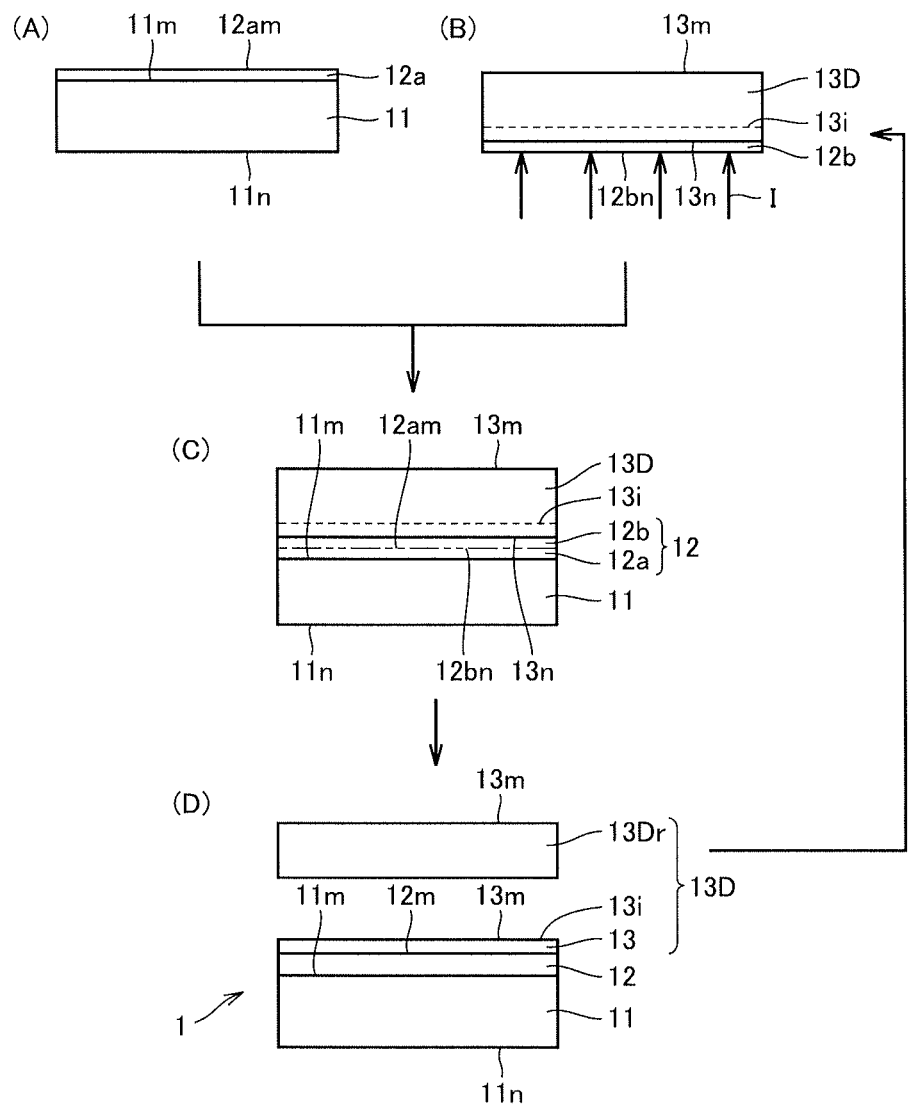
FIG. 17 is a schematic cross-sectional view showing an example of the method for manufacturing a group III nitride composite substrate through the use of ion implantation.

The BP substrate was prepared to have the diameter and the thickness of its group III nitride film shown in Table 5. Specifically, as shown in FIG. 17 (B), hydrogen ions were implanted from the main surface of the GaN crystal body having a predetermined diameter, namely group III nitride film donor substrate 13D, to the position of a predetermined depth located inwardly from the main surface, to thereby form an ion implantation region 13i. After this, as shown in FIG. 17 (C), support substrate 11 and the ion implantation region 13i side of group III nitride film donor substrate 13D were bonded together with joint film 12 interposed therebetween. After this, as shown in FIG. 17 (D), annealing was done at 850° C. to separate group III nitride film donor substrate 13D along its ion implantation region 13i. Here, a mullite substrate was used as support substrate 11.

The BS substrate was prepared to have the diameter and the thickness of its group III nitride film as shown in Table 5, in a similar manner to Reference Example 1-B except that a mullite substrate was used as the support substrate.

Group III nitride composite substrates 1 and group III nitride semiconductor devices 4 were fabricated in a similar manner to Reference Example I-B, except that the above-described FS substrate, BP substrate, and BS substrate were used.

TABLE 4

| | Reference Example I-B | | | | | | | | | | | | | |
|---|---|---|---|---|---|---|---|---|---|---|---|---|---|---|
| | I-B1 | I-B2 | I-B3 | I-B4 | I-B5 | I-B6 | I-B7 | I-B8 | I-B9 | I-B10 | I-B11 | I-B12 | I-B13 | I-B14 |
| diameter (mm) | 75 | 75 | 75 | 75 | 75 | 100 | 100 | 100 | 100 | 125 | 150 | 150 | 75 | 100 |
| thickness of group III nitride film (μm) | 10 | 30 | 100 | 170 | 200 | 10 | 110 | 170 | 200 | 110 | 120 | 160 | 250 | 250 |
| ratio $s_t/m_t$ | 0.12 | 0.12 | 0.12 | 0.12 | 0.12 | 0.12 | 0.12 | 0.12 | 0.12 | 0.12 | 0.12 | 0.12 | 0.12 | 0.12 |
| ratio $s_o/m_o$ | 0.3 | 0.3 | 0.3 | 0.3 | 0.3 | 0.3 | 0.3 | 0.3 | 0.3 | 0.3 | 0.3 | 0.3 | 0.3 | 0.3 |
| device yield (%) | 60 | 63 | 70 | 72 | 61 | 59 | 71 | 73 | 60 | 72 | 71 | 72 | 59 | 58 |

Referring to Table 4, group III nitride semiconductor devices manufactured with a high yield were those using a group III nitride composite substrate having a diameter of 75 mm to 150 mm and including a group III nitride film having a thickness of 10 μm to 250 μm, where the ratio $s_t/m_t$ of standard deviation $s_t$ of the thickness of the group III nitride film, to mean value $m_t$ of the thickness thereof was 0.12 falling within a range of 0.001 or more and 0.2 or less, and the ratio $s_o/m_o$ of standard deviation $s_o$ of an absolute value of an off angle between the main surface of the group III nitride film and the (0001) plane, to mean value $m_o$ of the absolute value of the off angle thereof was 0.3 falling within a range of 0.005 or more and 0.6 or less.

In a similar manner to Reference Example I-A, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof were calculated for group III nitride composite substrate 1. The results are summarized in Table 5. The yield of group III nitride semiconductor devices 4 was also calculated in a similar manner to Reference Example I-A. The results are summarized in Table 5.

TABLE 5

| | FS substrate | | | | | | BP substrate Reference Example I-C | | | | BS substrate | | | |
|---|---|---|---|---|---|---|---|---|---|---|---|---|---|---|
| | I-C1 | I-C2 | I-C3 | I-C4 | I-C5 | I-C6 | I-C7 | I-C8 | I-C9 | I-C10 | I-C11 | I-C12 | I-C13 | I-C14 |
| diameter (mm) | 50 | 75 | 75 | 100 | 100 | 100 | 125 | 75 | 100 | 125 | 75 | 100 | 125 | 150 |
| thickness of group III nitride film (μm) | 250 | 200 | 400 | 250 | 450 | 450 | 500 | 0.5 | 0.5 | 0.5 | 150 | 150 | 150 | 150 |
| warp (μm) | 50 | 140 | 40 | 180 | 30 | 30 | 35 | 25 | 30 | 35 | 30 | 30 | 30 | 30 |
| ratio $s_t/m_t$ | 0.16 | 0.16 | 0.16 | 0.16 | 0.16 | 0.25 | 0.16 | 0.16 | 0.16 | 0.16 | 0.16 | 0.16 | 0.16 | 0.16 |
| ratio $s_o/m_o$ | 0.42 | 0.42 | 0.42 | 0.42 | 0.42 | 0.65 | 0.42 | 0.42 | 0.42 | 0.42 | 0.42 | 0.42 | 0.42 | 0.42 |
| device yield (%) | 54 | crack | 55 | crack | 58 | 19 | 57 | 0 | 0 | 0 | 66 | 65 | 67 | 68 |

Referring to Table 5, as to the group III nitride semiconductor devices fabricated using FS substrates having a diameter of 50 mm to 125 mm and a thickness of 200 μm to 500 μm, those having a relatively large diameter and a relatively small thickness had a large warp and were likely to crack, and the yields of them were all less than 60%.

As to the group III nitride semiconductor devices fabricated using BP substrates having a diameter of 75 mm to 125 mm and a thickness of the group III nitride film of 0.5 μm, they did not exhibit excellent device characteristics due to the relatively small thickness of the group III nitride film, resulting in lower yields.

In contrast, the yields of the group III nitride semiconductor devices produced using BS substrates were higher, namely 65% or more.

Reference Example 1-D

A plurality of group III nitride composite substrates were fabricated in a similar manner to Reference Example 1-B, except that an Al$_2$O$_3$—SiO$_2$ composite oxide substrate (with respect to the whole substrate, Al$_2$O$_3$ was 85% by mass and SiO$_2$ was 15% by mass) was used as the support substrate. The warp and the TTV of the substrates were measured. The results are shown in Table 6. Here, the warp and the TTV of the group III nitride composite substrates were measured by means of an optical interferometric flatness tester.

These group III nitride composite substrates were used to fabricate group III nitride semiconductor devices in a similar manner to Reference Example I-B.

For the group III nitride composite substrates, the ratio $s_t/m_t$ of standard deviation $s_t$ of the thickness of the group III nitride film, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof, as well as the warp and the TTV of the group III nitride composite substrates are shown in Table 6. The yield of group III nitride semiconductor devices 4 was also calculated in a similar manner to Reference Example I-A. The results are summarized in Table 6.

TABLE 6

| Reference Example I-D | I-D1 | I-D2 | I-D3 | I-D4 | I-D5 | I-D6 | I-D7 | I-D8 | I-D9 | I-D10 | I-D11 | I-D12 | I-D13 |
|---|---|---|---|---|---|---|---|---|---|---|---|---|---|
| diameter (mm) | 100 | 100 | 100 | 100 | 100 | 100 | 100 | 100 | 75 | 150 | 150 | 150 | 150 |
| thickness of group III nitride film (μm) | 110 | 110 | 110 | 110 | 110 | 110 | 110 | 110 | 130 | 120 | 120 | 120 | 120 |
| warp (μm) | 15 | 30 | 50 | 70 | 30 | 30 | 50 | 50 | 50 | 50 | 50 | 50 | 90 |
| TTV (μm) | 15 | 15 | 20 | 40 | 10 | 20 | 30 | 50 | 30 | 30 | 60 | 30 | 30 |
| ratio $s_t/m_t$ | 0.08 | 0.08 | 0.08 | 0.08 | 0.08 | 0.08 | 0.08 | 0.08 | 0.08 | 0.08 | 0.08 | 0.08 | 0.08 |
| ratio $s_o/m_o$ | 0.36 | 0.36 | 0.36 | 0.36 | 0.36 | 0.36 | 0.36 | 0.36 | 0.36 | 0.36 | 0.36 | 0.36 | 0.36 |
| device yield (%) | 75 | 68 | 63 | 55 | 74 | 67 | 60 | 57 | 61 | 61 | 58 | 60 | 57 |

Referring to Table 6, the group III nitride semiconductor devices manufactured with a high yield were those using group III nitride composite substrates having a warp of the main surface on the group III nitride film side of 50 μm or less and having a TTV of 30 μm or less.

Reference Example I-E

Group III nitride semiconductor devices were fabricated in a similar manner to Reference Example I-B, except that different types of group III nitride composite substrates were used that were different in ratio $\alpha_{III-N}/\alpha_S$ of thermal expansion coefficient $\alpha_{III-N}$ of the group III nitride film to thermal expansion coefficient $\alpha_S$ of the support substrate, and ratio $t_{III-N}/t_S$ of thickness $t_{III-N}$ of the group III nitride film to thickness $t_S$ of the support substrate. Here, in order to vary these ratios, mullite substrate, mullite-YSZ substrate, and Al$_2$O$_3$—SiO$_2$ composite oxide substrate having different thicknesses were used as base substrates.

The ratio $\alpha_{III-N}/\alpha_S$ of thermal expansion coefficient $\alpha_{III-N}$ of the group III nitride film to thermal expansion coefficient $\alpha_S$ of the support substrate, the ratio $t_{III-N}/t_S$ of thickness $t_{III-N}$ of the group III nitride film to thickness $t_S$ of the support substrate, and the yield of the group III nitride semiconductor devices are summarized in Table 7.

TABLE 7

| Reference Example I-E | I-E1 | I-E2 | I-E3 | I-E4 | I-E5 | I-E6 | I-E7 | I-E8 | I-E9 | I-E10 | I-E11 |
|---|---|---|---|---|---|---|---|---|---|---|---|
| diameter (mm) | 75 | 75 | 75 | 75 | 75 | 100 | 100 | 100 | 100 | 150 | 150 |
| type of support substrate | mullite | mullite | mullite | mullite | mullite | mullite | mullite-YSZ | $Al_2O_3$—$SiO_2$ | $Al_2O_3$—$SiO_2$ | mullite | mullite-YSZ |
| ratio $\alpha_{III-N}/\alpha_S$ | 1.2 | 1.2 | 1.2 | 1.2 | 1.2 | 1.2 | 1 | 1.25 | 0.75 | 1.2 | 1 |
| ratio $t_{III-N}/t_S$ | 0.02 | 0.1 | 0.25 | 0.6 | 1 | 0.3 | 0.3 | 0.3 | 0.3 | 0.2 | 0.2 |
| device yield (%) | 62 | 65 | 70 | 66 | 64 | 71 | 75 | 65 | 62 | 68 | 72 |

Referring to Table 7, the group III nitride semiconductor devices manufactured with a high yield were those using group III nitride composite substrates having a ratio $\alpha_{III-N}/\alpha_S$ of thermal expansion coefficient $\alpha_{III-N}$ of the group III nitride film to thermal expansion coefficient $\alpha_s$ of the support substrate of 0.75 or more and 1.25 or less, and a ratio $t_{III-N}/t_S$ of thickness $t_{III-N}$ of the group III nitride film to thickness $t_S$ of the support substrate of 0.02 or more and 1 or less.

Reference Example I-F

Group III nitride composite substrates and group III nitride semiconductor devices were produced in a similar manner to Reference Example I-B, except that the cleaning conditions were tailored to adjust the amount of impurity metal atoms of the surface of the group III nitride film. The diameter of the group III nitride composite substrate, the amount of impurity metal atoms of the surface of the group III nitride film, and the yield of the group III nitride semiconductor devices are summarized in Table 8. Here, the amount of impurity metal atoms of the surface of the group III nitride film was measured by the TXRF (Total Reflection X-ray Fluorescence) method. Here, the measurements by the TXRF method were done by means of a tungsten (W) x-ray source under a condition that the angle of incidence was 0.05°.

TABLE 8

| Reference Example I-F | I-F1 | I-F2 | I-F3 | I-F4 | I-F5 | I-F6 | I-F7 |
|---|---|---|---|---|---|---|---|
| diameter | 75 | 75 | 75 | 75 | 100 | 100 | 150 |
| impurity metal atoms ($\times 10^{10}$ atoms/cm$^2$) | 6 | 40 | 300 | 500 | 8 | 80 | 10 |
| device yield (%) | 70 | 68 | 63 | 58 | 69 | 65 | 69 |

Referring to Table 8, group III nitride semiconductor devices manufactured with a high yield were those using group III nitride composite substrates having impurity metal atoms of the main surface of the group III nitride film of $3 \times 10^{12}$ atoms/cm$^2$ or less.

Reference Example I-G

Group III nitride composite substrates and group III nitride semiconductor devices were fabricated in a similar manner to Reference Example I-B, except that a mullite substrate was used as the support substrate and, as the group III nitride film donor substrate, a uniform GaN crystal body without dislocation concentrated region that had O and Si added as dopants and had a dislocation density of $4 \times 10^6$ cm$^{-2}$ and a carrier concentration of $2 \times 0^{18}$ cm$^{-3}$ was used. Here, the polishing conditions were tailored to adjust the maximum RMS of respective main surfaces of the group III nitride film and the support substrate.

As to the group III nitride composite substrates, the maximum RMS of the main surface of the group III nitride film and the maximum RMS of the main surface of the support substrate, as well as the yield of the group III nitride semiconductor devices are summarized in Table 9.

TABLE 9

| Reference Example I-G | I-G1 | I-G2 | I-G3 | I-G4 | I-G5 | I-G6 | I-G7 | I-G8 | I-G9 |
|---|---|---|---|---|---|---|---|---|---|
| maximum RMS of main surface of group III nitride film (nm) | 0.5 | 1 | 3 | 5 | 1 | 1 | 1 | 1 | 3 |
| maximum RMS of main surface of support substrate (nm) | 1 | 1 | 1 | 1 | 2 | 6 | 12 | 18 | 12 |
| device yield (%) | 68 | 64 | 58 | 52 | 65 | 63 | 57 | 53 | 55 |

Referring to Table 9, group III nitride semiconductor devices manufactured with a high yield were those using group III nitride composite substrates having an RMS of the main surface of the group III nitride film of 3 nm or less and an RMS of the main surface of the support substrate of 12 nm or less.

Reference Example I-H

Group III nitride composite substrates were fabricated in a similar manner to Reference Example I-B, except that an $Al_2O_3$—$SiO_2$ composite oxide substrate (with respect to the whole substrate, $Al_2O_3$ was 82% by mass and $SiO_2$ was 18% by mass) was used as the support substrate and, as the group III nitride film donor substrate, a semi-insulating GaN crystal body having Fe added as a dopant and a specific resistance of $1 \times 10^7$ Ωcm was used. Here, the polishing conditions were tailored to adjust mean value $m_{III-N}$ and standard deviation $s_{III-N}$ of the RMS of the main surface of the group III nitride film in the group III nitride composite substrate as well as mean value ms and standard deviation $s_S$ of the RMS of the main surface of the support substrate.

Further, referring to FIG. 10, an HEMT was fabricated as group III nitride semiconductor device 4 in the following manner.

On group III nitride film 13 of group III nitride composite substrate 1, GaN layer 26 having a thickness of 1.5 μm and $Al_{0.2}Ga_{0.8}N$ layer 27 having a thickness of 30 nm were successively epitaxially grown by the MOVPE method to form group III nitride layer 20, to thereby produce laminated group III nitride composite substrate 2.

Next, on $Al_{0.2}Ga_{0.8}N$ layer 27, a source electrode 60 and a drain electrode 70 were fabricated by photolithography, EB deposition, and lift-off. In these electrodes, a Ti layer having a thickness of 20 nm, an Al layer having a thickness of 100 nm, a Ti layer having a thickness of 20 nm, and an Au layer having a thickness of 300 nm were successively formed, lifted off, and annealed for 1 minute at 600° C. into an alloy.

Next, in a similar step to the step of fabricating source electrode 60 and drain electrode 70, a gate electrode 80 was fabricated. For fabrication of gate electrode 80, an Ni layer having a thickness of 50 nm and an Au layer having a thickness of 500 nm were successively formed. The gate length was set to 2 μm.

In the HEMT which was group III nitride semiconductor device 4 obtained in this way, GaN layer 26 and $Al_{0.2}Ga_{0.8}N$ layer 27 were formed as at least one group III nitride layer 20 on group III nitride film 13 of group III nitride composite substrate 1, and source electrode 60, drain electrode 70, and gate electrode 80 were disposed on $Al_{0.2}Ga_{0.8}N$ layer 27 so that the electrodes were separated from each other and gate electrode 80 was located between source electrode 60 and drain electrode 70.

The leakage gate current density of the obtained HEMT was inspected. Specifically, the produced devices were classified into non-defective devices meeting a standard that the leakage gate current density was $1\times10^{-6}$ A/cm$^2$ or less when being applied with a gate voltage of 5 V, and defective devices failing to meet this standard, and the percentage of the ratio determined by dividing the non-defective devices by the sum of the non-defective devices and the defective devices was defined as a yield.

Mean value $m_{III-N}$ and standard deviation $s_{III-N}$ of the RMS of the main surface of the group III nitride film in the group III nitride composite substrate, mean value ms and standard deviation $s_S$ of the RMS of the main surface of the support substrate, and the yield of group III nitride semiconductor devices are summarized in Table 10.

Referring to Table 10, group III nitride semiconductor devices manufactured with a high yield were those using a group III nitride composite substrate in which the main surface of the group III nitride film had a mean value $m_{III-N}$ of the RMS of 0.1 nm or more and 2 nm or less and a standard deviation $s_{III-N}$ of the RMS of 0.4 nm or less, and the main surface of the support substrate had a mean value ms of the RMS of 0.3 nm or more and 10 nm or less and a standard deviation $s_S$ of the RMS of 3 nm or less.

Reference Example I-I

1. Fabrication of Group III Nitride Composite Substrate

Referring to FIG. 14 (A) to (C), joined substrate 1L was produced in a similar manner to Reference Example 1-A, except that: an $Al_2O_3$—$SiO_2$ composite oxide substrate (with respect to the whole substrate, $Al_2O_3$ was 88% by mass and $SiO_2$ was 12% by mass) having a diameter of 100 mm was prepared for use as support substrate 11; a GaN crystal substrate having a diameter of 100 mm and a thickness of 400 μm was prepared for use as group III nitride film donor substrate 13D; on respective main surfaces of support substrate 11 and group III nitride film donor substrate 13D, an $SiO_2$ film was grown to a thickness of 500 nm by the PE-CVD method, and thereafter CMP was performed using a slurry having a pH of 9 and containing colloidal silica having an average grain size of 20 nm, to thereby form joint films 12a, 12b having a thickness of 250 nm and having a main surface planarized to have an RMS roughness of 0.15 nm or less; and scrub cleaning was performed with pure water and a sponge made of PVA (polyvinyl alcohol), as the cleaning with pure water.

Referring to FIG. 14 (D), grinding and polishing were performed on the main surface of group III nitride film donor substrate 13D in joined substrate 1L that was opposite to the bonded main surface thereof. For grinding, a vitrified grinding wheel containing diamond abrasive grains having an average grain size of 25 gtm to 35 μm was used. For polishing, mechanical polishing was performed in a stepwise manner using slurries containing diamond abrasive grains having an average grain size of 3 gim, 2 μm, and 0.25 μm, respectively. This polishing was performed, in order to reduce the thickness variation and the off-angle variation, in such a manner that the warp of the substrate was corrected in advance by mechanical pressurization and the substrate in this state was bonded to a holding plate. After polishing, dry etching was performed by means of chlorine gas plasma which was generated by the ICP-RIE (Inductively Coupled Plasma Reactive Ion Etching) method. It should be noted, Reference Example I-18 used, instead of the above-de-

TABLE 10

| Reference Example I-H | I-H1 | I-H2 | I-H3 | I-H4 | I-H5 | I-H6 | I-H7 | I-H8 | I-H9 | I-H10 | I-H11 | I-H12 |
|---|---|---|---|---|---|---|---|---|---|---|---|---|
| mean value $m_{III-N}$ of RMS of main surface of group III nitride film (nm) | 0.1 | 0.5 | 1 | 2 | 3 | 2 | 2 | 2 | 2 | 2 | 2 | 2 |
| standard deviation $s_{III-N}$ of RMS of main surface of group III nitride film (nm) | 0.03 | 0.1 | 0.2 | 0.4 | 0.4 | 0.5 | 0.4 | 0.4 | 0.4 | 0.4 | 0.4 | 0.4 |
| mean value $m_S$ of RMS of main surface of support substrate (nm) | 2 | 2 | 2 | 2 | 2 | 2 | 0.3 | 2 | 5 | 10 | 13 | 10 |
| standard deviation $s_S$ of RMS of main surface of support substrate (nm) | 0.2 | 0.2 | 0.2 | 0.2 | 0.2 | 0.2 | 0.1 | 0.4 | 1.4 | 3 | 3 | 4 |
| device yield (%) | 72 | 69 | 65 | 60 | 51 | 52 | 68 | 67 | 64 | 57 | 51 | 52 | scribed grinding, rough polishing performed by means of diamond abrasive grains having an average grain size of 9 µm. In this way, group III nitride composite substrate 1 including group III nitride film 13 having a thickness of 150 µm was obtained.

2. Fabrication of Group III Nitride Semiconductor Device

Referring to FIG. 15, group III nitride semiconductor device 4 was produced in a similar manner to Reference Example I-A, except that: group III nitride composite substrate 1 of the present Reference Example was used; support substrate 11 and joint film 12 were removed from laminated substrate 3 by grinding with a vitrified grinding wheel containing diamond abrasive grains having an average grain size of 35 µm to 45 µm, except that, for Reference Example 1-19, they were removed by polishing with diamond abrasive grains having an average grain size of 15 µm; in order to remove residue of the joint film and the support substrate after the grinding and/or the polishing, etching cleaning was performed with hydrofluoric acid.

In a similar manner to Reference Example I-A, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between the main surface of the group III nitride film and the (0001) plane, to mean value $m_o$ of the absolute value of the off angle thereof were calculated for group III nitride composite substrate 1. The results are summarized in Table 11. The yield of group III nitride semiconductor devices 4 was also calculated in a similar manner to Reference Example I-A. The results are summarized in Table 11.

lus of 250 GPa. Main surfaces 11m, 11n of the two opposite sides respectively of support substrate 11 were subjected to rough polishing with a copper-based surface plate, intermediate polishing with a tin surface plate, and finish polishing with a nonwoven polishing pad in which grating grooves were formed, for which a diamond slurry was used as an abrasive. The finish polishing was performed under the condition that action coefficient FE was $4 \times 10^{-17}$ m$^2$/s or more and $1 \times 10^{-16}$ m$^2$/s or less.

Next, on finish-polished main surface 11m of support substrate 11, an SiO$_2$ film of 800 nm in thickness was grown by the PE-CVD (Plasma Enhanced-Chemical Vapor Deposition) method, annealed in a nitrogen atmosphere at 800° C. for an hour, and thereafter subjected to CMP (Chemical Mechanical Polishing) using a slurry with a pH of 10 containing colloidal silica abrasive grains having an average grain size of 40 nm, to thereby form joint film 12a of 400 nm in thickness having its main surface 12am mirror-finished so that the RMS (root mean square roughness) was 0.3 nm or less. Subsequently, in order to remove the colloidal silica abrasive grains used for the CMP, non-abrasive polishing cleaning with a KOH aqueous solution, polishing cleaning with pure water, and megasonic cleaning (cleaning with ultrasonic waves in a megasonic frequency range of 500 kHz to 5 MHz) with pure water were performed.

Referring also to FIG. 12 (B), a GaN crystal body having a diameter of 75 mm and a thickness of 8 mm was prepared for use as group III nitride film donor substrate 13D. A surface-to-be-bonded of group III nitride film donor substrate 13D was subjected to mechanical polishing and CMP so that it was planarized to have an RMS of 2 nm or less.

TABLE 11

| Reference Example I-I | I-I1 | I-I2 | I-I3 | I-I4 | I-I5 | I-I6 | I-I7 | I-I8 | I-I9 |
|---|---|---|---|---|---|---|---|---|---|
| ratio $s_t/m_t$ | 0.001 | 0.002 | 0.05 | 0.15 | 0.2 | 0.25 | 0.2 | 0.05 | 0.05 |
| ratio $s_o/m_o$ | 0.005 | 0.008 | 0.2 | 0.5 | 0.6 | 0.6 | 0.7 | 0.2 | 0.2 |
| device yield (%) | 76 | 76 | 72 | 61 | 56 | 34 | 31 | 71 | 73 |

Referring to Table 11, group III nitride semiconductor devices manufactured with a high yield were those using a group III nitride composite substrate including a group III nitride film where the ratio $s_t/m_t$ of standard deviation $s_t$ of the thickness of the group III nitride film, to mean value $m_t$ of the thickness thereof was 0.001 or more and 0.2 or less, and the ratio $s_o/m_o$ of standard deviation $s_o$ of an absolute value of an off angle between the main surface of the group III nitride film and the (0001) plane, to mean value $m_o$ of the absolute value of the off angle thereof was 0.005 or more and 0.6 or less. It should be noted that, as to Example I-I1, sophisticated control was necessary for the grinding and polishing in order to reduce the thickness variation and the off-angle variation, and thus the grinding and polishing took a long time.

Reference Example II-A to Reference Example II-H according to Reference Invention II will be illustrated below.

Reference Example II-A

1. Fabrication of Group III Nitride Composite Substrate

Referring to FIG. 12 (A), an Al$_2$O$_3$—SiO$_2$ composite oxide substrate (with respect to the whole substrate, Al$_2$O$_3$ was 85% by mass and SiO$_2$ was 15% by mass) having a diameter of 75 mm and a thickness of 300 µm was prepared for use as support substrate 11. Support substrate 11 had a thermal conductivity of 10 W·m$^{-1}$·K$^{-1}$ and a Young's modu- After this, an SiO$_2$ film of 800 nm in thickness was grown on this substrate by the PE-CVD method, annealed in a nitrogen atmosphere at 800° C. for an hour, and thereafter subjected to CMP using a slurry with a pH of 10 containing colloidal silica abrasive grains having an average grain size of 40 nm, to thereby form joint film 12b of 500 nm in thickness having its main surface 12bn mirror-finished so that the RMS was 0.3 nm or less. Subsequently, in order to remove the colloidal silica abrasive grains used for the CMP, non-abrasive polishing cleaning with a KOH aqueous solution, polishing cleaning with pure water, and megasonic cleaning (cleaning with ultrasonic waves in a megasonic frequency range of 500 kHz to 5 MHz) with pure water were performed. Here, group III nitride film donor substrate 13D was produced through growth by the HVPE method using a GaAs substrate as a base substrate. Group III nitride film donor substrate 13D had its electrical conductivity of n-type, its dislocation density of $1 \times 10^8$ cm$^{-2}$, and its carrier concentration of $1 \times 10^{17}$.

Referring next to FIG. 12 (C), main surface 12am of joint film 12a and main surface 12bn of joint film 12b were bonded together to thereby produce joined substrate 1L in which support substrate 11 and group III nitride film 13 were bonded to each other with joint film 12 interposed therebetween. After they were bonded together, joined substrate 1L was annealed by being heated in a nitrogen gas atmosphere to 800° C., to thereby increase the joint strength.

Referring next to FIG. 12 (D), group III nitride film donor substrate 13D in joined substrate 1L was cut, with a wire saw, along a plane located inwardly at a depth of 150 μm from the bonded surface where group III nitride film donor substrate 13D was bonded to joint film 12, to thereby produce group III nitride composite substrate 1 in which support substrate 11 and the GaN film which was group III nitride film 13 were bonded together with joint film 12 interposed therebetween. As the wire, a fixed-abrasive wire with a diameter of 180 μm on which diamond abrasive grains were electrodeposited was used. As for the cutting method, in order to reduce the cut resistance and enhance the thickness precision and the flatness, the method was used that caused the wire to swing and caused group III nitride film donor substrate 13D to vibrate in synchronization therewith. The resistance coefficient for cutting with the wire saw was set to 4200 N. After cutting, group III nitride film 13 of group LII nitride composite substrate 1 was subjected to mechanical polishing and CMP. In order to have a uniform thickness of group III nitride film 13, the composite substrate was mounted on a CMP apparatus in the following way. The shape of the substrate was corrected in advance by vacuum chuck suction, and thereafter the composite substrate was suction-fixed onto the apparatus.

Next, Group III-nitride-film 13-side main surface 13m of group III nitride composite substrate 1 thus obtained was subjected to rough polishing with a copper-based surface plate and intermediate polishing with a tin surface plate, using a diamond slurry as an abrasive, and further subjected to finish polishing with a nonwoven polishing pad using, as an abrasive, a slurry with a pH of 11 containing colloidal silica abrasive grains. The finish polishing was performed under the condition that action coefficient FE was $6 \times 10^{-14}$ m$^2$/s. After the finish polishing, group III nitride film 13 had a thickness of 110 μm.

For group III nitride composite substrate 1 after this finish polishing, mean value ms of the RMS of support-substrate 11-side main surface 11n, and the ratio $s_S/m_S$ of standard deviation $s_S$ of the RMS to mean value ms of the RMS of support-substrate 11-side main surface 11n are summarized in Table 12.

Here, mean value ms of the RMS and the ratio $s_S/m_S$ of standard deviation $s_S$ of the RMS to mean value ms of the RMS were calculated from the RMS of support-substrate 11-side main surface 11n at the 13 measurement points P on support-substrate 11-side main surface 11n shown in FIG. 7, constituted of: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

2. Fabrication of Group III Nitride Semiconductor Device

Referring to FIG. 15 (A), on group III-nitride-film 13-side main surface 13m of group III nitride composite substrate 1, group III nitride layer 20 was formed by the MOVPE method. Specifically, on group III nitride film 13, n-GaN layer 21 having a thickness of 5 μm, n-In$_{0.05}$Ga$_{0.95}$N layer 22 having a thickness of 50 nm, active layer 23 having a multiple quantum well structure of three cycles constituted of an In$_{0.14}$Ga$_{0.86}$N well layer having a thickness of 3 nm and a GaN barrier layer having a thickness of 15 nm, p-Al$_{0.09}$Ga$_{0.91}$N layer 24 having a thickness of 20 nm, and p-GaN layer 25 having a thickness of 150 nm were successively epitaxially grown to thereby produce laminated group III nitride composite substrate 2. After this, it was annealed by an RTA (Rapid Thermal Annealing) apparatus and accordingly activated.

Referring to FIG. 15 (B), on p-GaN layer 25, which was the topmost layer in group III nitride layer 20 of laminated group III nitride composite substrate 2, an Ni layer having a thickness of 4 nm and an Au layer having a thickness of 200 nm were successively formed by the EB (Electron Beam) deposition method, and annealed into an alloy, to thereby form first electrode 30. On first electrode 30, a Ti layer having a thickness of 200 nm, a Pt layer having a thickness of 100 nm, and an Au layer having a thickness of 1000 nm were successively formed by the EB deposition method to thereby form pad electrode 33.

A CuW substrate was prepared for use as device support substrate 40. On device support substrate 40, a Ti layer having a thickness of 200 nm, a Pt layer having a thickness of 100 nm, and an Au layer having a thickness of 1000 nm were successively formed by the EB deposition method to thereby form pad electrode 43. On pad electrode 43, an AuSn solder film was formed as joint metal film 44.

Subsequently, joint metal film 44 was bonded to pad electrode 33 to thereby produce laminated substrate 3.

Referring to FIG. 15 (C), from laminated substrate 3, support substrate 11 and joint film 12 in group III nitride composite substrate 1 were etched away by means of hydrofluoric acid.

Referring to FIG. 15 (D), on group III nitride film 13 having been exposed by removal of support substrate 11 and joint film 12 from laminated substrate 3, a Ti layer having a thickness of 20 nm, an Al layer having a thickness of 200 nm, and an Au layer having a thickness of 300 nm were successively formed by the EB deposition method, and then annealed to form second electrode 50. On device support substrate 40, a Ti layer having a thickness of 20 nm and an Au layer having a thickness of 300 nm were successively formed by the EB deposition method, and annealed to thereby form device support substrate electrode 45. In this way, group III nitride semiconductor device 4 was obtained.

For group III nitride semiconductor device 4 thus obtained, its optical output was measured by means of an integrating sphere under the condition that injected current was 4 A. The optical output of the light-emitting device was measured in the following way. Specifically, into the light-emitting device mounted in the integrating sphere, predetermined current was injected, and the optical output was measured by a detector receiving the light collected from the light-emitting device. The resultant group III nitride semiconductor devices were classified into non-defective devices meeting a standard that the optical output was 2 W or more and defective devices failing to meet this standard, and the percentage of the ratio determined by dividing the non-defective devices by the sum of the non-defective devices and the defective devices was defined as a yield. The yield of the group III nitride semiconductor devices is summarized in Table 12.

TABLE 12

| Reference Example II-A | II-A1 | II-A2 | II-A3 | II-A4 | II-A5 | II-A6 | II-A7 | II-A8 | II-A9 | II-A10 | II-A11 | II-A12 | II-A13 |
|---|---|---|---|---|---|---|---|---|---|---|---|---|---|
| $m_s$ (nm) | 0.3 | 0.5 | 1 | 2 | 5 | 10 | 20 | 0.3 | 20 | 30 | 35 | 20 | 10 |
| ratio $s_S/m_S$ | 0.005 | 0.01 | 0.05 | 0.1 | 0.2 | 0.3 | 0.4 | 0.4 | 0.005 | 0.4 | 0.005 | 0.5 | 0.65 |
| device yield (%) | 77 | 77 | 73 | 71 | 67 | 63 | 56 | 63 | 58 | 31 | 32 | 35 | 37 |

Referring to Table 12, group III nitride semiconductor devices manufactured with a high yield were those fabricated using a group III nitride composite substrate with a diameter of 75 mm (this value meets 75 mm or more) including a support substrate and a group III nitride film with a thickness of 110 μm (this value meets 10 μm or more and 250 μm or less), where mean value ms of the RMS of the support-substrate-side main surface was 0.3 nm or more and 20 nm or less, and ratio $s_S/m_S$ of standard deviation $s_S$ of the RMS to mean value ms of the RMS of the support-substrate-side main surface was 0.005 or more and 0.4 or less.

Reference Example II-B

Referring to FIGS. 12 and 15, group III nitride composite substrate 1 and group III nitride semiconductor device 4 were produced in a similar manner to Reference Example II-A, except that: a mullite-YSZ substrate (with respect to the whole substrate, mullite was 70% by mass and YSZ was 30% by mass, with respect to mullite, $Al_2O_3$ was 60% by mole and $SiO_2$ was 40% by mole and, with respect to YSZ, $ZrO_2$ was 90% by mole and $Y_2O_3$ was 10% by mole) was used as support substrate 11; different diameters in a range of 75 mm to 150 mm were used and support-substrate 11-side main surface 11n was finish-polished under the condition that action coefficient FE was $6.2 \times 10^{-17}$ m²/s; and group III nitride composite substrates 1 were fabricated in which respective group III nitride films 13 after finish-polished had different thicknesses in a range of 10 μm to 250 μm. Support substrate 11 had a thermal conductivity of 30 W·m⁻¹·K⁻¹ and a Young's modulus of 150 GPa.

In a similar manner to Reference Example II-A, for group III nitride composite substrate 1, mean value ms of the RMS of support-substrate 11-side main surface 11n and the ratio $s_S/m_S$ of standard deviation $s_S$ of the RMS to mean value ms of the RMS of support-substrate 11-side main surface 11n were calculated and summarized in Table 13. In a similar manner to Reference Example 11-A, the yield of group III nitride semiconductor devices 4 was also calculated and summarized in Table 13.

less), and the ratio $s_S/m_S$ of standard deviation $s_S$ of the RMS to mean value ms of the RMS of the support-substrate-side main surface was 0.23 (this value meets 0.005 or more and 0.4 or less).

Reference Example II-C

As substrates for semiconductor devices, a group III nitride free-standing substrate (hereinafter also referred to as FS substrate), a group III nitride composite substrate (hereinafter also referred to as BP substrate) produced by the ion implantation method, and a group III nitride composite substrate (hereinafter also referred to as BS substrate) produced in accordance with Reference Embodiment II-4 of Reference Invention III were prepared.

The FS substrate was prepared to have the diameter and the thickness shown in Table 4, by cutting a GaN crystal body having a predetermined diameter with a wire saw and polishing it.

The BP substrate was prepared to have the diameter and the thickness of its group III nitride film shown in Table 14. Specifically, as shown in FIG. 17 (B), hydrogen ions were implanted from main surface 13n of the GaN crystal body having a predetermined diameter, namely group III nitride film donor substrate 13D, to the position of a predetermined depth located inwardly from the main surface, to thereby form an ion implantation region 13i. After this, as shown in FIG. 17 (C), support substrate 11 and the ion implantation region 13i side of group III nitride film donor substrate 13D were bonded together with joint film 12 interposed therebetween. After this, as shown in FIG. 17 (D), annealing was done at 700° C. to separate group III nitride film donor substrate 13D along its ion implantation region 13i. Here, an $Al_2O_3$—$SiO_2$ composite oxide substrate (with respect to the whole substrate, $Al_2O_3$ was 85% by mass and $SiO_2$ was 15% by mass) was used as support substrate 11.

The BS substrate was prepared to have the diameter and the thickness of its group III nitride film as shown in Table 14, in a similar manner to Reference Example II-B except that an $Al_2O_3$—$SiO_2$ composite oxide substrate (with

TABLE 13

| Reference Example II-B | II-B1 | II-B2 | II-B3 | II-B4 | II-B5 | II-B6 | II-B7 | II-B8 | II-B9 | II-B10 | II-B11 | II-B12 |
|---|---|---|---|---|---|---|---|---|---|---|---|---|
| diameter D (mm) | 75 | 75 | 75 | 75 | 75 | 100 | 100 | 100 | 100 | 125 | 150 | 150 |
| thickness of group III nitride film (μm) | 10 | 30 | 100 | 200 | 250 | 10 | 110 | 180 | 250 | 120 | 130 | 250 |
| $m_s$ (nm) | 6 | 6 | 6 | 6 | 6 | 6 | 6 | 6 | 6 | 6 | 6 | 6 |
| ratio $s_S/m_S$ | 0.23 | 0.23 | 0.23 | 0.23 | 0.23 | 0.23 | 0.23 | 0.23 | 0.23 | 0.23 | 0.23 | 0.23 |
| device yield (%) | 58 | 62 | 69 | 72 | 65 | 59 | 74 | 73 | 66 | 75 | 74 | 62 |

Referring to Table 13, group III nitride semiconductor devices manufactured with a high yield were those fabricated using a group III nitride composite substrate with a diameter of 75 mm to 150 mm including a group III nitride film with a thickness of 10 μm to 250 μm, where mean value ms of the RMS of the support-substrate-side main surface was 6 nm (this value meets 0.3 nm or more and 20 nm or respect to the whole substrate, $Al_2O_3$ was 85% by mass and $SiO_2$ was 15% by mass) was used as the support substrate.

Group III nitride composite substrates 1 and group III nitride semiconductor devices 4 were fabricated in a similar manner to Reference Example II-B, except that the above-described FS substrate, BP substrate, and BS substrate were used, finish polishing of support-substrate 11-side main surface 11n was performed under the condition that action coefficient FE was $4.0 \times 10^{-17}$ m²/s.

In a similar manner to Reference Example II-A, for the BP substrate and the BS substrate each serving as group III nitride composite substrate 1, warp W, ratio W/D, mean value ms of the RMS of support-substrate 11-side main surface 11n, and the ratio $s_S/m_S$ of standard deviation $s_S$ of the RMS to mean value ms of the RMS of support-substrate 11-side main surface 11n were calculated and summarized in Table 14. For the FS substrate as well, warp W, ratio W/D, mean value ms of the RMS of the rear-side main surface, and the ratio $s_S/m_S$ of standard deviation $s_S$ of the RMS to mean value ms of the RMS of rear-side main surface were calculated and summarized in Table 14. Further, in a similar manner to Reference Example II-A, the yield of group III nitride semiconductor devices 4 was calculated and summarized in Table 14.

strate. In contrast to the BP substrate, the BS substrate has no deterioration, due to ion implantation, of the crystal quality of the group III nitride film. Therefore, the semiconductor devices fabricated using the BS substrate exhibited excellent characteristics.

Reference Example II-D

Referring to FIGS. 12 and 15, group III nitride composite substrate 1 and group III nitride semiconductor device 4 were fabricated in a similar manner to Reference Example II-A, except that: an $Al_2O_3$—$SiO_2$ composite oxide substrate (with respect to the whole substrate, $Al_2O_3$ was 82% by mass and $SiO_2$ was 18% by mass) was used as support substrate 11; different diameters in a range of 75 mm to 150 mm were used, an $SiO_2$ film serving as joint film 12 was grown by the AP-CVD (Atmospheric Pressure-Chemical Vapor Deposition) method, and support-substrate 11-side main surface

TABLE 14

| | FS substrate | | | | | BP substrate Reference Example II-C | | | | | | BS substrate | | |
|---|---|---|---|---|---|---|---|---|---|---|---|---|---|---|
| | II-C1 | II-C2 | II-C3 | II-C4 | II-C5 | II-C6 | II-C7 | II-C8 | II-C9 | II-C10 | II-C11 | II-C12 | II-C13 | II-C14 |
| diameter D (mm) | 50 | 75 | 75 | 100 | 100 | 100 | 125 | 75 | 100 | 125 | 75 | 100 | 125 | 150 |
| thickness of group III nitride film (μm) | 280 | 250 | 380 | 250 | 450 | 450 | 500 | 0.5 | 0.5 | 0.5 | 140 | 140 | 140 | 140 |
| warp W (μm) | 40 | 120 | 42 | 170 | 25 | 25 | 40 | 20 | 25 | 30 | 25 | 25 | 40 | 45 |
| ratio W/D ($\times 10^{-4}$) | 8 | 16 | 5.6 | 17 | 2.5 | 2.5 | 3.2 | 2.7 | 2.5 | 2.4 | 3.3 | 2.5 | 3.2 | 3 |
| $m_s$ (nm) | 4 | 4 | 4 | 4 | 4 | 30 | 4 | 4 | 4 | 4 | 4 | 4 | 4 | 4 |
| ratio $s_S/m_S$ | 0.15 | 0.15 | 0.15 | 0.15 | 0.15 | 0.5 | 0.15 | 0.15 | 0.15 | 0.15 | 0.15 | 0.15 | 0.15 | 0.15 |
| device yield (%) | 52 | crack | 54 | crack | 56 | 18 | 52 | 0 | 0 | 0 | 72 | 73 | 70 | 69 |

Referring to Table 14, as to group III nitride semiconductor devices fabricated using FS substrates with a diameter of 50 mm to 125 mm and a thickness of 250 μm to 500 μm, the group III nitride semiconductor devices with a relatively large diameter and a relatively small thickness had a large warp and were likely to crack, and the yields of them were all less than 60%.

Regarding group III nitride semiconductor devices fabricated using BP substrates with a diameter of 75 mm to 125 mm and a thickness of 0.5 μm of the group III nitride film, the devices did not exhibit excellent device characteristics due to the relatively small thickness of the group III nitride film, resulting in lower yields.

In contrast, the yields of the group III nitride semiconductor devices fabricated using BS substrates were higher, namely 69% or more. The BS substrate has a larger thickness of the group III nitride film to allow electric current to be sufficiently distributed, as compared with the BP sub- 11n was subjected to finish polishing under the condition that action coefficient FE was $8.5 \times 10^{-17}$ m²/s; and respective finish-polished group III nitride films 13 had different thicknesses in a range of 110 μm to 130 μm in produced group III nitride composite substrates 1. Support substrate 11 had a thermal conductivity of 5 W·m⁻¹·K⁻¹ and a Young's modulus of 230 GPa.

In a similar manner to Reference Example II-A, for group III nitride composite substrate 1, mean value ms of the RMS of support-substrate 11-side main surface 11n, the ratio $s_S/m_S$ of standard deviation $s_S$ of the RMS to mean value ms of the RMS of support-substrate 11-side main surface 11n, warp W of support-substrate 11-side main surface 11n, and the ratio W/D of warp W of support-substrate 11-side main surface 11n to diameter D were calculated and summarized in Table 15. In a similar manner to Reference Example II-A, the yield of group III nitride semiconductor devices 4 was also calculated and summarized in Table 15.

TABLE 15

| | Reference Example II-D | | | | | | | | | | | | | | | |
|---|---|---|---|---|---|---|---|---|---|---|---|---|---|---|---|---|
| | II-D1 | II-D2 | II-D3 | II-D4 | II-D5 | II-D6 | II-D7 | II-D8 | II-D9 | II-D10 | II-D11 | II-D12 | II-D13 | II-D14 | II-D15 | II-D16 |
| diameter D (mm) | 100 | 100 | 100 | 100 | 100 | 100 | 100 | 100 | 100 | 100 | 75 | 150 | 150 | 150 | 150 | 150 |
| thickness of group III nitride film (μm) | 110 | 110 | 110 | 110 | 110 | 110 | 110 | 110 | 110 | 110 | 130 | 120 | 120 | 120 | 120 | 120 |
| ratio W/D ($\times 10^{-4}$) | −10 | −7 | −4 | −2.5 | −1 | 1.5 | 3 | 5 | 8 | 10 | 2 | −11 | −7 | −2.5 | 8 | 10 |
| $m_s$ (nm) | 3 | 3 | 3 | 3 | 3 | 3 | 3 | 3 | 3 | 3 | 3 | 3 | 3 | 3 | 3 | 3 |

TABLE 15-continued

| | Reference Example II-D | | | | | | | | | | | | | | | |
|---|---|---|---|---|---|---|---|---|---|---|---|---|---|---|---|---|
| | II-D1 | II-D2 | II-D3 | II-D4 | II-D5 | II-D6 | II-D7 | II-D8 | II-D9 | II-D10 | II-D11 | II-D12 | II-D13 | II-D14 | II-D15 | II-D16 |
| ratio $s_s/m_s$ | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |
| device yield (%) | 63 | 70 | 72 | 74 | 75 | 76 | 73 | 72 | 69 | 64 | 74 | 58 | 66 | 72 | 65 | 59 |

Referring to Table 15, group III nitride semiconductor devices manufactured with a high yield were those fabricated using a group III nitride composite substrate with a diameter of 75 mm to 150 mm (this value meets 75 mm or more) including a group III nitride film with a thickness of 110 μm to 130 μm (this value meets 10 μm or more and 250 μm or less), where mean value ms of the RMS of the support-substrate-side main surface was 3 nm (this value meets 0.3 nm or more and 20 nm or less), the ratio $s_s/m_s$ of standard deviation $s_S$ of the RMS to mean value ms of the RMS of the support-substrate-side main surface was 0.1 (this value meets 0.005 or more and 0.4 or less), and the ratio W/D of warp W of support-substrate 11-side main surface 111n to diameter D was $-7 \times 10^{0.4}$ or more and $8 \times 10^4$ or less.

Reference Example II-E

Referring to FIGS. 12 and 15, group III nitride composite substrate 1 and group III nitride semiconductor device 4 were produced in a similar manner to Reference Example II-A, except that: a mullite substrate (with respect to the whole mullite substrate, $Al_2O_3$ was 60% by mole and $SiO_2$ was 40% by mole) was used as support substrate 11; a GaN substrate with high electrical conductivity doped with O (oxygen) atoms and Si (silicon) atoms, having no dislocation concentrated region, having a constant dislocation density of $5 \times 10^6$ cm$^{-2}$, and a carrier concentration of $2 \times 10^{18}$ cm$^{-3}$ was used as group III nitride film donor substrate 13D; support-substrate 11-side main surface 11n was subjected to finish polishing under the condition that action coefficient FE was $8.3 \times 10^{-17}$ m$^2$/s; group III nitride film donor substrate 13D was cut by electrical discharge wire cutting; and group III-nitride-film 13-side main surface 13m was subjected to finish polishing with a slurry containing colloidal silica with a grain size of 20 nm to 400 nm under the condition that action coefficient FE was $4 \times 10^{-14}$ or more and $1 \times 10^{-13}$ or less. Support substrate 11 had a thermal conductivity of 3 W·m$^{-1}$·K$^{-1}$ and a Young's modulus of 200 GPa.

In a similar manner to Reference Example II-A, for finish-polished group III nitride composite substrate 1, mean value ms of the RMS of support-substrate 11-side main surface 11n, and the ratio $s_s/m_s$ of standard deviation $s_S$ of the RMS to mean value ms of the RMS of support-substrate 11-side main surface 11n were calculated and summarized in Table 16.

Further, for finish-polished group III nitride composite substrate 1, mean value $m_{III-N}$ of the RMS of group III-nitride-film 13-side main surface 13m, and the ratio $s_{III-N}/m_{III-N}$ of standard deviation $s_{III-N}$ of the RMS to mean value $m_{III-N}$ of the RMS of group III-nitride-film 13-side main surface 13m are summarized in Table 16. Here, mean value $m_{III-N}$ of the RMS and the ratio $s_{III-N}/m_{III-N}$ of standard deviation $s_{III-N}$ of the RMS to mean value $m_{III-N}$ of the RMS were calculated from the RMS of group III-nitride-film 13-side main surface 13m at 13 measurement points P on group III-nitride-film 13-side main surface 13m shown in FIG. 7 constituted of: one central point $P_C$; four outer points $P_O$ located respectively in the four directions with respect to central point $P_C$ that are orthogonal to each other, the outer points each being located at 5 mm inward from the outer edge; and eight middle points $P_M$ including four middle points each between the one central point $P_C$ and one of the four outer points $P_O$ and four middle points each between two of the four outer points $P_O$.

Further, in a similar manner to Reference Example II-A, the yield of group III nitride semiconductor devices 4 was calculated and summarized in Table 16.

TABLE 16

| Reference Example II-E | II-E1 | II-E2 | II-E3 | II-E4 | II-E5 | II-E6 | II-E7 | II-E8 | II-E9 | II-E10 | II-E11 | II-E12 | II-E13 |
|---|---|---|---|---|---|---|---|---|---|---|---|---|---|
| $m_{III-N}$ (nm) | 0.15 | 0.4 | 0.8 | 1 | 1.6 | 2 | 3 | 0.15 | 3 | 4 | 4.5 | 3 | 2.5 |
| ratio $s_{III-N}/m_{III-N}$ | 0.008 | 0.02 | 0.05 | 0.1 | 0.2 | 0.4 | 0.5 | 0.5 | 0.008 | 0.5 | 0.008 | 0.7 | 0.8 |
| $m_s$ (nm) | 2 | 2 | 2 | 2 | 2 | 2 | 2 | 2 | 2 | 2 | 2 | 2 | 2 |
| ratio $s_s/m_s$ | 0.12 | 0.12 | 0.12 | 0.12 | 0.12 | 0.12 | 0.12 | 0.12 | 0.12 | 0.12 | 0.12 | 0.12 | 0.12 |
| device yield (%) | 80 | 80 | 75 | 72 | 68 | 63 | 59 | 62 | 60 | 52 | 51 | 53 | 54 |

Referring to Table 16, group III nitride semiconductor devices manufactured with a high yield were those fabricated using a group III nitride composite substrate with a diameter of 75 mm (this value meets 75 mm or more) including a group III nitride film with a thickness of 110 μm (this value meets 10 μm or more and 250 μm or less), where mean value ms of the RMS of the support-substrate-side main surface was 2 nm (this value meets 0.3 nm or more and 20 nm or less), the ratio $s_s/m_s$ of standard deviation $s_S$ of the RMS to mean value ms of the RMS of the support-substrate-side main surface was 0.12 (this value meets 0.005 or more and 0.4 or less), mean value $m_{III-N}$ of the RMS of the group III-nitride-film-side main surface was 0.15 nm or more and 3 nm or less, and the ratio $s_{III-N}/m_{III-N}$ of standard deviation $s_{III-N}$ of the RMS to mean value $m_{III-N}$ of the RMS of the group III-nitride-film-side main surface was 0.008 or more and 0.5 or less.

Reference Example II-F

1. Fabrication of Group III Nitride Composite Substrate

Referring to FIG. 12, group III nitride composite substrates 1 were fabricated in a similar manner to Reference Example II-A, except that: an $Al_2O_3$—$SiO_2$ composite oxide substrate, a mullite substrate (with respect to the whole substrate, $Al_2O_3$ was 60% by mole and $SiO_2$ was 40% by mole), and a mullite-YSZ substrate (with respect to the whole substrate, mullite was 70% by mass and YSZ was 30% by mass, with respect to mullite, $Al_2O_3$ was 60% by mole and $SiO_2$ was 40% by mole and, with respect to YSZ, $ZrO_2$ was 90% by mole and $Y_2O_3$ was 10% by mole) were each used as support substrate 11; a semi-insulating GaN substrate doped with Fe (iron) atoms and having an electrical resistance (also referred to as specific resistance) of $2\times10^5$ Ωcm was used as group III nitride film donor substrate 13D, the group III nitride film donor substrate was cut with a wire saw using loose abrasive grains; support-substrate 11-side main surface 11n was subjected to finish polishing under the condition that action coefficient FE was $8.7\times10^{-17}$ m²/s; and the group III nitride composite substrates were fabricated with different diameters in a range of 75 mm to 150 mm.

2. Fabrication of Group III Nitride Semiconductor Device

Referring to FIG. 10, in the present reference example, an HEMT was fabricated as group III nitride semiconductor device 4. On main surface 13m of group III nitride film 13 of group III nitride composite substrate 1, GaN layer 26 having a thickness of 1.5 μm and $Al_{0.2}Ga_{0.8}N$ layer 27 having a thickness of 30 nm were successively epitaxially grown by the MOVPE method to form group III nitride layer 20, to thereby produce laminated group III nitride composite substrate 2.

Next, on $Al_{0.2}Ga_{0.8}N$ layer 27, a source electrode 60 and a drain electrode 70 were fabricated by photolithography, EB deposition, and lift-off. In these electrodes, a Ti layer having a thickness of 20 nm, an Al layer having a thickness of 100 nm, a Ti layer having a thickness of 20 nm, and an Au layer having a thickness of 300 nm were successively formed, lifted off, and annealed for 1 minute at 600° C. into an alloy.

Next, in a similar step to the step of forming source electrode 60 and drain electrode 70, a gate electrode 80 was formed. For formation of gate electrode 80, an Ni layer having a thickness of 50 nm and an Au layer having a thickness of 500 nm were successively formed. The gate length was set to 2 μm.

In the HEMT which was group III nitride semiconductor device 4 obtained in this way, GaN layer 26 and $Al_{0.2}Ga_{0.8}N$ layer 27 were formed as at least one group III nitride layer 20 on group III nitride film 13 of group III nitride composite substrate 1, and source electrode 60, drain electrode 70, and gate electrode 80 were disposed on $Al_{0.2}Ga_{0.8}N$ layer 27 so that the electrodes were separated from each other and gate electrode 80 was located between source electrode 60 and drain electrode 70.

In a similar manner to Reference Example II-A, for group III nitride composite substrate 1, mean value ms of the RMS of support-substrate 11-side main surface 11n and the ratio $s_S/m_S$ of standard deviation $s_S$ of the RMS to mean value ms of the RMS of support-substrate 11-side main surface 11n were calculated and summarized in Table 17. Further, thermal expansion coefficient $\alpha_S$ of support substrate 11 and thermal expansion coefficient $\alpha_{III-N}$ of group III nitride film 13 were measured with a thermomechanical analysis apparatus, the ratio $\alpha_{III-N}/\alpha_S$ of thermal expansion coefficient $\alpha_{III-N}$ of the group III nitride film to thermal expansion coefficient $\alpha_S$ of the support substrate was calculated, and the results were summarized in Table 17. Further, thickness $t_S$ of support substrate 11 and thickness $t_{III-N}$ of group III nitride film 13 were measured with a digital indicator, the ratio $t_{III-N}/t_S$ of thickness $t_{III-N}$ of group III nitride film 13 to thickness $t_S$ of support substrate 11 was calculated, and the results were summarized in Table 17.

In the following way, the yield of group III nitride semiconductor devices 4 was also calculated. Specifically, HEMTs which were group III nitride semiconductor devices 4 were classified into non-defective devices meeting a standard that the leakage gate current density was $1\times10^{-6}$ A/cm² or less when being applied with a gate voltage of 5 V, and defective devices failing to meet this standard, and the percentage of the ratio determined by dividing the non-defective devices by the sum of the non-defective devices and the defective devices was defined as a yield.

TABLE 17

| Reference Example II-F | II-F1 | II-F2 | II-F3 | II-F4 | II-F5 | II-F6 | II-F7 | II-F8 | II-F9 | II-F10 | II-F11 | II-F12 | II-F13 | II-F14 |
|---|---|---|---|---|---|---|---|---|---|---|---|---|---|---|
| diameter D (mm) | 75 | 75 | 75 | 75 | 75 | 100 | 100 | 100 | 100 | 100 | 100 | 100 | 150 | 150 |
| type of support substrate | | $Al_2O_3$—$SiO_2$ | | | | | mullite-YSZ | | | $Al_2O_3$—$SiO_2$ | | | mullite | $Al_2O_3$—$SiO_2$ |
| ratio $\alpha_{III-N}/\alpha_S$ | 1 | 1 | 1 | 1 | 1 | 1 | 1 | 1 | 1.25 | 0.9 | 0.75 | 1.2 | 1.2 | 1 |
| ratio $t_{III-N}/t_S$ | 0.02 | 0.1 | 0.3 | 0.6 | 1 | 0.4 | 0.4 | 1 | 0.4 | 0.4 | 0.4 | 0.3 | 0.2 | 0.2 |
| $m_s$ (nm) | 1.5 | 1.5 | 1.5 | 1.5 | 1.5 | 1.5 | 1.5 | 1.5 | 1.5 | 1.5 | 1.5 | 1.5 | 1.5 | 1.5 |
| ratio $s_s/m_s$ | 0.1 | 0.1 | 0.1 | 0.1 | 0.1 | 0.1 | 0.1 | 0.1 | 0.1 | 0.1 | 0.1 | 0.1 | 0.1 | 0.1 |
| device yield (%) | 62 | 65 | 75 | 66 | 64 | 76 | 72 | 63 | 63 | 70 | 62 | 64 | 63 | 69 |

Referring to Table 17, group III nitride semiconductor devices fabricated with a high yield were those using group III nitride composite substrate 1 in which, regardless of whether the $Al_2O_3$—$SiO_2$ composite oxide substrate, the mullite substrate, or the mullite-YSZ substrate was used as support substrate 11, the thickness of the group III nitride film of the composite substrate was 110 μm (this value meets 10 μm to 250 μm), the diameter of the composite substrate was 75 mm to 150 mm, mean value ms of the RMS of the support-substrate-side main surface was 1.5 nm (this value meets 0.3 nm or more and 20 nm or less), and the ratio $s_S/m_S$ of standard deviation $s_S$ of the RMS to mean value ms of the RMS of the support-substrate-side main surface was 0.1 (this value meets 0.005 or more and 4.0 or less). Group III nitride semiconductor devices fabricated with a high yield were also those in which the ratio $\alpha_{III-N}/\alpha_S$ of thermal expansion coefficient $\alpha_{III-N}$ of group III nitride film 13 to thermal expansion coefficient as of support substrate 11 was 0.75 or more and 1.25 or less, and the ratio $t_{III-N}/t_S$ of thickness $t_{III-N}$ of the group III nitride film to thickness $t_S$ of support substrate 11 was 0.02 or more and 1 or less.

Reference Example II-G

Referring to FIG. 12, group III nitride composite substrate 1 was fabricated in a similar manner to Reference Example II-A, except that: an $Al_2O_3$—$SiO_2$ composite oxide substrate (with respect to the whole substrate, $Al_2O_3$ was 88% by mass and $SiO_2$ was 12% by mass) was used as support substrate 11; support substrate 11 was subjected to grinding and finish polishing under the condition that action coefficient FE was $5.9 \times 10^{-17}$ m²/s to thereby have a thickness of 250 µm; group III nitride composite substrates 1 were fabricated with different diameters in a range of 75 mm to 150 mm; and obtained group III nitride composite substrate 1 was further cleaned. Here, support substrate 11 had a thermal conductivity of 15 W·m⁻¹·K⁻¹ and a Young's modulus of 270 GPa. Regarding the cleaning method, a combination of scrub cleaning with a surfactant and pure water, two-fluid cleaning with hydrochloric acid or TMAH (tetramethylammonium hydroxide) and pure water, and megasonic cleaning with hydrochloric acid or TMAH and pure water was used.

2. Fabrication of Group III Nitride Semiconductor Device

Referring to FIG. 11, in the present reference example, an SBD was fabricated as group III nitride semiconductor device 4. On main surface 13m of group III nitride film 13 of group III nitride composite substrate 1 shown in FIG. 6, the MOVPE method was used to epitaxially grow n⁺-GaN layer 28 (having a carrier concentration of $2 \times 10^{18}$ cm⁻³) with a thickness of 2 µm and n⁻-GaN layer 29 (having a carrier concentration of $5 \times 10^{15}$ cm⁻³) with a thickness of 7 µm in this order to form group III nitride layer 20, and accordingly a laminated group III nitride composite substrate was obtained.

Next, on n⁻-GaN layer 29, an Ni layer having a thickness of 4 nm and an Au layer having a thickness of 200 nm were successively formed by the EB (Electron Beam) deposition method, and annealed into an alloy, to thereby form first electrode 30 serving as a Schottky electrode. The diameter of the electrode was set to 200 µm. On first electrode 30, a Ti layer having a thickness of 200 nm, a Pt layer having a thickness of 100 nm, and an Au layer having a thickness of 1000 nm were successively formed by the EB deposition method to thereby form a pad electrode (not shown).

From the laminated group III nitride composite substrate, the support substrate and the joint film were removed by grinding. For the grinding, a vitrified grinding wheel containing diamond abrasive grains having an average grain size of 40 µm to 50 µm was used.

Referring to FIG. 11, on main surface 13n of group III nitride film 13 having been exposed by removal of the support substrate and the joint film from the laminated group III nitride substrate, a Ti layer having a thickness of 20 nm, an Al layer having a thickness of 200 nm, and an Au layer having a thickness of 300 nm were successively formed by the EB deposition method, and then annealed to form second electrode 50 serving as an ohmic electrode. In this way, group III nitride semiconductor device 4 serving as an SBD was obtained.

In a similar manner to Reference Example II-A, for group III nitride composite substrate 1, mean value ms of the RMS of support-substrate 11-side main surface 11n was calculated and summarized in Table 18. Further, for group III nitride composite substrate 1, the concentration of impurity metal atoms in group III-nitride-film 13-side main surface 13m was measured by the TXRF (total reflection x-ray fluorescence) method and summarized in Table 18. Here, the measurements by the TXRF method were done by means of a tungsten (W) x-ray source under a condition that the angle of incidence was 0.05°.

In the following way, the yield of group III nitride semiconductor devices 4 was also calculated. Specifically, for SBDs which were group III nitride semiconductor devices 4, current-voltage characteristics in the reverse direction were measured. The SBDs were classified into non-defective devices meeting a standard that the breakdown voltage of the SBD was 300 V or more and defective devices failing to meet this standard, and the percentage of the ratio determined by dividing the non-defective devices by the sum of the non-defective devices and the defective devices was defined as a yield. The yield of the group III nitride semiconductor devices is summarized in Table 18.

TABLE 18

| Reference Example II-G | II-G1 | II-G2 | II-G3 | II-G4 | II-G5 | II-G6 | II-G7 | II-G8 |
|---|---|---|---|---|---|---|---|---|
| diameter D (mm) | 75 | 75 | 75 | 75 | 75 | 100 | 100 | 150 |
| concentration of impurity metal atoms ($\times 10^{10}$ atoms/cm²) | 10 | 100 | 300 | 1000 | 2000 | 8 | 100 | 10 |
| $m_s$ (nm) | 3.2 | 3.2 | 3.2 | 3.2 | 3.2 | 3.2 | 3.2 | 3.2 |
| ratio $s_s/m_s$ | 0.25 | 0.25 | 0.25 | 0.25 | 0.25 | 0.25 | 0.25 | 0.25 |
| device yield (%) | 70 | 68 | 65 | 63 | 58 | 69 | 65 | 69 |

Referring to Table 18, group III nitride semiconductor devices fabricated with a high yield were those using a group III nitride composite substrate with a diameter of 75 mm (this value meets 75 mm or more) including a group III nitride film with a thickness of 110 µm, where the concentration of impurity metal atoms in the group III-nitride-film-side main surface was $3 \times 10^{12}$ atoms/cm² or less.

Reference Example II-H

Referring to FIGS. 14 and 15, group III nitride composite substrate 1 and group III nitride semiconductor device 4 were fabricated in a similar manner to Reference Example II-A except that: a substrate having a diameter of 75 mm and a thermal conductivity between 2 W·m⁻¹·K⁻¹ and 300 W·m⁻¹·K⁻¹ was used as support substrate 11; grinding and polishing were performed from main surface 13m opposite to the bonded main surface of group III nitride film donor substrate 13D with a diameter of 75 mm to thereby allow group III nitride film 13 to have a thickness of 110 µm; and support-substrate 11-side main surface 11n was finish-polished under the condition that action coefficient FE was $9.0 \times 10^{-7}$ m²/s. Here, for grinding of group III nitride film donor substrate 13D, vitrified abrasive grains including diamond abrasive grains having an average grain size of 25 µm to 35 µm were used. The thermal conductivity of support substrate 11 was obtained by adjusting the oxide material content and the sintering conditions.

In a similar manner to Reference Example II-A, the yield of group III nitride semiconductor devices 4 was calculated and summarized in Table 19.

TABLE 19

| Reference Example II-H | II-H1 | II-H2 | II-H3 | II-H4 | II-H5 | II-H6 | II-H7 | II-H8 | II-H9 |
|---|---|---|---|---|---|---|---|---|---|
| thermal conductivity of support substrate $\lambda_S$ ($W \cdot m^{-1} \cdot K^{-1}$) | 2 | 3 | 5 | 10 | 30 | 120 | 210 | 280 | 300 |
| $m_s$ (nm) | 2.5 | 2.5 | 2.5 | 2.5 | 2.5 | 2.5 | 2.5 | 2.5 | 2.5 |
| ratio $s_s/m_s$ | 0.08 | 0.08 | 0.08 | 0.08 | 0.08 | 0.08 | 0.08 | 0.08 | 0.08 |
| device yield (%) | 55 | 63 | 65 | 67 | 67 | 66 | 64 | 61 | 55 |

Referring to Table 19, group III nitride semiconductor devices fabricated with a high yield were those using a group III nitride composite substrate with a diameter of 75 mm (this value meets 75 mm or more) including a group III nitride film with a thickness of 110 μm (this value meets 10 μm or more and 250 μm or less) and including a support substrate having a thermal conductivity of 3 $W \cdot m^{-1} \cdot K^{-1}$ or more and 280 $W \cdot m^{-1} \cdot K^{-1}$ or less.

Reference Example III-A to Reference Example III-D according to Reference Invention III will be illustrated below.

(1) Fabrication of Group III Nitride Composite Substrate

Reference Example III-A

In the following, with reference to FIG. 12, a group III nitride composite substrate according to the reference example will be described.

First, as shown in FIG. 12 (A), an $Al_2O_3$—$SiO_2$ composite oxide substrate (with respect to the whole substrate, $Al_2O_3$ was 85% by mass and $SiO_2$ was 15% by mass) having a diameter of 75 mm and a thickness of 300 μm was prepared for use as support substrate 11. Support substrate 11 had a thermal conductivity of 10 $W \cdot m^{-1} \cdot K^{-1}$ and a Young's modulus of 250 GPa.

Subsequently, main surfaces 11m, 11n of the two opposite sides respectively of support substrate 11 were subjected to rough polishing with a copper-based surface plate, intermediate polishing with a tin-based surface plate, and finish polishing with a nonwoven polishing pad, for which a diamond slurry was used as an abrasive. The finish polishing was performed under the condition that action coefficient FE was $4 \times 10^{-17}$ m²/s or more and $1 \times 10^{-16}$ m²/s or less.

Next, on finish-polished main surface 11m of support substrate 11, an $SiO_2$ film of 800 nm in thickness was grown by the PE-CVD (Plasma Enhanced-Chemical Vapor Deposition) method, and annealed in a nitrogen atmosphere at 800° C. for an hour.

Next, CMP using a slurry with a pH of 10 containing colloidal silica abrasive grains having an average grain size of 40 nm was performed to thereby form joint film 12a of 400 nm in thickness having its main surface 12am mirror-finished so that the RMS (root mean square roughness) was 0.3 nm or less. Subsequently, in order to remove the colloidal silica abrasive grains used for the CMP, non-abrasive polishing cleaning with a KOH aqueous solution, polishing cleaning with pure water, and megasonic cleaning (cleaning with ultrasonic waves in a megasonic frequency range of 500 kHz to 5 MHz) with pure water were performed.

As shown in FIG. 12 (B), a GaN crystal body having a diameter of 75 mm and a thickness of 8 mm was prepared for use as group III nitride film donor substrate 13D. Subsequently, a surface-to-be-bonded of group III nitride film donor substrate 13D was subjected to mechanical polishing and CMP so that it was planarized to have an RMS of 2 nm or less. An $SiO_2$ film of 800 nm in thickness was grown thereon by the PE-CVD method, and annealing was performed in a nitrogen atmosphere at 800° C. for an hour. Subsequently, CMP using a slurry with a pH of 10 containing colloidal silica abrasive grains having an average grain size of 40 nm was performed to thereby form joint film 12b of 500 nm in thickness having its main surface 12bn mirror-finished so that the RMS was 0.3 nm or less. Subsequently, in order to remove the colloidal silica abrasive grains used for the CMP, non-abrasive polishing cleaning with a KOH aqueous solution, polishing cleaning with pure water, and megasonic cleaning with pure water were performed.

Here, group III nitride film donor substrate 13D was produced through growth by the HVPE method using a GaAs substrate as a base substrate. Group III nitride film donor substrate 13D had its electrical conductivity of n-type, its dislocation density of $1 \times 10^8$ cm⁻², and its carrier concentration of $1 \times 10^{17}$ cm⁻³.

Next, as shown in FIG. 12 (C), main surface 12am of joint film 12a and main surface 12bn of joint film 12b were bonded together to thereby produce joined substrate 1L in which support substrate 11 and group III nitride film 13 were bonded to each other with joint film 12 interposed therebetween. After they were bonded together, joined substrate 1L was annealed by being heated in a nitrogen gas atmosphere to 800° C., to thereby increase the joint strength.

Next, as shown in FIG. 12 (D), group III nitride film donor substrate 13D in joined substrate 1L was cut, with a wire saw, along a plane located inwardly at a depth of 40 μm from the bonded surface where group III nitride film donor substrate 13D was bonded to joint film 12, to thereby produce group III nitride composite substrate 1 in which support substrate 11 and group III nitride film 13 which was a GaN thin film were bonded together with joint film 12 interposed therebetween.

As the wire, a fixed-abrasive wire with a diameter of 180 μm on which diamond abrasive grains were electrodeposited was used. As for the cutting method, in order to reduce the cut resistance and enhance the thickness precision and the flatness of the cut plane, the method was used that caused the wire to swing and caused group III nitride film donor substrate 13D to vibrate in synchronization therewith. The resistance coefficient for cutting with the wire saw was set to 4200 N.

After cutting, group III nitride film 13 of group III nitride composite substrate 1 was subjected to mechanical polishing and CMP. At this time, a diamond slurry was used as an abrasive, and rough polishing with a copper-based surface plate and intermediate polishing with a tin-based surface plate were performed. Further, a colloidal silica slurry with pH 11 (a slurry of pH 11 containing colloidal silica abrasive grains having an average grain size of 60 nm) was used to perform finish polishing with a nonwoven polishing pad. In order to make the thickness of group III nitride film 13 uniform, the composite substrate was mounted on the apparatus for the CMP, by a method according to which the shape of the substrate was corrected in advance by vacuum chuck suction, and thereafter the composite substrate was suction-fixed onto the apparatus. The finish polishing was performed under the condition that action coefficient FE was $7 \times 10^{-14}$ m²/s. The thickness of finish-polished group III nitride film 13 was 110 µm.

[(2) Fabrication of Group III Nitride Semiconductor Device]

In the following, with reference to FIG. 16, an SBD (Schottky Barrier Diode) which is a group III nitride semiconductor device according to the reference example will be described.

Figure 16:
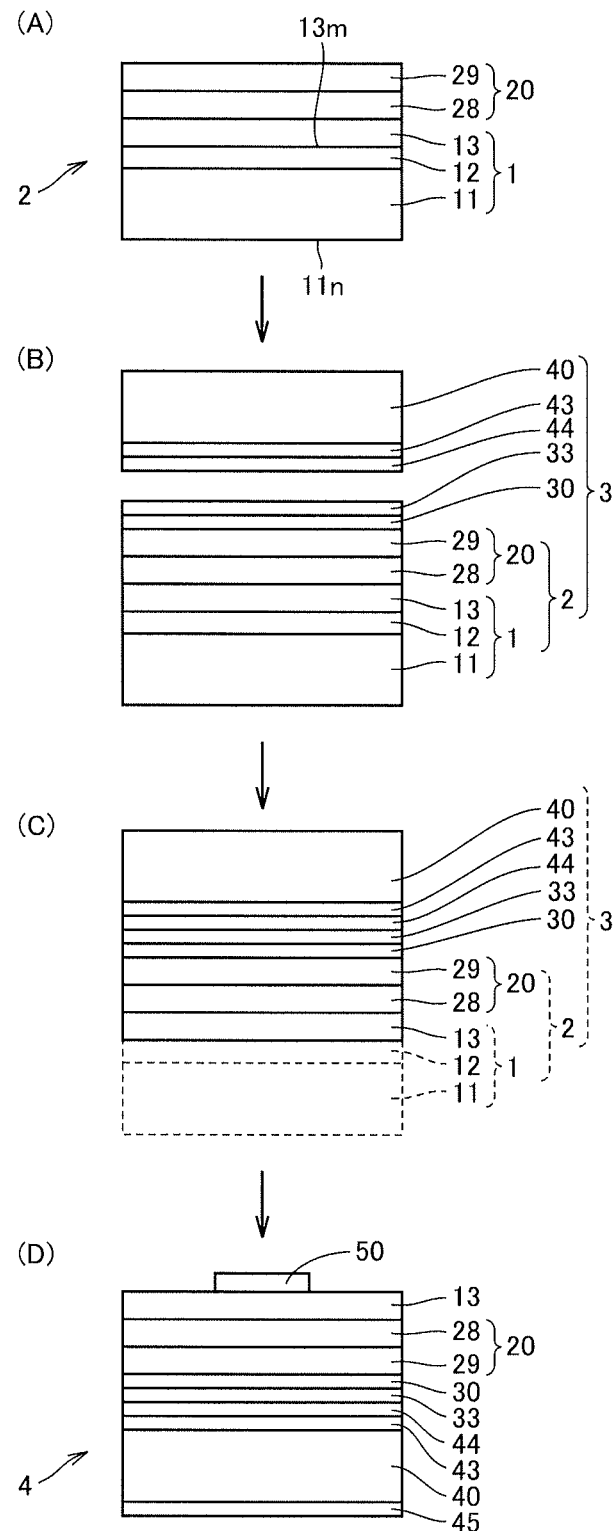
FIG. 16 is a schematic cross-sectional view showing another example of the method for manufacturing a group III nitride semiconductor device according to the reference invention.

First, as shown in FIG. 16 (A), on group III-nitride-film 13-side main surface 13m of group III nitride composite substrate 1, the MOVPE method was used to epitaxially grow $n^+$-GaN layer 28 (having a carrier concentration of $2 \times 10^{18}$ cm$^{-3}$) with a thickness of 2 µm and $n^-$-GaN layer 29 (having a carrier concentration of $5 \times 10^{15}$ cm$^{-3}$) with a thickness of 7 µm in this order to form group III nitride layer 20, and accordingly laminated group III nitride composite substrate 2 was obtained.

Next, as shown in FIG. 16 (B), on $n^-$-GaN layer 29 which was the topmost layer of group III nitride layer 20 of laminated group III nitride composite substrate 2, an Ni layer having a thickness of 4 nm and an Au layer having a thickness of 200 nm were successively formed by the electron beam deposition method (hereinafter also referred to as EB (Electron Beam) deposition method), and annealed into an alloy, to thereby form first electrode 30 serving as a Schottky electrode. At this time, the diameter of first electrode 30 was set to 200 µm. Further, on first electrode 30, a Ti layer having a thickness of 200 nm, a Pt layer having a thickness of 100 nm, and an Au layer having a thickness of 1000 nm were successively formed by the EB deposition method to thereby form a pad electrode 33.

As device support substrate 40, an Mo substrate was prepared. On device support substrate 40, a Ti layer having a thickness of 200 nm, a Pt layer having a thickness of 100 nm, and an Au layer having a thickness of 1000 nm were successively formed by the EB deposition method to thereby form pad electrode 43. On pad electrode 43, an AuSn solder film was formed as joint metal film 44.

Next, joint metal film 44 was bonded to pad electrode 33 to thereby produce laminated substrate 3.

Next, as shown in FIG. 16 (C), from laminated substrate 3, support substrate 11 and joint film 12 in group ITT nitride composite substrate 1 were etched away by means of hydrofluoric acid.

Next, as shown in FIG. 16 (D), on group III nitride film 13 having been exposed by removal of support substrate 11 and joint film 12 from laminated substrate 3, a Ti layer having a thickness of 20 nm, an Al layer having a thickness of 200 nm, and an Au layer having a thickness of 300 nm were successively formed by the EB deposition method, and then annealed to form second electrode 50 which was an ohmic electrode. On device support substrate 40, a Ti layer having a thickness of 20 nm and an Au layer having a thickness of 300 nm were successively formed by the EB deposition method, and annealed to thereby form device support substrate electrode 45. In this way, group III nitride semiconductor device 4 which was an SBD was obtained.

The yield of group III nitride semiconductor devices 4 thus obtained was calculated in the following way. Specifically, for SBDs, current-voltage characteristics in the reverse direction were measured. The SBDs were classified into non-defective devices meeting a standard that the breakdown voltage was 250 V or more and defective devices failing to meet this standard, and the percentage of the ratio determined by dividing the non-defective devices by the sum of the non-defective devices and the defective devices was defined as a yield.

In accordance with the method as described above, group III nitride composite substrates each including the joint film having a thickness variation shown in Table 20, and group III nitride semiconductor devices for which the composite substrates were used were fabricated.

These group III nitride composite substrates were each a composite substrate having a diameter of 75 mm (namely 75 mm or more) in which a support substrate and a group III nitride film having a thickness of 110 µm (namely 10 µm or more and 250 µm or less) were bonded to each other.

A relation between the thickness variation of the joint film and the yield of the group III nitride semiconductor devices calculated by the above-described method is shown in Table 20.

TABLE 20

| Reference Example III-A | III-A1 | III-A2 | III-A3 | III-A4 | III-A5 | III-A6 | III-A7 |
|---|---|---|---|---|---|---|---|
| thickness variation of joint film (%) | 1 | 2 | 5 | 13 | 25 | 40 | 47 |
| device yield (%) | 35 | 69 | 77 | 84 | 76 | 71 | 33 |

As clearly seen from Table 20, the yield of the semiconductor devices (III-A2 to III-A6) in which group III nitride composite substrates each having a thickness variation of the joint film of 2% or more and 40% or less were used was higher than that of the semiconductor devices (III-A1 and III-A7) in which group III nitride composite substrates failing to satisfy this condition were used.

Reference Example III-B

In a similar manner to Reference Example III-A, group III nitride composite substrates each including a support substrate and a group III nitride film joined to each other with the shear joint strength and the ratio of the joint area shown in Table 21, and group III nitride semiconductor devices for which these composite substrates were used were fabricated.

These group III nitride composite substrates were each a composite substrate having a diameter of 75 mm (namely 75 mm or more) in which a support substrate and a group III nitride film having a thickness of 110 µm (namely 10 µm or more and 250 µm or less) were bonded to each other.

A relation between the shear joint strength and the ratio of the joint area and the yield of the group III nitride semiconductor devices calculated by the above-described method is shown in Table 21.

TABLE 21

| Reference Example III-B | III-B1 | III-B2 | III-B3 | III-B4 | III-B5 | III-B6 | III-B7 | III-B8 | III-B9 |
|---|---|---|---|---|---|---|---|---|---|
| shear joint strength (MPa) | 2 | 4 | 4 | 10 | 30 | 33 | 40 | 40 | 60 |
| ratio of joint area (%) | 80 | 60 | 99 | 70 | 90 | 51 | 60 | 99 | 99 |
| device yield (%) | 25 | 66 | 69 | 75 | 84 | 39 | 64 | 74 | 56 |

As clearly seen from Table 21, the yield of the semiconductor devices (III-B2 to III-B5, III-B7, and m-B8) in which used group III nitride composite substrates each having a shear joint strength between the support substrate and the group III nitride film of 4 MPa or more and 40 MPa or less and a ratio of the joint area between the support substrate and the group III nitride film of 60% or more and 99% or less was higher than that of the semiconductor devices (III-B1, III-B6, and III-B9) in which group III nitride composite substrates failing to satisfy this condition were used.

Reference Example III-C

In a similar manner to Reference Example III-A except for the following conditions (i) to (v), group III nitride composite substrates according to Reference Example III-C and group III nitride semiconductor devices for which these composite substrates were used were fabricated:

(i) a composite oxide substrate selected from an $Al_2O_3$—$SiO_2$ composite oxide substrate (composite oxide substrate in which, with respect to the whole substrate, $Al_2O_3$ was 82% by mass and $SiO_2$ was 18% by mass), a mullite-YSZ substrate, and a mullite substrate was used as support substrate 11;

(ii) different diameters in a range of 75 mm to 150 mm were used;

(iii) joint film 12 was grown by the AP-CVD (Atmospheric Pressure-Chemical Vapor Deposition) method;

(iv) support-substrate 11-side main surface 11*n* was finish-polished under the condition that action coefficient FE was $8.5 \times 10^{-17}$ m²/s or more and $1 \times 10^{-16}$ m²/s or less; and (v) finish-polished group III nitride films 13 having different thicknesses in a range of 10 μm to 250 μm were used.

It should be noted that the thickness variations of the joint films in group III nitride composite substrates in Reference Example III-C were all 5% (namely 2% or more and 40% or less).

The relation between the characteristics of the group III nitride composite substrates in Reference Example III-C and the yield of group III nitride semiconductor devices for which the composite substrates are used is shown in Table 22.

TABLE 22

| | Reference Example III-C | | | | | | | | | | | | |
|---|---|---|---|---|---|---|---|---|---|---|---|---|---|
| | III-C1 | III-C2 | III-C3 | III-C4 | III-C5 | III-C6 | III-C7 | III-C8 | III-C9 | III-C10 | III-C11 | III-C12 | III-C13 |
| diameter (mm) | 75 | 75 | 75 | 75 | 100 | 100 | 100 | 100 | 100 | 100 | 100 | 150 | 150 |
| type of support substrate | | $Al_2O_3$—$SiO_2$ | | | | mullite-YSZ | | | $Al_2O_3$—$SiO_2$ | | | mullite | $Al_2O_3$—$SiO_2$ |
| $\alpha_{III-N}/\alpha_S$(—) | 1 | 1 | 1 | 1 | 1 | 1 | 1 | 1.25 | 0.9 | 0.75 | 1.2 | 1.2 | 1 |
| $t_{III-N}/t_S$(—) | 0.02 | 0.1 | 0.3 | 0.6 | 1 | 0.4 | 0.9 | 1 | 1 | 1 | 0.4 | 1 | 0.2 |
| thickness variation of joint film (%) | 5 | 5 | 5 | 5 | 5 | 5 | 5 | 5 | 5 | 5 | 5 | 5 | 5 |
| device yield (%) | 62 | 70 | 72 | 69 | 69 | 76 | 65 | 68 | 75 | 67 | 60 | 55 | 69 |

In Table 22, $\alpha_{III-N}/\alpha_S$ represents the ratio of thermal expansion coefficient $\alpha_{III-N}$ of the group III nitride film to thermal expansion coefficient $\alpha_S$ of the support substrate, and $t_{III-N}/t_S$ represents the ratio of thickness $t_{III-N}$ of the group III nitride film to thickness $t_S$ of the support substrate.

As clearly seen from Table 22, among the group III nitride composite substrates having a diameter of 75 mm or more and including the support substrate and the group III nitride film with a thickness of 10 μm or more and 250 μm or less that were bonded to each other, where the joint film had a thickness variation of 5% (namely 2% or more and 40% or less), group III nitride composite substrates having $t_{III-N}/t_S$ of 0.02 or more and 1 or less could be used to manufacture group III nitride semiconductor devices with a particularly high yield.

In addition to the above, in the composite substrates having $\alpha_{III-N}/\alpha_S$ of 0.75 or more and 1.25 or less, crack did not occur at all, and their yield was also high.

Reference Example III-D

In a similar manner to Reference Example III-A except that a support substrate having thermal conductivity $\lambda_S$ shown in Table 23 was used, group III nitride composite substrates and group III nitride semiconductor devices for which these composite substrates were used were fabricated.

The relation between thermal conductivity $\lambda_S$ of the support substrate and the yield of group III nitride semiconductor devices is shown in Table 23.

TABLE 23

| Reference Example III-D | III-D1 | III-D2 | III-D3 | III-D4 | III-D5 | III-D6 | III-D7 | III-D8 | III-D9 |
|---|---|---|---|---|---|---|---|---|---|
| thermal conductivity of support substrate $\lambda_S$ (W·m$^{-1}$·K$^{-1}$) | 2 | 3 | 5 | 10 | 30 | 120 | 210 | 280 | 300 |
| thickness variation of joint film (%) | 5 | 5 | 5 | 5 | 5 | 5 | 5 | 5 | 5 |
| device yield (%) | 55 | 63 | 65 | 67 | 67 | 66 | 64 | 61 | 55 |

As clearly seen from Table 23, among the group III nitride composite substrates having a diameter of 75 mm (namely 75 mm or more) and including the support substrate and the group III nitride film with a thickness of 110 μm (namely 10 μm or more and 250 μm or less) that were bonded to each other, where the joint film had a thickness variation of 5% (namely 2% or more and 40% or less), group III nitride composite substrates having a thermal conductivity $\lambda_S$ of 3 W·m$^{-1}$·K$^{-1}$ or more and 280 W·m$^{-1}$·K$^{-1}$ or less could be used to manufacture group III nitride semiconductor devices with a particularly high yield.

It should be construed that the embodiments and examples disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST

1 group III nitride composite substrate; 1L, 1LS joined substrate; 2 laminated group III nitride composite substrate; 3 laminated substrate; 4 group III nitride semiconductor device; 5D, 5Dr support-incorporated group III nitride film donor substrate; 11 support substrate; 11*m*, 11*n*, 12*am*, 12*bn*, 13*m*, 13*n* main surface; 12, 12*a*, 12*b*, 14 joint film; 13 group III nitride film; 13D, 13Dr group III nitride film donor substrate; 13*h* main-surface through hole; 13*i* ion implantation region; 15 group III nitride film donor substrate support; 20 group III nitride layer; 21 n-GaN layer; 22 n-In$_{0.05}$Ga$_{0.95}$N layer; 23 active layer; 24 p-Al$_{0.09}$Ga$_{0.91}$N layer; 25 p-GaN layer; 26 GaN layer; 27 Al$_{0.2}$Ga$_{0.8}$N layer; 28 n$^+$-GaN layer; 29 n$^-$-GaN layer; 30 first electrode; 33, 43 pad electrode; 40 device support substrate; 44 joint metal film; 45 device support substrate electrode; 50 second electrode; 60 source electrode; 70 drain electrode; 80 gate electrode; 100 joint interface; 100*b* joined region; 100*n* non-joined region; 111*n*, 112*n*, 121*n*, 122*n* non-joined partial region; 201 first-conductivity-type GaN layer; 202 first-conductivity-type Al$_s$Ga$_{1-s}$N layer; 203 light emission layer; 204 second-conductivity-type Al$_t$Ga$_{1-t}$N layer; 205 second-conductivity-type GaN layer

The invention claimed is:

1. A group III nitride composite substrate with a diameter of 75 mm or more including a support substrate and a group III nitride film having a thickness of 10 μm or more and 250 μm or less that are indirectly bonded to each other,
   wherein a joint film is interposed between the support substrate and the group III nitride film and joining the support substrate and the group III nitride film to each other,
   a shear joint strength between the support substrate and the group III nitride film being 4 MPa or more and 40 MPa or less, determined by a method in accordance with JIS K 6850,
   a ratio of a joint area between the support substrate and the group II nitride film being 60% or more and 99% or less, determined by calculating a sum of areas detected as joint defects (void or peeling), dividing the sum by an area of a main surface of the support substrate, and multiplying the quotient by 100%.

2. A group III nitride composite substrate with a diameter of 75 mm or more including a support substrate and a group III nitride film having a thickness of 10 μm or more and 250 μm or less that are indirectly bonded to each other,
   wherein a joint film is interposed between the support substrate and the group III nitride film and joining the support substrate and the group III nitride film to each other,
   the joint film having a thickness variation of 2% or more and 40% or less, the thickness variation calculated in accordance with the following formula:
   thickness variation (%)={($t_{max}$−$t_{min}$)/($t_{max}$+$t_{min}$)}×100%, the maximum value of the thickness ($t_{max}$ and minimum value of the thickness ($t_{min}$) taken from at least thirteen measurement points at substantially equal intervals across an entire surface of the joint film,
   wherein the thickness variation is controlled by conditions of chemical mechanical polishing performed on the surface of the joint film.

3. The group III nitride composite substrate according to claim 2, wherein the chemical mechanical polishing forms a mirror-finished surface having a RMS roughness of 0.3 nm or less.

4. The group III nitride composite substrate according to claim 2, wherein the joint film has a thickness of 0.05 μm or more and 5 μm or less.

5. The group III nitride composite substrate according to claim 2, wherein the joint film is a SiO$_2$ film, Si$_3$N$_4$ film, AlN film, Al$_2$O$_3$ film, TiO$_2$ film, TiN film, Ga$_2$O$_3$ film, W film, Mo film, or Au-Sn film.

6. The group III nitride composite substrate according to claim 2, wherein a ratio $\alpha_{III-N}/\alpha_S$ of a thermal expansion coefficient $\alpha_{III-N}$ of the group III nitride film to a thermal expansion coefficient αS of the support substrate is 0.75 or more and 1.25 or less, and a ratio $t_{III-N}/t_s$ of a thickness $t_{III-N}$ of the group III nitride film to a thickness $t_s$ of the support substrate is 0.02 or more and 1 or less.

7. The group III nitride composite substrate according to claim 2, wherein the support substrate has a thermal conductivity $\gamma_s$ of 3 W·m$^{-1}$·K$^{-1}$ or more and 280 W·m$^{-1}$·K$^{-1}$ or less.

8. The group III nitride composite substrate according to claim 2, wherein the support substrate has a Young's modulus $E_s$ of 150 GPa or more and 500 GPa or less.

9. The group III nitride composite substrate according to claim 2, wherein the diameter of the group III nitride composite substrate is 125 mm or more and 300 mm or less.

10. A laminated group III nitride composite substrate comprising:

the group III nitride composite substrate as recited in claim 2; and at least one group III nitride layer disposed on a group III-nitride-film-side main surface of the group III nitride composite substrate.

11. A group III nitride semiconductor device comprising:
the group III nitride film included in the group III nitride composite substrate as recited in claim 2; and
at least one group III nitride layer disposed on the group III nitride film.

12. A method for manufacturing the group III nitride composite substrate as recited in claim 2, the method comprising:
forming a joined substrate with a diameter of 75 mm or more by bonding a support substrate and a group III nitride film donor substrate to each other; and
forming the group III nitride composite substrate by cutting the group III nitride film donor substrate in the joined substrate along a plane located inwardly at a predetermined distance from a bonded main surface of the group III nitride film donor substrate.

13. A method for manufacturing the group III nitride composite substrate as recited in claim 2, the method comprising:
forming a joined substrate with a diameter of 75 mm or more by bonding a support substrate and a group III nitride film donor substrate to each other; and
forming the group III nitride composite substrate by performing at least one of grinding, polishing, and etching on a main surface of the group III nitride film donor substrate in the joined substrate, the main surface being opposite to a bonded main surface of the group III nitride film donor substrate.

14. A method for manufacturing a group III nitride semiconductor device, the method comprising:
preparing the group III nitride composite substrate as recited in claim 2; and
growing at least one group III nitride layer on the group III nitride film of the group III nitride composite substrate.

15. The method for manufacturing a group III nitride semiconductor device according to claim 14, further comprising:
bonding a device support substrate onto the group III nitride layer; and
removing the support substrate from the group III nitride composite substrate.

\* \* \* \* \*